United States Patent
Sakurada et al.

(10) Patent No.: US 11,869,601 B2
(45) Date of Patent: *Jan. 9, 2024

(54) MEMORY SYSTEM AND MEMORY CONTROLLER

(71) Applicant: Kioxia Corporation, Tokyo (JP)

(72) Inventors: Kenji Sakurada, Yamato (JP); Naomi Takeda, Yokohama (JP); Masanobu Shirakawa, Chigasaki (JP); Marie Takada, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/053,271

(22) Filed: Nov. 7, 2022

(65) Prior Publication Data

US 2023/0088099 A1    Mar. 23, 2023

Related U.S. Application Data

(63) Continuation of application No. 17/117,937, filed on Dec. 10, 2020, now Pat. No. 11,545,223.

(30) Foreign Application Priority Data

Jun. 2, 2020    (JP) .................................. 2020-096428

(51) Int. Cl.
  *G11C 16/04*    (2006.01)
  *G11C 16/26*    (2006.01)
  (Continued)

(52) U.S. Cl.
  CPC ............ *G11C 16/26* (2013.01); *G06F 3/0604* (2013.01); *G06F 3/0655* (2013.01);
  (Continued)

(58) Field of Classification Search
  CPC ...... G11C 16/26; G11C 16/10; G11C 16/3459
  See application file for complete search history.

(56) References Cited

U.S. PATENT DOCUMENTS

| | | | |
|---|---|---|---|
| 7,852,675 | B2 | 12/2010 | Maejima |
| 8,068,364 | B2 | 11/2011 | Maejima |

(Continued)

FOREIGN PATENT DOCUMENTS

| | | |
|---|---|---|
| CN | 102411987 A | 4/2012 |
| CN | 108108311 A | 6/2018 |

(Continued)

*Primary Examiner* — Pho M Luu
(74) *Attorney, Agent, or Firm* — Oblon, McClelland, Maier & Neustadt, L.L.P.

(57) ABSTRACT

A memory system includes a first memory cell array which is a nonvolatile memory cell array, a controller configured to control read and write of data, a first data latch group used for input and output of the data between the controller and the first memory cell array, and at least one second data latch group in which stored data is maintained when the data is read from the first memory cell array by the controller. The controller is configured to store management information in the at least one second data latch group when or before executing a read process for the data from the first memory cell array, the management information being in a second memory cell array and used for read of the data.

15 Claims, 61 Drawing Sheets

(51) Int. Cl.
  *G11C 16/10* (2006.01)
  *G06F 3/06* (2006.01)
  *G11C 16/34* (2006.01)
  *H10B 69/00* (2023.01)

(52) U.S. Cl.
  CPC ........ *G06F 3/0679* (2013.01); *G11C 16/0483* (2013.01); *G11C 16/10* (2013.01); *G11C 16/3459* (2013.01); *H10B 69/00* (2023.02)

(56) References Cited

U.S. PATENT DOCUMENTS

| | | | |
|---|---|---|---|
| 8,233,323 B2 | 7/2012 | Hishida et al. | |
| 8,345,479 B2 | 1/2013 | Maejima | |
| 8,372,720 B2 | 2/2013 | Fukuzumi et al. | |
| 8,406,053 B1 | 3/2013 | Dutta et al. | |
| 8,514,627 B2 | 8/2013 | Itagaki et al. | |
| 8,576,624 B2 | 11/2013 | Dutta et al. | |
| 8,605,506 B2 | 12/2013 | Maejima | |
| 8,729,624 B2 | 5/2014 | Fukuzumi et al. | |
| 8,837,218 B2 | 9/2014 | Maejima | |
| 8,873,296 B2 | 10/2014 | Itagaki et al. | |
| 8,952,426 B2 | 2/2015 | Maejima | |
| 9,035,374 B2 | 5/2015 | Fukuzumi et al. | |
| 9,036,411 B2 | 5/2015 | Itagaki | |
| 9,330,761 B2 | 5/2016 | Maejima | |
| 9,356,042 B2 | 5/2016 | Fukuzumi et al. | |
| 9,437,307 B2 | 9/2016 | Itagaki et al. | |
| 9,437,610 B2 | 9/2016 | Maejima | |
| 9,490,019 B2 | 11/2016 | Itagaki | |
| 9,558,838 B2 | 1/2017 | Tanabe | |
| 9,640,267 B2 | 5/2017 | Tani | |
| 9,741,738 B2 | 8/2017 | Fukuzumi et al. | |
| 9,977,752 B2 | 5/2018 | Takeyama | |
| 9,985,050 B2 | 5/2018 | Fukuzumi et al. | |
| 10,163,931 B2 | 12/2018 | Fukuzumi et al. | |
| 10,255,972 B1 | 4/2019 | Sato | |
| 10,635,354 B2 | 4/2020 | Takada et al. | |
| 11,545,223 B2 * | 1/2023 | Sakurada | G06F 3/0655 |
| 2011/0284946 A1 | 11/2011 | Kiyotoshi | |
| 2012/0069657 A1 | 3/2012 | Choi et al. | |
| 2013/0128662 A1 | 5/2013 | Song et al. | |
| 2013/0132644 A1* | 5/2013 | Choi | G06F 12/0246 |
| | | | 711/E12.008 |
| 2014/0376310 A1* | 12/2014 | Kim | G11C 16/3427 |
| | | | 365/185.02 |
| 2018/0173632 A1 | 6/2018 | Sugimoto et al. | |
| 2019/0096908 A1 | 3/2019 | Fukuzumi et al. | |
| 2020/0119037 A1 | 4/2020 | Fukuzumi et al. | |
| 2020/0218473 A1 | 7/2020 | Takada et al. | |
| 2020/0285418 A1 | 9/2020 | Hara | |

FOREIGN PATENT DOCUMENTS

| | | |
|---|---|---|
| JP | 2014-167842 A | 9/2014 |
| JP | 2019-53806 A | 4/2019 |
| JP | 2019-164865 A | 9/2019 |

* cited by examiner

FIG. 11

| index | AR | ER |
|---|---|---|
| 1 | ΔA1 | ΔE1 |
| 2 | ΔA2 | ΔE2 |
| 3 | ΔA3 | ΔE3 |
| 4 | ΔA4 | ΔE4 |
| 5 | ΔA5 | ΔE5 |

TBL1

FIG. 12

| index | BR | DR | FR |
|---|---|---|---|
| 1 | ΔB1 | ΔD1 | ΔF1 |
| 2 | ΔB2 | ΔD2 | ΔF2 |
| 3 | ΔB3 | ΔD3 | ΔF3 |
| 4 | ΔB4 | ΔD4 | ΔF4 |
| 5 | ΔB5 | ΔD5 | ΔF5 |

TBL2

FIG. 13

| index | CR | GR |
|---|---|---|
| 1 | ΔC1 | ΔG1 |
| 2 | ΔC2 | ΔG2 |
| 3 | ΔC3 | ΔG3 |
| 4 | ΔC4 | ΔG4 |
| 5 | ΔC5 | ΔG5 |

TBL3

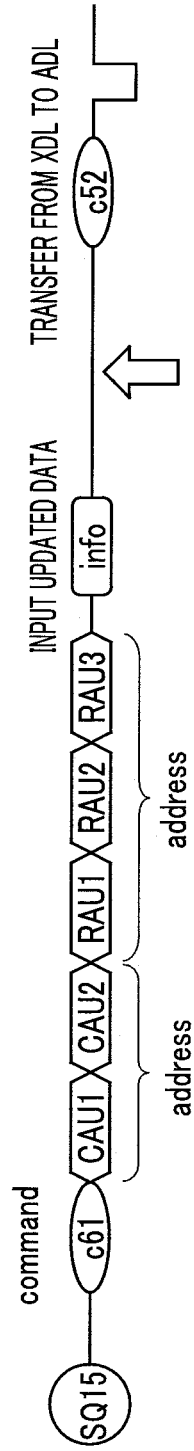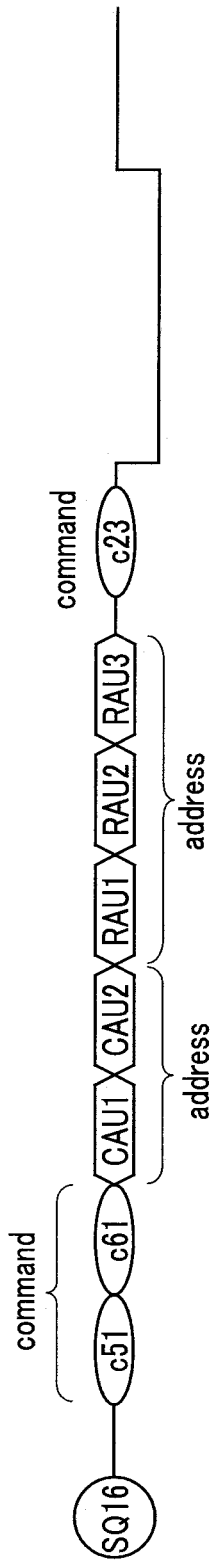

MEMORY SYSTEM AND MEMORY CONTROLLER

CROSS REFERENCE TO RELATED APPLICATION

This application is a continuation of and claims benefit under 35 U.S.C. § 120 to U.S. application Ser. No. 17/117,937, filed Dec. 10, 2020, now U.S. Pat. No. 11,545,223, which is based upon and claims the benefit of priority under 3.5 U.S.C. § 119 to Japanese Patent Application No. 2020-96428, filed on Jun. 2, 2020, the entire contents of which are incorporated herein by reference.

FIELD

Embodiments described herein relate generally to a memory system and a memory controller.

BACKGROUND

In a nonvolatile memory, management information used in data read and the like is stored in a storage area in a part of the nonvolatile memory, copied to a RAM area managed by a memory controller, and used. Since the management information is stored in the RAM area, the memory controller can read and use the management information at high speed.

When a data size of the management information increases, a RAM area having a large data size is necessary. However, it is sometimes difficult to provide a RAM area having a size sufficient for the memory controller.

BRIEF DESCRIPTION OF THE DRAWINGS

FIG. 11 is a diagram showing an example of a shift table for a lower page, which is one table of shift table information, according to the first embodiment;

FIG. 12 is a diagram showing an example of a shift table for a middle page in the shift table information according to the first embodiment;

FIG. 13 is a diagram showing an example of a shift table for an upper page in the shift table information according to the first embodiment;

FIG. 30 is a diagram showing a command sequence for an update process for data in a designated column address in the data latch group in SS42 in FIG. 28 according to the first embodiment;

FIG. 31 is diagram showing a command sequence for write of management information in the memory cell array in SS44 in FIG. 29 according to the first embodiment;

DETAILED DESCRIPTION

A memory system in an embodiment includes a first memory including a storage area, the first memory being a nonvolatile memory, a controller configured to control read and write of data in units of pages, a first data latch group used for input and output of the data between the controller and the first memory, and at least one second data latch group in which stored data is maintained when the data is read from the first memory by the controller. The controller is configured to store management information in the at least one second data latch group when or before executing a read process for the data from the first memory, the management information being in a second memory and used for read of the data.

Embodiments are explained below with reference to the drawings.

First Embodiment

A memory system according to a first embodiment is explained. In the following explanation, a memory system including a NAND flash memory as a semiconductor storage device is explained as an example.

1. Configuration

[Overall Configuration of the Memory System]

First, a rough overall configuration of the memory system according to the present embodiment is explained with reference to FIG. 1.

Figure 1:
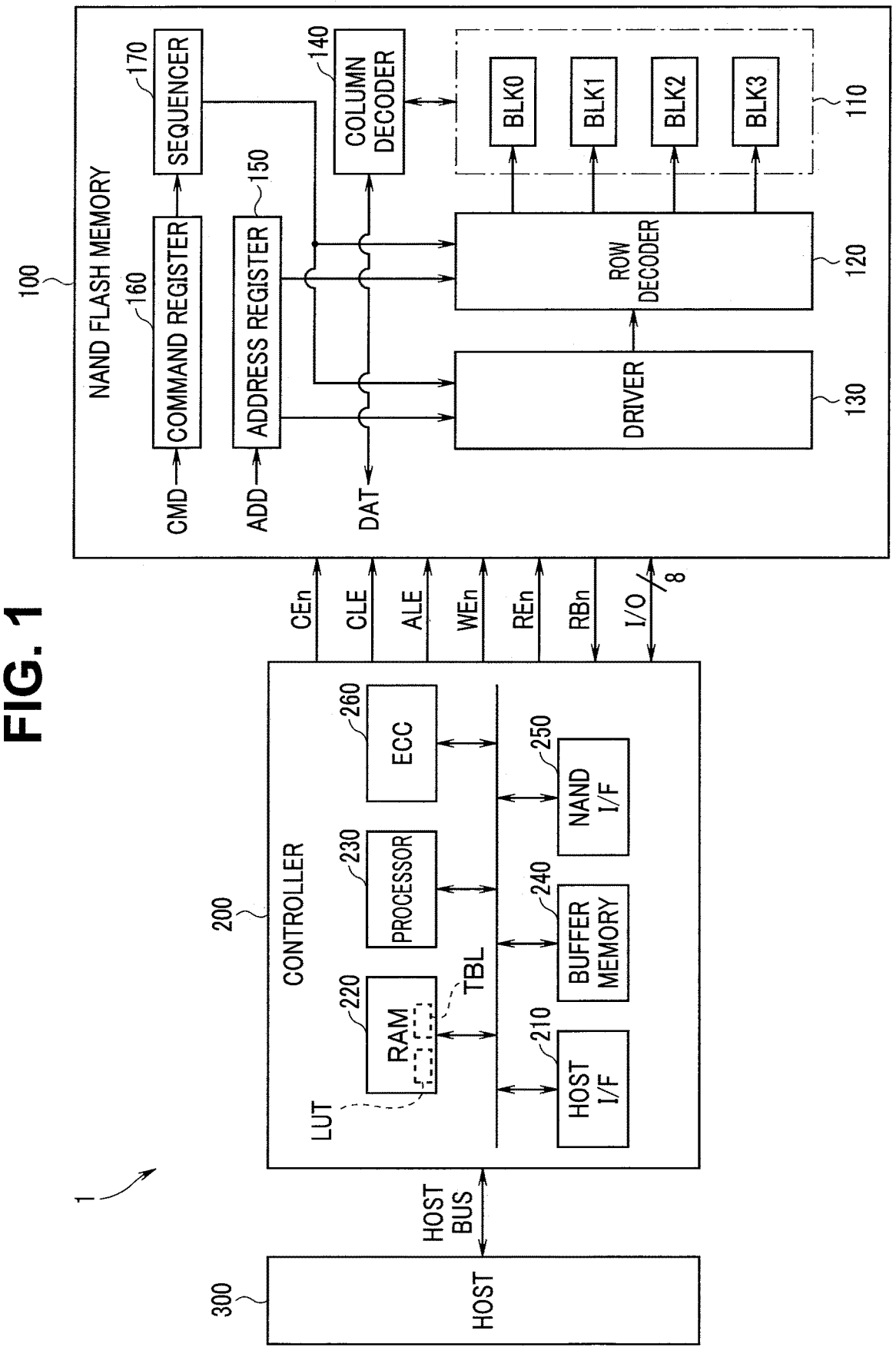
FIG. 1 is a block diagram for explaining a configuration of a memory system according to a first embodiment.

FIG. 1 is a block diagram for explaining a configuration of the memory system according to the present embodiment. As shown in FIG. 1, a memory system 1 includes a NAND flash memory 100 and a memory controller (hereinafter simply referred to as controller as well) 200. The NAND flash memory 100 and the controller 200 are, for example, semiconductor devices formed on one substrate. The semiconductor devices are used in, for example, a memory card such as an SD card and an SSD (solid state drive).

The NAND flash memory 100, which is a nonvolatile memory, includes a plurality of memory cells and stores data in a nonvolatile manner. The controller 200 is connected to the NAND flash memory 100 by a NAND bus and connected to a host apparatus 300 by a host bus. The controller 200 is a memory controller that controls the NAND flash memory 100 and accesses the NAND flash memory 100 in response to a request received from the host apparatus 300. The host apparatus 300 is, for example, a digital camera or a personal computer. The host bus is, for example, a bus confirming to an SD interface. The NAND bus is a bus that performs transmission and reception of signals conforming to a NAND interface.

Various signals are transmitted and received between the NAND flash memory 100 and the controller 200 via a NAND interface (I/F) circuit 250. A chip enable signal CEn, a command latch enable signal CLE, an address latch enable signal ALE, a write enable signal WEn, and a read enable signal REn are supplied from the controller 200 to the NAND flash memory 100. A ready/busy signal RBn is supplied from the NAND flash memory 100 to the controller 200. Input/output signals I/O are transmitted and received between the controller 200 and the NAND flash memory 100.

The chip enable signal CEn is a signal for enabling the NAND flash memory 100 and is asserted in a low level. The command latch enable signal CLE and the address latch enable signal ALE are signals for notifying the NAND flash memory 100 that the input/output signals I/O are respectively a command and an address. A write enable signal WEn is asserted in the low level and is a signal for notifying the NAND flash memory 100 that the input/output signals I/O are written in the NAND flash memory 100. The read enable signal REn is also asserted in the low level and is a signal for outputting read data from the NAND flash memory 100 to the input/output signals I/O. The ready/busy signal RBn is a signal indicating whether the NAND flash memory 100 is in a ready state (a state in which an instruction from the controller 200 can be received) or a busy state (a state in which an instruction from the controller 200 cannot be received). The low level indicates the busy state. The input/output signals I/O are, for example, 8-bit signals. The input/output signals I/O are entities of data transmitted and received between the NAND flash memory 100 and the controller 200 and are a command, an address, write data, read data, and the like.

[Configuration of the Controller]

Details of a configuration of the controller 200 are explained. As shown in FIG. 1, the controller 200 is a circuit including a host interface (I/F) circuit 210, a random access memory (hereinafter referred to as RAM) 220, which is a built-in memory, a processor 230 including a central processing unit (CPU), a buffer memory 240, a NAND interface circuit 250, and an ECC (error checking and correcting) circuit 260.

The host interface circuit 210 is connected to the host apparatus 300 via a host bus and transfers a request and data received from the host apparatus 300 respectively to the processor 230 and the buffer memory 240. The host interface circuit 210 transfers data in the buffer memory 240 to the host apparatus 300 in response to a command of the processor 230.

The RAM 220 is a semiconductor memory such as a DRAM or an SRAM and is used as a work area of the processor 230. The RAM 220 stores firmware for managing the NAND flash memory 100 and management information MI. The management information MI is a lookup table (LUT), shift table information (TBL), and the like explained below. The shift table information TBL includes shift information. The shift information is information for shifting a read level of data when the controller 200 executes a read process for the data.

The processor 230 controls operation of the entire controller 200. For example, when receiving a data request from the host apparatus 300, the processor 230 issues a read command to the NAND interface circuit 250 in response to the data request. When receiving a data write request and a data erase request from the host apparatus 300, the processor 230 issues commands corresponding to the received requests to the NAND interface circuit 250 in the same manner. The processor 230 executes various kinds of processes for managing the NAND flash memory 100 such as wear leveling.

The buffer memory 240 temporarily stores write data and read data.

The NAND interface circuit 250 is connected to the NAND flash memory 100 via a NAND bus and controls communication with the NAND flash memory 100. Based on commands received from the processor 230, the NAND interface circuit 250 transmits various signals including commands and data to the NAND flash memory 100 and receives various signals and data from the NAND flash memory 100.

The NAND interface circuit 250 outputs, based on commands received from the processor 230, the chip enable signal CEn, the command latch enable signal CLE, the address latch enable signal ALE, the write enable signal WEn, and the read enable signal REn to the NAND flash memory 100. During data write, the NAND interface circuit 250 transfers a write command issued by the processor 230 and write data in the buffer memory 240 to the NAND flash memory 100 as the input/output signals I/O. Further, during data read, the NAND interface circuit 250 transfers a read command issued by the processor 230 to the NAND flash memory 100 as the input/output signals I/O, receives, as the input/output signals I/O, data read from the NAND flash memory 100, and transfers the data to the buffer memory 240.

The ECC circuit 260 performs error detection and an error correction process concerning data to be stored in the NAND flash memory 100. In other words, the ECC circuit 260 generates an error correction code during the data write, gives the error correction code to the write data, and performs error correction and, at the same time, decodes data during the data read.

[Configuration of the NAND Flash Memory]

A configuration of the NAND flash memory 100 is explained. As shown in FIG. 1, the NAND flash memory 100 includes a memory cell array 110, a row decoder 120, a driver circuit 130, a column decoder 140, an address register 150, a command register 160, and a sequencer 170.

The memory cell array 110 includes a plurality of blocks BLK. Each of the blocks BLK includes a plurality of nonvolatile memory cells. Each of the memory cells is associated with rows and columns. In FIG. 1, as an example, four blocks BLK0 to BLK3 are shown. The memory cell array 110 stores, in a nonvolatile manner, data given from the controller 200.

The row decoder 120 selects any one of the blocks BLK0 to BLK3 based on a block address BA in the address register 150 and further select a word line WL in the selected block BLK.

The driver circuit 130 supplies, based on a page address PA in the address register 150, a voltage to the selected block BLK via the row decoder 120.

The column decoder 140 includes a plurality of data latch circuits and a plurality of sense amplifiers. During the data read, each of the sense amplifiers senses data read from the memory cell array 110 and perform necessary arithmetic operations. The column decoder 140 outputs this data DAT to the controller 200 via a data latch circuit XDL explained below. During the data write, the column decoder 140 receives, in the data latch circuit XDL, the write data DAT received from the controller 200 and thereafter executes a write operation in the memory cell array 110.

The address register 150 stores an address ADD received from the controller 200. The address ADD includes the block address BA and the page address PA described above. The command register 160 stores a command CMD received from the controller 200.

The sequencer 170 controls operation of the entire NAND flash memory 100 based on the command CMD stored in the command register 160.

Figure 2:
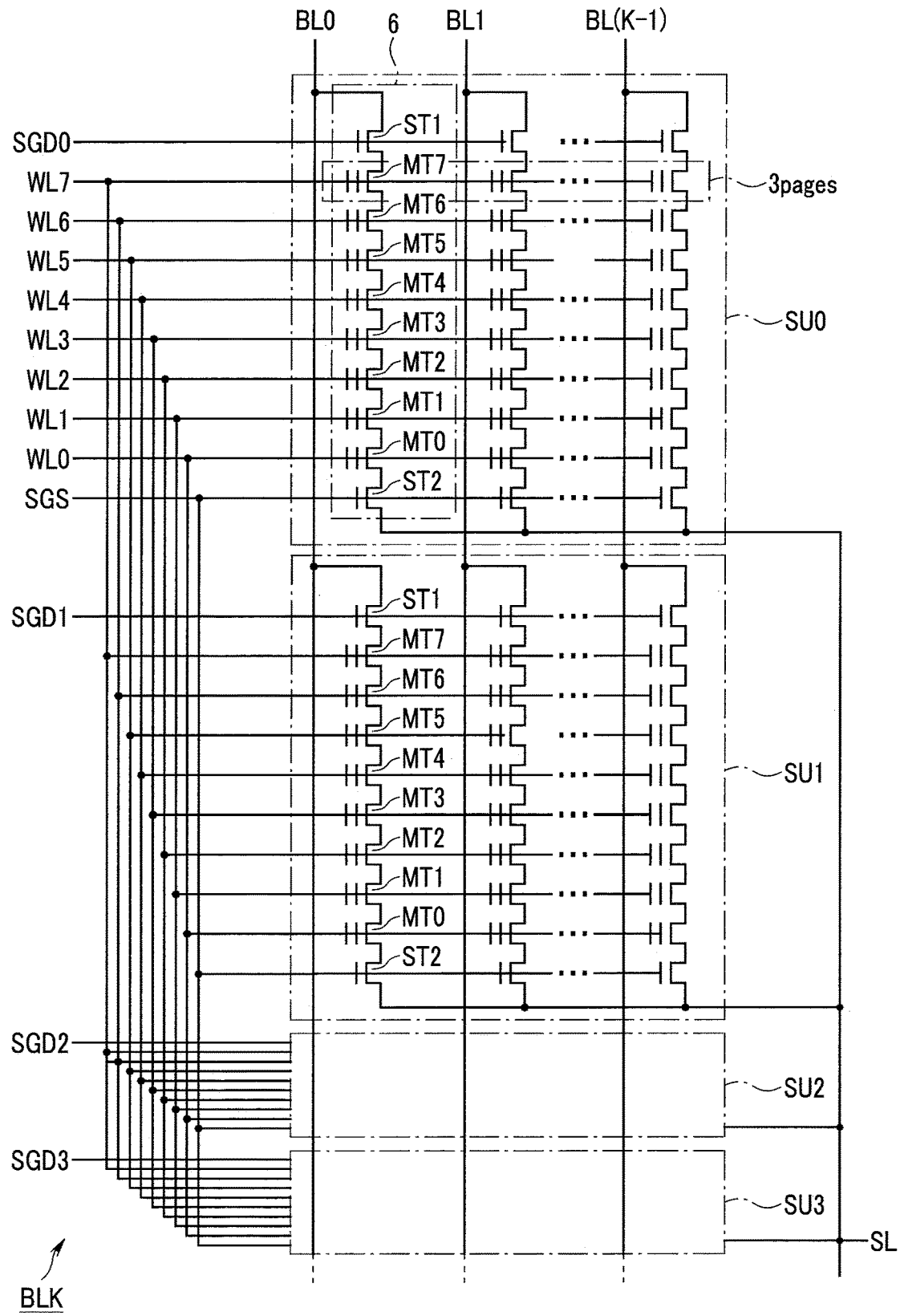
FIG. 2 is a circuit diagram for explaining a configuration of a memory cell array according to the first embodiment.

A configuration of the block BLK is explained with reference to FIG. 2. FIG. 2 is a circuit diagram for explaining a configuration of a memory cell array according to the present embodiment. As shown in FIG. 2, one block BLK includes, for example, four string units SU (SU0 to SU3). Each of the string units SU includes a plurality of NAND strings 6.

Each of the NAND strings 6 includes, for example, eight memory cell transistors MT (MT0 to MT7) and two selection transistors ST1 and ST2. Each of the memory cell transistors MT includes a control gate and charges a storage layer and stores data in a nonvolatile manner. A plurality of (for example, eight) memory cell transistors MT are connected in series between a source of the selection transistor ST1 and a drain of the selection transistor ST2.

Gates of the selection transistors ST1 in the respective string units SU0 to SU3 are respectively connected to select gate lines SGD0 to SGD3. In contrast, gates of the selection transistors ST2 in the respective string units SU0 to SU3 are connected to, for example, a select gate line SGS in common. Naturally, the gates of the selection transistors ST2 in the respective string units SU0 to SU3 may be connected to different select gate lines SGS0 to SGS3 for each of the string units. Control gates of the memory cell transistors MT0 to MT7 present in the same block BLK are respectively connected to word lines WL0 to WL7 in common.

Drains of the selection transistors ST1 of the plurality of NAND strings 6 present in the same row in the memory cell array 110 are connected to bit lines BL (BL0 to BL(K−1); K is a natural number equal to or larger than 2) in common. In other words, the bit lines BL connect the plurality of NAND strings 6 in common among the plurality of blocks BLK. Further, sources of the plurality of selection transistors ST2 are connected to a source line SL in common.

In other words, the respective string units SU include pluralities of NAND strings 6 connected to a plurality of bit lines BL different from one another and connected to the same select gate lines SGD. The respective blocks BLK include pluralities of string units SU having the respective word lines WL in common. The memory cell array 110 is an aggregate of a plurality of blocks BLK to which the respective bit lines BL are connected in common.

Figure 3:
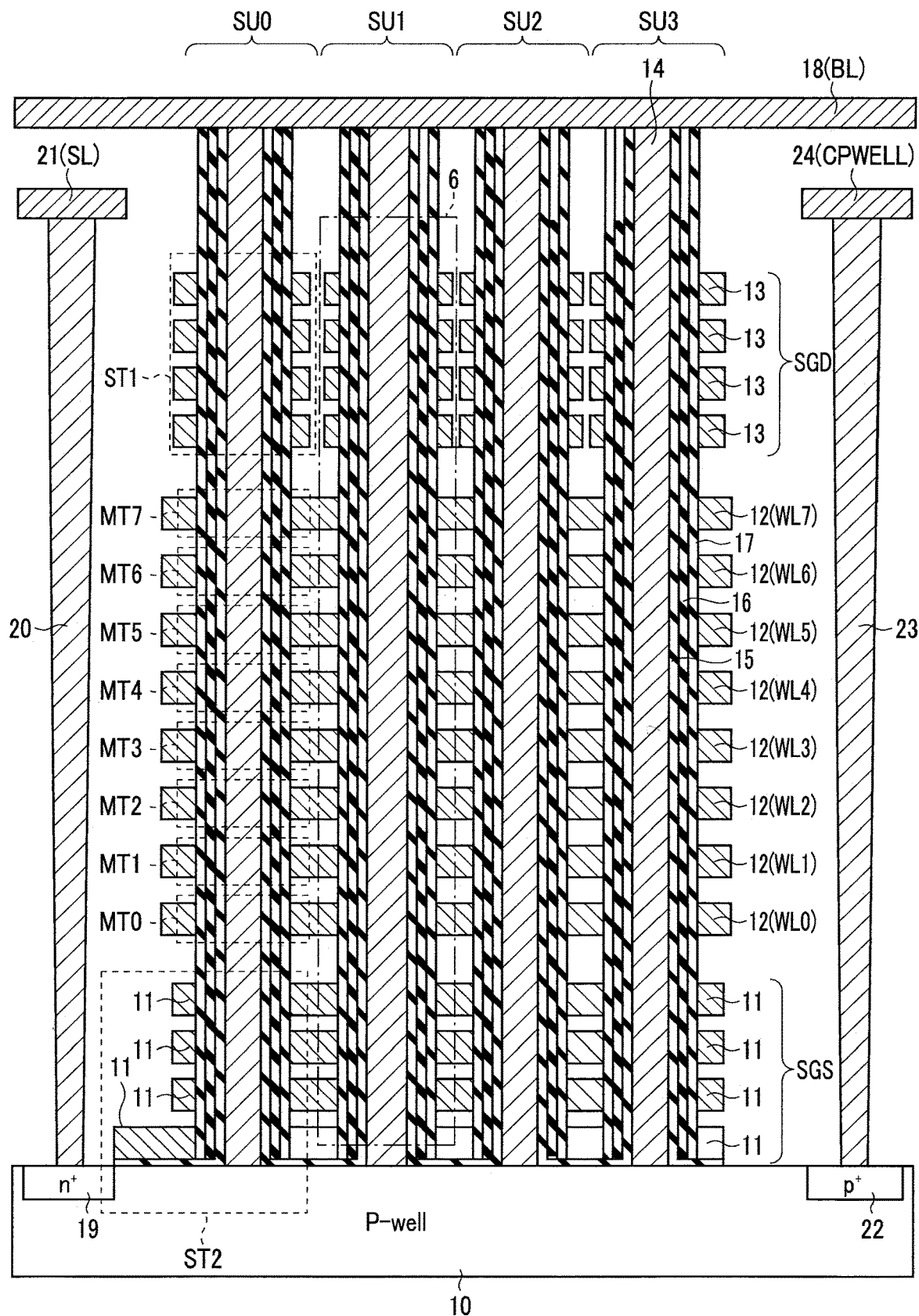
FIG. 3 is a sectional view of a partial area of one block according to the first embodiment.

FIG. 3 is a sectional view of a partial area of one block BLK. As shown in FIG. 3, the plurality of NAND strings 6 are formed on a p-type well area 10. In other words, for example, four wiring layers 11 functioning as the select gate lines SGS, eight wiring layers 12 functioning as the word lines WL0 to WL7, and, for example, four wiring layers 13 functioning as the select gate lines SGD are stacked in order on the p-type well area 10. Not-shown insulating films are formed among the stacked wiring layers.

A plurality of pillar-like conductors 14 piercing through the wiring layers 13, 12, and 11 to reach the p-type well area 10 are formed. A gate insulating film 15, a charge storage layer (an insulating film or a conductive film) 16, and a block insulating film 17 are formed in order on side surfaces of the respective conductors 14. The plurality of memory cell transistors MT and the selection transistors ST1 and ST2 are formed by the gate insulating film 15, the charge storage layer 16, and the block insulating film 17. The respective conductors 14 function as current paths of the NAND string 6 and become areas where channels of the respective transistors are formed. Upper ends of the respective conductors 14 are connected to a metal wiring layer 18 functioning as the bit line BL.

An $n^+$-type impurity diffusion layer 19 is formed in a surface area of the p-type well area 10. A contact plug 20 is formed on the $n^+$-type impurity diffusion layer 19. The contact plug 20 is connected to a metal wiring layer 21 functioning as the source line SL. Further, a $p^+$-type impurity diffusion layer 22 is formed in the surface area of the p-type well area 10. A contact plug 23 is formed on the $p^+$-type impurity diffusion layer 22. The contact plug 23 is connected to a metal wiring layer 24 functioning as a well wire CPWELL. The well wire CPWELL is a wire for applying a voltage to the conductor 14 via the p-type well area 10.

The configuration explained above is arrayed in plurality in a depth direction of a paper surface on which FIG. 3 is written. A string unit SU is formed by a set including the plurality of NAND strings 6 arranged in the depth direction.

In this example, one memory cell transistor MT is capable of storing, for example, 3-bit data. In other words, the NAND flash memory 100 is a semiconductor storage device of a so-called TLC (triple level cell) type. The 3-bit data are respectively referred to as lower bit, middle bit, and upper bit in order from the lower bit. A set including lower bits stored by the plurality of memory cell transistors MT connected to the same word line WL in one string unit is referred to as lower page, a set including middle bits is referred to as middle page, and a set including upper bits is referred to as upper page. The plurality of memory cell transistors MT connected to one word line in one string configure one page unit that stores the lower, middle, and upper bits. In other words, three pages are allocated to each page unit. Accordingly, in the case of the block BLK including four string units SU, each of which includes eight word lines WL, each of the blocks BLK has capacity for 96 pages. Alternatively, in other words, "page" can also be defined as a part of a memory space formed by the plurality of memory cell transistors MT connected to the same word line WL in one string unit. Data write is performed in units of page units. Data read is performed for each page (this reading method is referred to as page-by-page reading).

Erasing of data can be performed in units of blocks BLK or in units smaller than blocks BLK. An erasing method is described in, for example, U.S. patent application Ser. No. 13/235,389 filed on Sep. 18, 2011 entitled "NONVOLATILE SEMICONDUCTOR MEMORY DEVICE". An erasing method is described in, for example, U.S. patent application Ser. No. 12/694,690 filed on Jan. 27, 2010 entitled "NON-VOLATILE SEMICONDUCTOR STORAGE DEVICE". Further, an erasing method is described in, for example, U.S. patent application Ser. No. 13/483,610 filed on May 30, 2012 entitled "NONVOLATILE SEMICONDUCTOR MEMORY DEVICE AND DATA ERASE METHOD THEREOF". The entireties of these patent applications are incorporated in this specification by reference.

Further, the configuration of the memory cell array 110 may be other configurations. In other words, the configuration of the memory cell array 110 is described in, for example, U.S. patent application Ser. No. 12/407,403 filed on Mar. 19, 2009 entitled "THREE DIMENSIONAL STACKED NONVOLATILE SEMICONDUCTOR MEMORY". The configuration of the memory cell array 110 is described in, for example, U.S. patent application Ser. No. 12/406,524 filed on Mar. 18, 2009 entitled "THREE DIMENSIONAL STACKED NONVOLATILE SEMICONDUCTOR MEMORY", U.S. patent application Ser. No. 12/679,991 filed on Mar. 25, 2010 entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 entitled "SEMICONDUCTOR MEMORY AND METHOD FOR MANUFACTURING THE SAME". The entireties of these patent applications are incorporated in this specification by reference.

As explained below, the management information MI explained below is stored in a storage area (a management information storage area MIA explained below) in a part of the memory cell array 110.

[Configuration of the Column Decoder]

Figure 4:
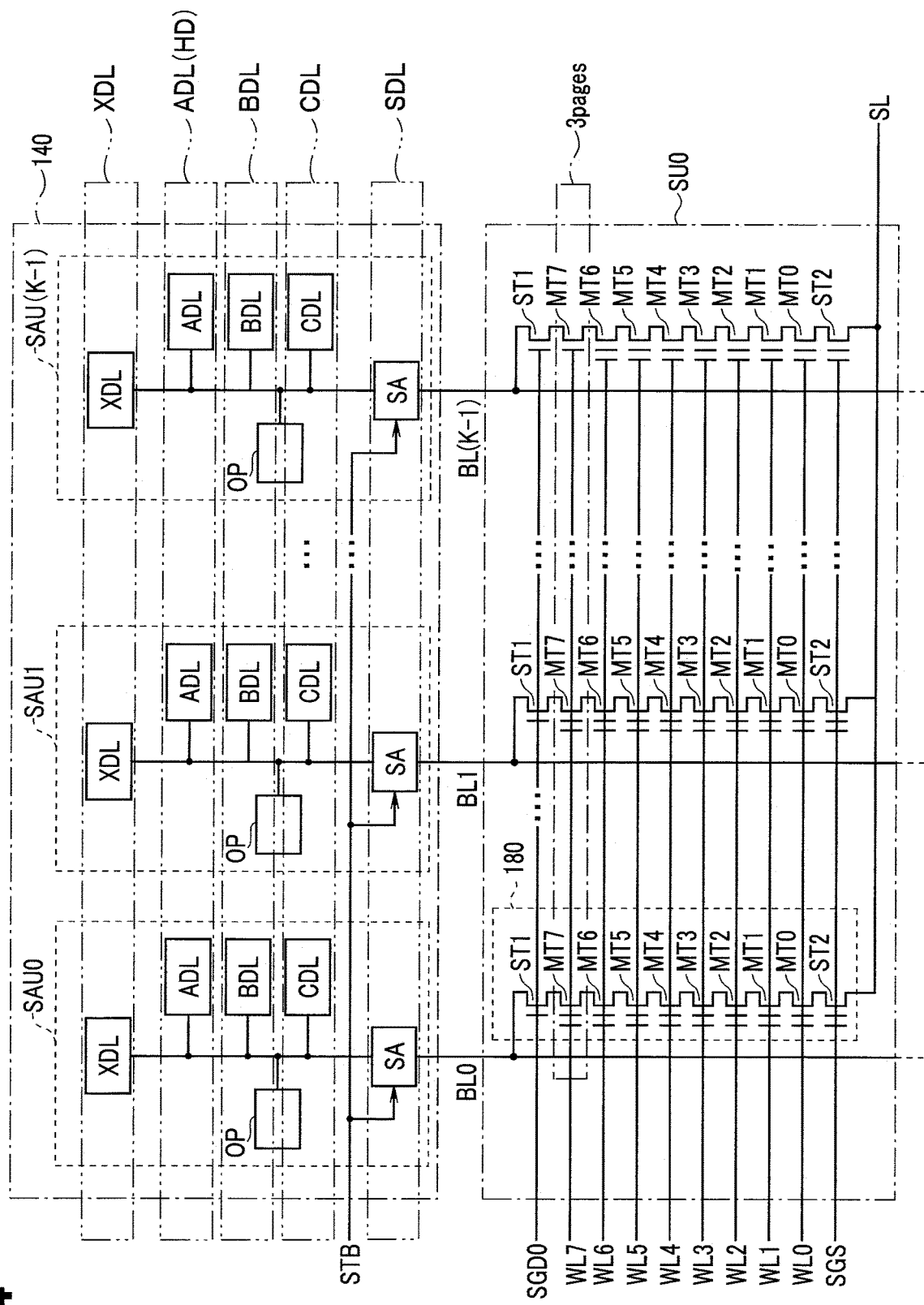
FIG. 4 is a circuit diagram of a column decoder and a string unit according to the first embodiment.

A configuration of the column decoder 140 is explained with reference to FIG. 4. FIG. 4 is a circuit diagram of the column decoder 140 and the string unit SU0 according to the first embodiment.

As shown in FIG. 4, the column decoder 140 includes a plurality of sense units SAU (SAU0 to SAU(K−1)), each of which is provided for each of the bit lines BL.

Each of the plurality of sense units SAU includes a sense amplifier SA, an operation unit OP, and four data latch circuits (hereinafter simply referred to as data latches as well) ADL, BDL, CDL, and XDL. Each of the sense amplifiers SA further includes a data latch SDL.

The respective sense amplifiers SA sense data read to the bit lines BL corresponding thereto and apply voltages to the bit lines BL according to write data. In other words, the sense amplifier SA is a module that directly controls the bit line BL. A strobe signal STB is given to the sense amplifier SA by, for example, the sequencer 170 during reading. The sense amplifier SA includes, on an inside thereof, a node SEN and the data latch SDL (not shown in FIG. 4). A voltage of the node SEN fluctuates according to whether the memory cell transistor MT connected to the selection word line WL is in an ON state or an OFF state. A decision is made according to the voltage of the node SEN at timing when the strobe signal STB is asserted, whether the memory cell transistor MT is turned on or off. A result of the decision is stored in a data latch (the data latch SDL) on the inside as "0" or "1" data. The data stored in the data latch SDL on the inside is further copied to any one of the data latches ADL, BDL, CDL, and XDL.

The data latches ADL, BDL, and CDL temporarily store write data. In other words, the data latches ADL, BDL, and CDL are used for data write in the NAND flash memory 100 by the controller 200. The operation unit OP performs, about the data stored in the sense amplifier SA and the data latches ADL, BDL, CDL, and XDL, various logical operations such as a NOT operation, an OR operation, an AND operation, an XOR operation, and an XNOR operation. For example, the operation unit OP generates page data by performing an operation about the data copied from the plurality of data latches SDL on the inside of the sense amplifier SA.

The sense amplifier SA, the data latches ADL, BDL, and CDL, and the operation unit OP are connected by a bus to be capable of transmitting and receiving data to and from one another. The bus is further connected to the data latch XDL.

Data input and output in the column decoder 140 is performed via a plurality of data latches XDL. In other words, data received from the controller 200 is transferred to pluralities of data latches ADL, BDL, and CDL or a plurality of sense amplifiers SA via the plurality of data latches XDL. Data in the pluralities of data latches ADL, BDL, and CDL or the plurality of sense amplifiers SA are transmitted to the controller 200 via the plurality of data latches XDL. The plurality of data latches XDL function as cash memories of the NAND flash memory 100. Therefore, even if the pluralities of data latches ADL, BDL, and CDL are in use, if the plurality of data latches XDL are free, the NAND flash memory 100 can change to the ready state.

Data read and write are respectively performed in units of pages and units of page units. The column decoder 140 includes the pluralities of data latches ADL, BDL, CDL, XDL, and SDL, each of which stores data for one page.

In the following explanation, as shown in FIG. 4, the plurality of data latches XDL that store data for one page are referred to as data latch group XDL, the plurality of data latches ADL that store data for one page are referred to as data latch group ADL, the plurality of data latches BDL that store data for one page are referred to as data latch group BDL, the plurality of data latches CDL that store data for one page are referred to as data latch group CDL, and the plurality of data latches SDL that store data for one page are referred to as data latch group SDL. In other words, the column decoder 140 includes the data latch group XDL, the data latch group ADL, the data latch group BDL, the data latch group CDL, and the data latch group SDL, each of which stores data for one page.

Accordingly, the data latch group XDL configures a plurality of data latch circuits used for data input and output between the controller 200 and the NAND flash memory 100. The respective data latch groups ADL, BDL, and CDL are used when data is written in the NAND flash memory 100 by the controller 200 and are not used when data is read. In the respective data latch groups ADL, BDL, and CDL, the stored data are maintained when the controller 200 reads data from the NAND flash memory 100.

[Stored Data in the Memory Cell Transistor and Threshold Voltages]

Figure 5:
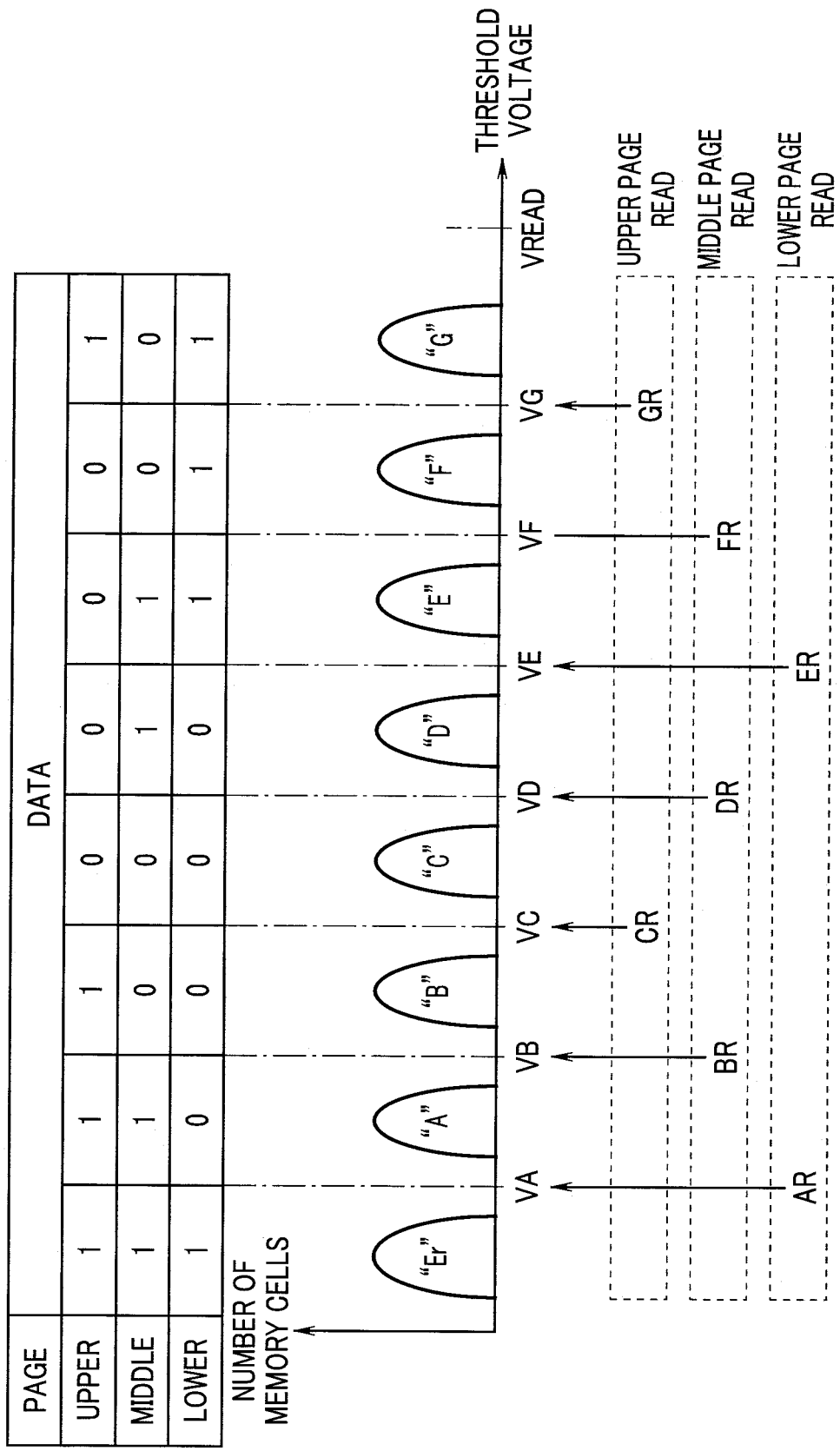
FIG. 5 is a diagram showing data that respective memory cell transistors can take, a threshold voltage distribution, and voltages used during read according to the first embodiment.

Stored data in the memory cell transistor MT, threshold voltages, and read levels (that is, read voltages) of respective data are explained with reference to FIG. 5. FIG. 5 is a diagram showing data that the respective memory cell transistors MT can take, a threshold voltage distribution, and voltages used during reading.

As explained above, the memory cell transistor MT can take eight states according to threshold voltages. The eight states are referred to as "Er" state, "A" state, "B" state, "C" state, ..., and "G" state in order from a state having the lowest threshold voltage.

A threshold voltage of the memory cell transistor MT in the "Er" state is lower than a voltage VA and is equivalent to an erased state of data. A threshold voltage of the memory cell transistor MT in the "A" state is equal to or higher than the voltage VA and lower than a voltage VB (>VA). A threshold voltage of the memory cell transistor MT in the "B" state is equal to or higher than the voltage VB and lower than a voltage VC (>VB). A threshold voltage of the memory cell transistor MT in the "C" state is equal to or higher than the voltage VC and lower than a voltage VD (>VC). A threshold voltage of the memory cell transistor MT in the "D" state is equal to or higher than the voltage VD and lower than a voltage VE (>VD). A threshold voltage of the memory cell transistor MT in the "E" state is equal to or higher than the voltage VE and lower than a voltage VF (>VE). A threshold voltage of the memory cell transistor MT in the "F" state is equal to or higher than the voltage VF and lower than a voltage VG (>VF). A threshold voltage of the memory cell transistor MT in the "G" state is equal to or higher than the voltage VG and lower than a voltage VREAD. Among the eight states distributed in this way, the "G" state is a state in which the threshold voltage is the highest. Note that the voltage VREAD is a voltage applied to an unselected word line WL during a read operation and is a voltage for turning on the memory cell transistor MT irrespective of stored data. The voltages VA to VG are collectively referred to as voltage VCGRV as well.

The threshold voltage distribution is realized by writing 3-bit (3-page) data including the lower bit, the middle bit, and the upper bit. In other words, a relation between the "Er" state to the "G" state and the lower bit, the middle bit, and the upper bit is as follows.

"Er" state: "111" (written in the order of "upper/middle/lower")
"A" state: "110"
"B" state: "100"
"C" state: "000"
"D" state: "010"
"E" state: "011"
"F" state: "001"
"G" state: "101"

In this way, only one bit among the three bits changes between data corresponding to two states adjacent to each other in the threshold voltage distribution.

Therefore, when the lower bit is read, a voltage equivalent to a boundary where a value ("0" or "1") of the lower bit changes only has to be used. A voltage equivalent to such a boundary is also used in the middle bit and the upper bit.

In other words, as shown in FIG. 5, in the lower page read, the voltage VA for distinguishing the "Er" state and the "A" state and the voltage VE for distinguishing the "D" state and the "E" state are used as read levels. Read operations using the voltages VA and VE are respectively referred to as read operations AR and ER.

The read operation AR determines whether the threshold voltage of the memory cell transistor MT is lower than the voltage VA. In other words, the memory cell transistor MT in the erased state is specified by the read operation AR. The read operation ER determines whether the threshold voltage of the memory cell transistor MT is lower than the voltage VE.

In the middle page read, the voltage VB for distinguishing the "A" state and the "B" state, the voltage VD for distinguishing the "C" state and the "D" state, and the voltage VF between the "E" state and the "F" state are used as read levels. Read operations using the voltages VB, VD, and VF are respectively referred to as read operations BR, DR, and FR.

The read operation BR determines whether the threshold voltage of the memory cell transistor MT is lower than the voltage VB. The read operation DR determines whether the threshold voltage of the memory cell transistor MT is lower than the voltage VD. The read operation FR determines whether the threshold voltage of the memory cell transistor MT is lower than the voltage VF.

In the upper page read, the voltage VC for distinguishing the "B" state and the "C" state and the voltage VG for distinguishing the "F" state and the "G" state are used as read levels. The read operations using the voltages VC and VG are respectively referred to as read operations CR and GR.

The read operation CR determines whether the threshold voltage of the memory cell transistor MT is lower than the voltage VC. The read operation GR determines whether the threshold voltage of the memory cell transistor MT is lower than the voltage VG. In other words, the memory cell transistor MT in the "G" state is specified by the read operation GR.

[Management Information]

In the memory system 1, the management information MI is used. The management information MI is shift table information TBL, history data HD, a lookup table LUT, and the like explained below. The management information MI is stored in the NAND flash memory 100. The management information MI is copied from the NAND flash memory 100 to the RAM 220 of the controller 200 and used during power-on. As explained below, a part (in the present embodiment, shift information) of the management information MI is stored in at least one data latch group in the NAND flash memory 100.

The management information MI is written in a predetermined storage area (hereinafter referred to as management information storage area) MIA of the memory cell array 110 in a write mode (hereinafter referred to as SLC mode) for writing one-bit data per one memory cell transistor MT. As explained above, in the present embodiment, user data written from a host is 3-bit data per one memory cell transistor MT. The management information MI is 1-bit data per one memory cell transistor MT and is written in the management information storage area MIA of the memory cell array 110 in the SLC mode.

As explained above, the NAND flash memory 100 includes the memory cell array 110, which is a nonvolatile memory. The memory cell array 110 includes a plurality of physical blocks. Each of the plurality of physical blocks includes a storage area accessible in units of pages.

The controller 200 performs data read control in units of pages on the plurality of physical blocks of the memory cell array 110 and performs data write control in units of page units on the plurality of physical blocks of the memory cell array 110.

2. Operations

A write operation and a read operation of the memory system are explained.

As explained above, the controller 200 outputs, in response to a request from the host apparatus 300, various signals and data to the NAND flash memory 100 according to a predetermined sequence to thereby perform data read from the NAND flash memory 100 and data write in the NAND flash memory 100.

[Operation During Data Write]

Figure 6:
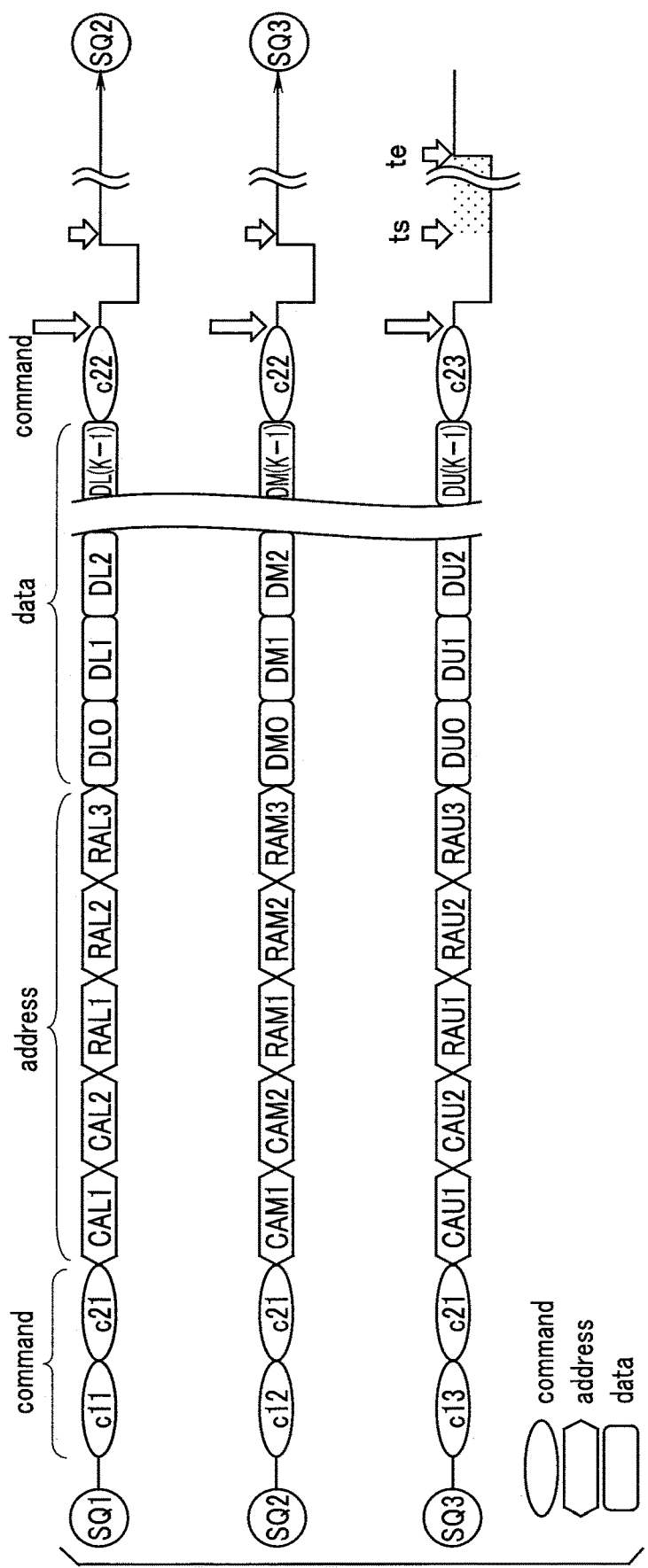
FIG. 6 is a diagram showing command sequences during data write according to the first embodiment.
Figure 7:
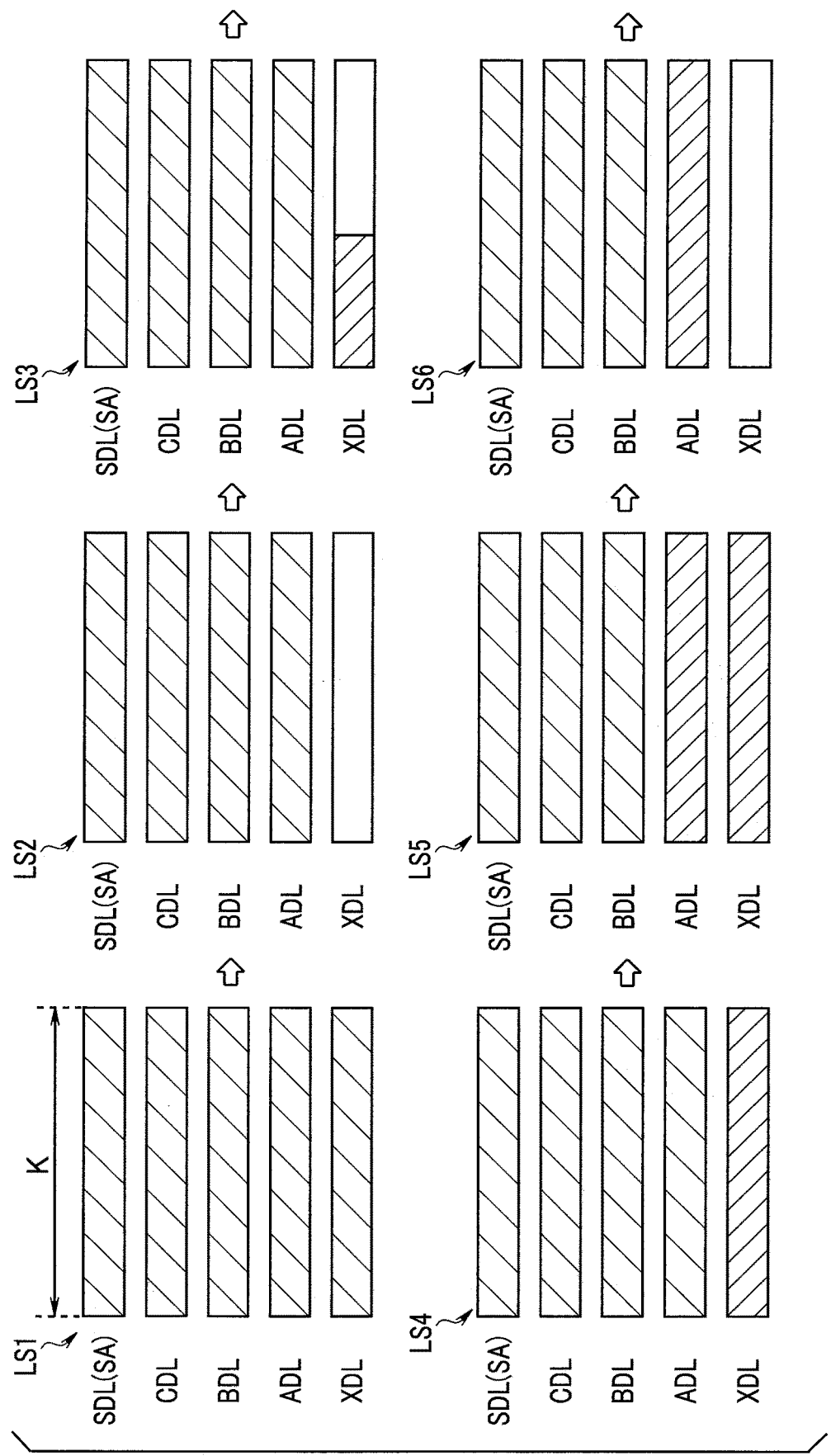
FIG. 7 is a diagram for explaining changes in stored states of data in five data latches involved in execution of the command sequences during the data write according to the first embodiment.
Figure 8:
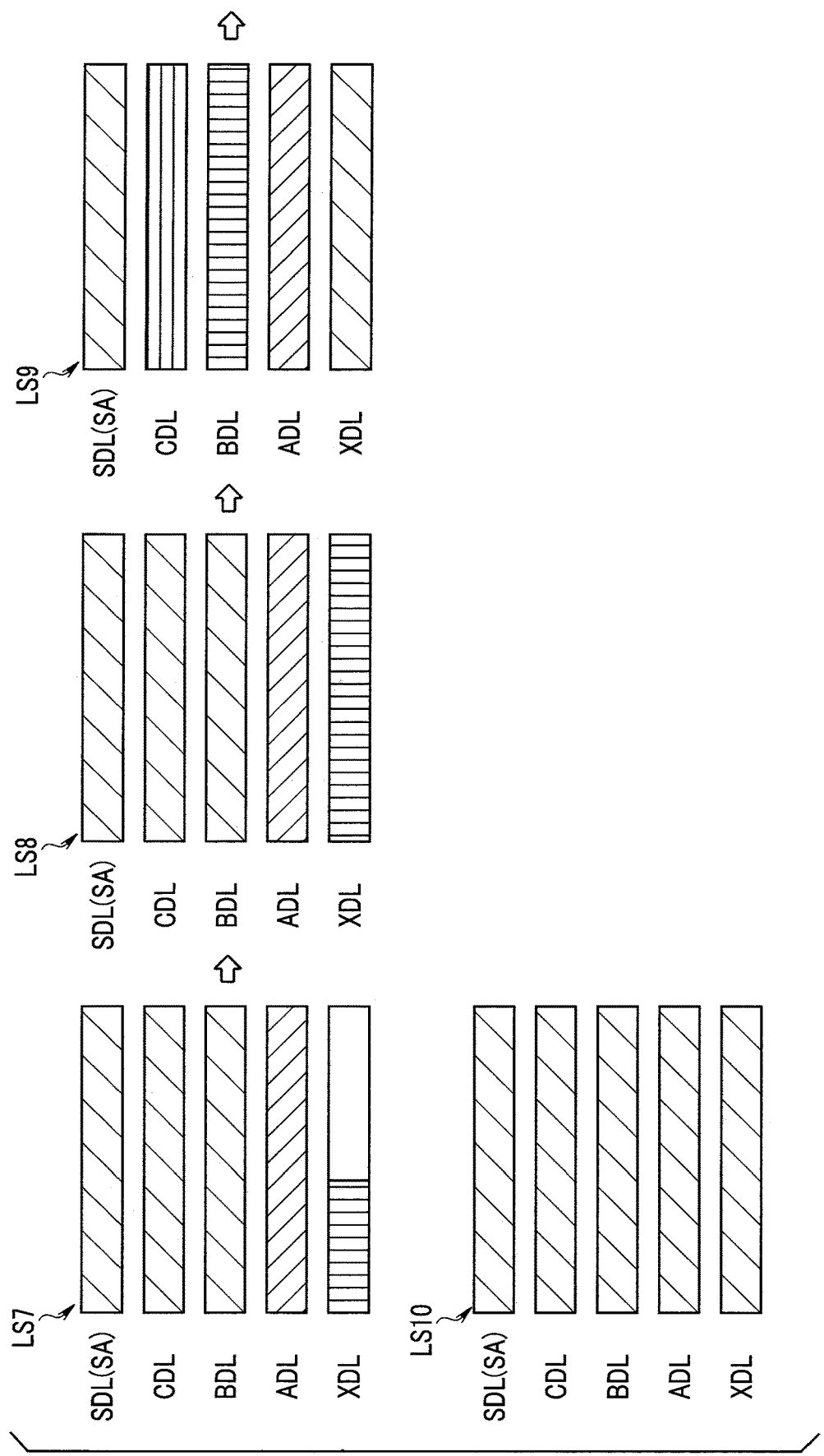
FIG. 8 is a diagram for explaining changes in stored states of data in the five data latches involved in the execution of the command sequences during the data write according to the first embodiment.
Figure 10:
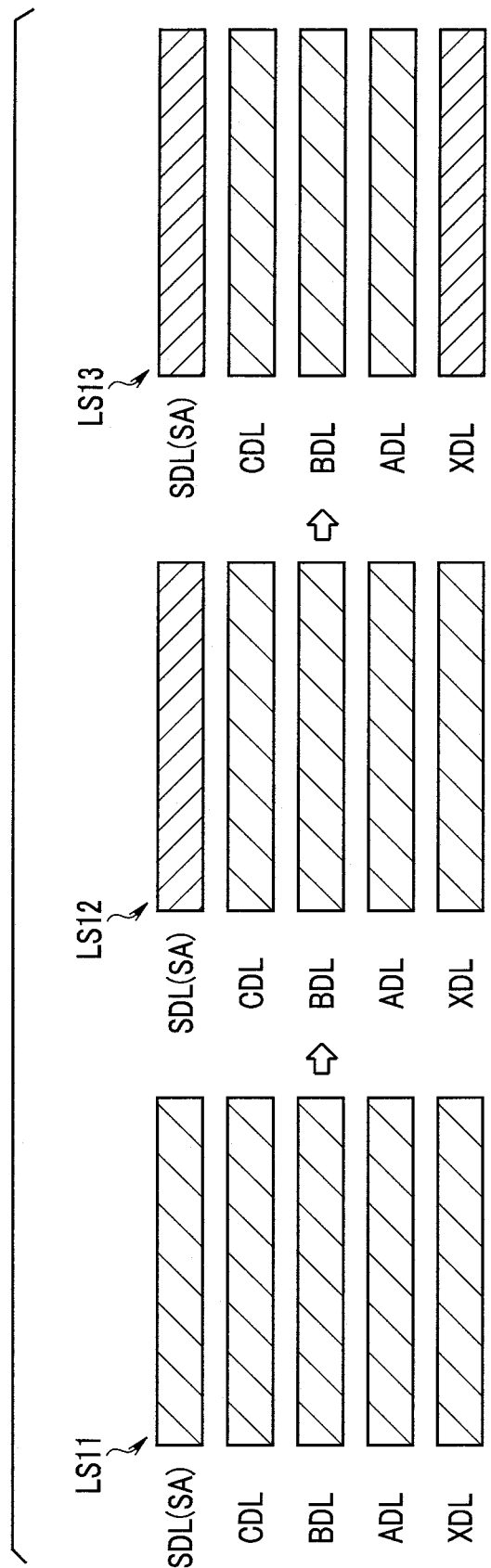
FIG. 10 is a diagram for explaining changes in stored states of data in the five data latches involved in the execution of the command sequence according to the first embodiment.

FIG. 6 is a diagram showing a command sequence during the data write. FIGS. 7 and 8 are diagrams for explaining changes in stored states of data in five data latch groups involved in execution of the command sequence during the data write. FIGS. 7 and 8 show stored states of data corresponding to a number of data K written in each of the data latch groups. Accordingly, lateral width of respective belt-like frames in FIGS. 7 and 8 indicates length corresponding to the number of data K. K corresponds to a data amount in one read operation and one write operation for reading data from and writing data in the NAND flash memory 100. In FIG. 10 and the like referred to below, lateral width of respective belt-like frames indicates length corresponding to the number of data K.

In the data write, after the data for the three pages of the lower bit, the middle bit, and the upper bit are written in the data latch groups ADL, BDL, and CDL, a program operation for writing data in the memory cell array 110 is executed by the sequencer 170.

Each command is supplied from the controller 200 to the NAND flash memory 100 by an 8-bit input/output signal I/O. The program operation is performed in each page unit. Commands and the like of the command sequence for write are outputted from the controller 200 to the NAND flash memory 100 in the order of the lower bit, the middle bit, and the upper bit. In respective command sequences, the controller 200 outputs two commands in first two command cycles, outputs five addresses in five address cycles, outputs a plurality of data in a subsequent plurality of cycles, and outputs one command in subsequent one cycle. The controller 200 outputs commands, addresses, and data to the NAND flash memory 100 in the order of command sequences SQ1, SQ2, and SQ3 in FIG. 6.

As shown in the command sequence SQ1, first, the controller 200 outputs, to the input/output signals I/O, a command "c11" for performing write reservation to the lower bit. When the command "c11" is outputted to the input/output signals I/O, no data is stored in the respective data latch groups as shown in LS1 in FIG. 7. In FIG. 7, hatching indicates a state in which no data is stored or a state in which data is undecided.

Subsequently to the command "c11", the controller 200 outputs a command "c21" to the input/output signals I/O. All data latches XDL of the data latch group XDL are reset according to the command "c21". The reset here means that values of the respective data latches XDL of the data latch group XDL become "1". Data in the data latch group XDL is reset as shown in LS2 in FIG. 7 according to the command "c21". As indicated by blanks in FIG. 7, data in all the data latches XDL are "1".

Subsequently to the command "c21", the controller 200 outputs five addresses to the input/output signals I/O. First two addresses "CAL1" and "CAL2" are column addresses. The remaining three addresses "RAL1", "RAL2", and "RAL3" are row addresses.

Subsequently to the five addresses, the controller 200 outputs a plurality of data "DL0", "DL1", . . . , and "DL(K−1)" to the input/output signals I/O. As explained above, K indicates the number of data. The respective data in the input/output signals I/O are stored in the data latch XDL of the sense unit SAU of the column decoder 140 corresponding to a designated address.

LS3 in FIG. 7 shows, with fine hatching, a halfway stored state of a plurality of data "DL0" to "DL(K−1)" in the data latch group XDL. LS4 in FIG. 7 shows a state in which all of the plurality of data "DL0" to "DL(K−1)" are stored in the data latch group XDL.

Subsequently to the plurality of data, the controller 200 outputs a command "c22" to the input/output signals I/O. The command "c22" is a command for copying the data in the data latch group XDL to another data latch group.

The data in the data latch group XDL is copied to the data latch group ADL according to a combination of the command "c11" and the command "c22". The sequencer 170 performs, based on the commands "c11" and "c22", a process for copying the data in the data latch group XDL to the data latch group ADL.

In the command sequence SQ1 in FIG. 6, timing of a long white arrow indicates start timing of the data copy from the data latch group XDL to the data latch group ADL and timing of a short arrow indicates completion timing of the data copy from the data latch group XDL to the data latch group ADL. During the data copy from the data latch group XDL to the data latch group ADL, the ready/busy signal RBn is low. LS5 in FIG. 7 shows a state in which all the data in the data latch group XDL are copied to the data latch group ADL.

Consequently, the command sequence SQ1 for the write reservation to the lower bit ends in FIG. 6. Subsequently, the command sequence SQ2 for write reservation to the middle bit is executed.

In the command sequence SQ2, as in the command sequence SQ1, the controller 200 outputs the five addresses to the input/output signals I/O subsequently to the two commands "c12" and "c21". The controller 200 outputs the command "c22" to the input/output signals I/O subsequently to the five addresses.

The data in the data latch group XDL is copied to the data latch group BDL according to a combination of the command "c12" and the command "c22". The sequencer 170 performs, based on the commands "c12" and "c22", a process for copying and transferring the data in the data latch group XDL to the data latch group BDL.

In the command sequence SQ2 in FIG. 6, timing of a long white arrow indicates start timing of the data copy and transfer from the data latch group XDL to the data latch group BDL and timing of a short arrow indicates completion timing of the data copy and transfer from the data latch group XDL to the data latch group BDL. The ready/busy signal RBn is low during the data copy from the data latch group XDL to the data latch group BDL.

After the command sequence SQ2, the command sequence SQ3 for write reservation to the upper bit and write execution of the lower/middle/upper bits is executed.

In the command sequence SQ3, as in the command sequence SQ1, the controller 200 outputs the five addresses to the input/output signals I/O subsequently to the two commands "c13" and "c21". The controller 200 outputs the command "c23" to the input/output signals I/O subsequently to the five addresses. The command "c23" is a command for copying the data in the data latch group XDL to another data latch group and thereafter executing a write operation.

The data in the data latch group XDL is copied to the data latch group CDL according to a combination of the command "c13" and the command "c23". The sequencer 170 performs, based on the commands "c13" and "c23", a process for copying and transferring the data in the data latch group XDL to the data latch group CDL.

In the command sequence SQ3 in FIG. 6, timing of a long white arrow indicates start timing of the data copy and transfer from the data latch group XDL to the data latch group CDL and timing of a short arrow is indicates completion timing of the data copy and transfer from the data latch group XDL to the data latch group CDL. The ready/busy signal RBn is low during the data copy from the data latch group XDL to the data latch group CDL.

Note that, in FIG. 6, the commands "c12" and "c13" are respectively commands for performing write reservation to the middle bit and the upper bit. Addresses "CAM1" and "CAM2" are column addresses of the middle bit. Addresses "CAU1" and "CAU2" are column addresses of the upper bit. Addresses "RAM1", "RAM2", and "RAM3" are row addresses of the middle bit. Addresses "RAU1", "RAU2", and "RAU3" are row addresses of the upper bit. Data "DM0", "DM1", . . . , and "DM(K−1)" are data of the middle bit. Data "DU0", "DU1", . . . , and "DU(K−1)" are data of the upper bit.

LS6 in FIG. 7 shows a state in which all the data latches XDL are reset according to the command c21 in the command sequence SQ2. LS7 in FIG. 8 shows, with fine vertical lines, a halfway stored state of a plurality of data "DM0" to "DM(K−1)" in the data latch group XDL. LS8 in FIG. 8 shows a state in which all of the plurality of data "DM0" to "DM(K−1)" are stored in the data latch group XDL corresponding thereto.

When the command "c22" in the command sequence SQ2 is outputted, the data in the data latch group XDL is copied to the data latch group BDL. The sequencer 170 performs, based on the commands "c12" and "c22", a process for copying the data in the data latch group XDL to the data latch group BDL.

In the command sequence SQ3, subsequently to the command "c13" for the data write reservation and the command "c21" for the reset of the data latch group XDL, when the output of the data "DU0", "DU1", . . . , and "DU(K−1)" ends, the controller 200 outputs the command "c23" to the NAND flash memory 100.

When the command "c23" in the command sequence SQ3 is outputted, the data in the data latch group XDL is copied and transferred to the data latch group CDL. The sequencer 170 performs, based on the commands "c13" and "c23", a process for copying and transferring the data in the data latch group XDL to the data latch group CDL and, thereafter, starts data write in units of page units, that is, a program operation. After resetting all the data latches XDL, the sequencer 170 starts the program operation. In other words, thereafter, a write process in the memory cell array 110 using data for three pages of the three data latches ADL/BDL/CDL is carried out.

LS9 in FIG. 8 shows a state in which write data is stored in the data latch groups ADL, BDL, and CDL immediately before the program operation is started. LS9 in FIG. 8 shows a state in which all of a plurality of data "DU0" to "DU(K−1)" are stored in the data latch group CDL corresponding thereto, as indicated by thin horizontal lines.

LS10 in FIG. 8 shows a state in which the respective data latch groups are "1" after the program operation. In FIG. 6, the program operation is started at timing ts and ends at timing te.

The ready/busy signal RBn is low from the start of the data copy from the data latch group XDL to the data latch group CDL until the end of the program operation.

[Operation During Data Read]

First, a basic operation during data read (hereinafter referred to as normal read as well) based on a threshold voltage set in advance is explained.

1) Basic Operation of the Normal Read

Figure 9:
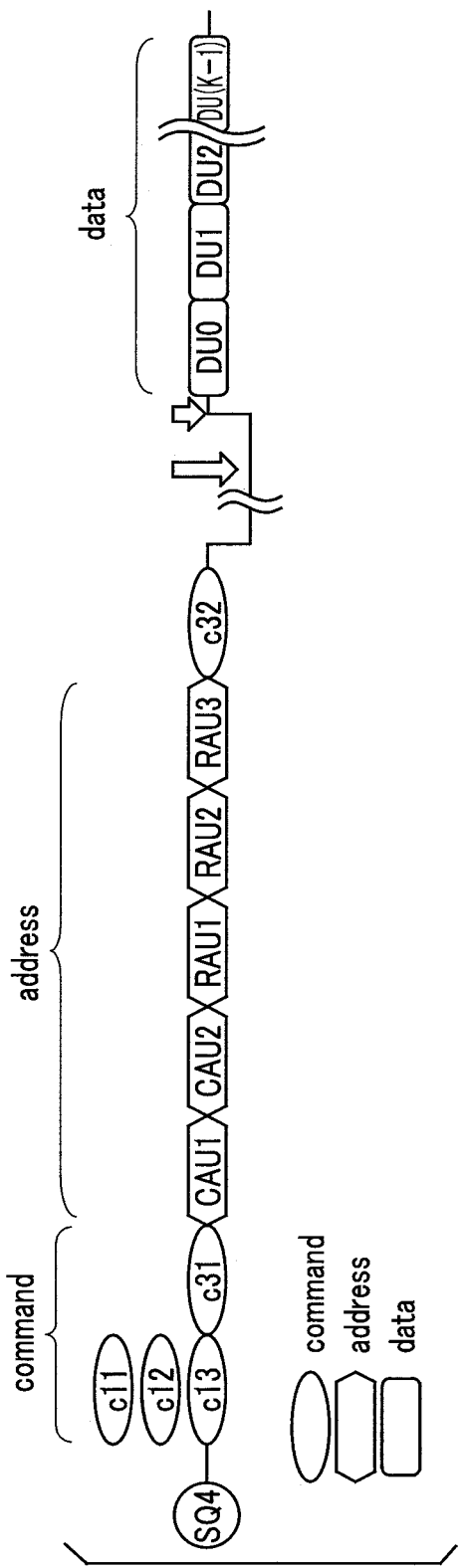
FIG. 9 is a diagram showing a basic command sequence during data read according to the first embodiment.

FIG. 9 is a diagram showing a basic command sequence during data read. FIG. 10 is a diagram for explaining changes in stored stats of data in the five data latches involved in execution of the command sequence.

As shown in a command sequence SQ4, the controller 200 outputs, to the input/output signals I/O, the command "c11", "c12", or "c13" for performing read reservation of any one of the lower, middle, and upper bits.

FIG. 9 shows that, subsequently to the command "c13", the controller 200 outputs a command "c31" to the input/output signals I/O. Subsequently to the command "c31", the controller 200 outputs five addresses to the input/output signals I/O.

Subsequently to the five addresses, the controller 200 outputs a command "c32" to the input/output signals I/O. The command "c32" is a command for instructing execution of data read. Accordingly, the sequencer 170 executes data read to a designated address. Read results of the respective data are stored in the respective sense amplifiers SA first.

When the command "C32" is outputted to the input/output signals I/O, no data is stored in the respective data latch groups as shown in LS11 in FIG. 10. Thereafter, the sequencer 170 reads data. The data is stored in the data latch group SDL as indicated by fine hatching in LS12 in FIG. 10.

After receiving the command "c32", the NAND flash memory 100 executes a read operation. Therefore, the ready/busy signal RBn becomes low (indicated by a white long arrow).

After all data are stored in the data latch group SDL, all the data are copied to the data latch group XDL. When all the data are copied to the data latch group XDL, the ready/busy signal RBn becomes high (indicated by a white shot arrow). LS13 in FIG. 10 shows a state in which the data in the data latch group SDL is copied to the data latch group XDL.

Thereafter, the controller 200 reads data from the data latch group XDL of the NAND flash memory 100.

As explained above, the controller 200 can read the data from the NAND flash memory 100.

2) Basic Operation of Shift Read

During the data read, the threshold voltage of the memory cell transistor MT fluctuates because of various factors and data sometimes cannot be correctly read by the data read by a read level corresponding to the threshold voltage set in advance explained above, that is, the normal read. In such a case, the controller 200 changes the read level and performs the data read operation. In other words, the controller 200 sets, as the read level, a voltage (for example, a voltage VBs) shifted by a certain value (hereinafter referred to as shift amount as well) from the read level corresponding to the threshold voltage (for example, the voltage VB) in the normal read and performs the data read operation. In the following explanation, such a read operation is referred to as shift read.

Accordingly, a plurality of (three) shift tables for determining a shift amount are stored in the RAM 220 of the controller 200 as the shift table information TBL. Each of the shift tables is a part of the management information MI. The management information MI is stored in the management information storage area MIA of the memory cell array 110 of the NAND flash memory 100. When the power supply of the memory system 1 is turned on, in general, the management information MI is transferred to the RAM 220 and referred to and used by the processor 230.

FIG. 11 is a diagram showing an example of a shift table TBL1 for the lower page, which is one table of the shift table information TBL. FIG. 12 is a diagram showing an example of a shift table TBL2 of the middle page in the shift table information TBL. FIG. 13 is a diagram showing an example of a shift table TBL3 of the upper page in the shift table information TBL. A plurality of shift amounts corresponding to a plurality of index numbers are set in each of the shift tables.

Further, the controller 200 determines a shift amount based on, for example, data (hereinafter referred to as history data) for designating shift amounts for each of the blocks BLK. History data HD is, for example, table data and includes index numbers for each of the blocks BLK. When performing read of data in a certain block BLK, the controller 200 reads, from the history data HD, an index number set about the target block BLK and performs, referring to the shift table information TBL, the shift read for the block BLK using shift amount data corresponding to the read index number.

The history data HD may be in units of blocks BLK, may be in units of lower/medium/upper bits in the respective blocks BLK, or may be in units of word lines WL in the respective blocks BLK. The processor 230 can specify a read target block BLK or the like from a read target address.

For example, the processor 230 reads, from the history data HD, an index number set for the specified block BLK. The processor 230 obtains, referring to the shift table TBL corresponding to the read index number, shift amount data corresponding to the read index number, adds the shift amount data to a read level set in advance, and calculates a read level (a read voltage). As a result, the processor 230 can read data from the block BLK using the calculated read level.

As shown in FIGS. 11 to 13, the shift table information TBL includes three shift tables set for each of the pages. In the shift table TBL1 for the lower page in FIG. 11, shift amounts of a plurality of (five here) levels during the read operations AR and ER are set. In the shift table TBL2 for the middle page in FIG. 12, shift amounts of a plurality of (five here) levels during the read operations BR, DR, and FR are set. In the shift table TBL3 for the upper page in FIG. 13, shift amounts of a plurality of (five here) levels during the read operations CR and GR are set.

Each of the shift tables includes a plurality of index numbers and includes shift amounts for each of the index numbers. As the index number increases, the shift amounts in the respective read operations also increase.

As explained above, the shift amounts are set in, for example, the shift table information TBL provided in units of blocks and the respective shift tables of the shift table information TBL are transferred from the management information storage area MIA to the RAM 220.

The shift read is performed when data read is not successfully performed by read (normal read) of data using read levels corresponding to threshold voltages corresponding to respective states set in advance. Accordingly, when the data read is not successfully performed by the normal read, the shift read is performed in re-read. When the data read is successfully performed, the index numbers of the history data are updated. As a result, index numbers for specifying shift amount data during the last (latest) data read are stored in the history data HD. When the data read is successfully performed in the normal read, the index numbers in the history data HD are set to, for example, "0".

Figure 14:
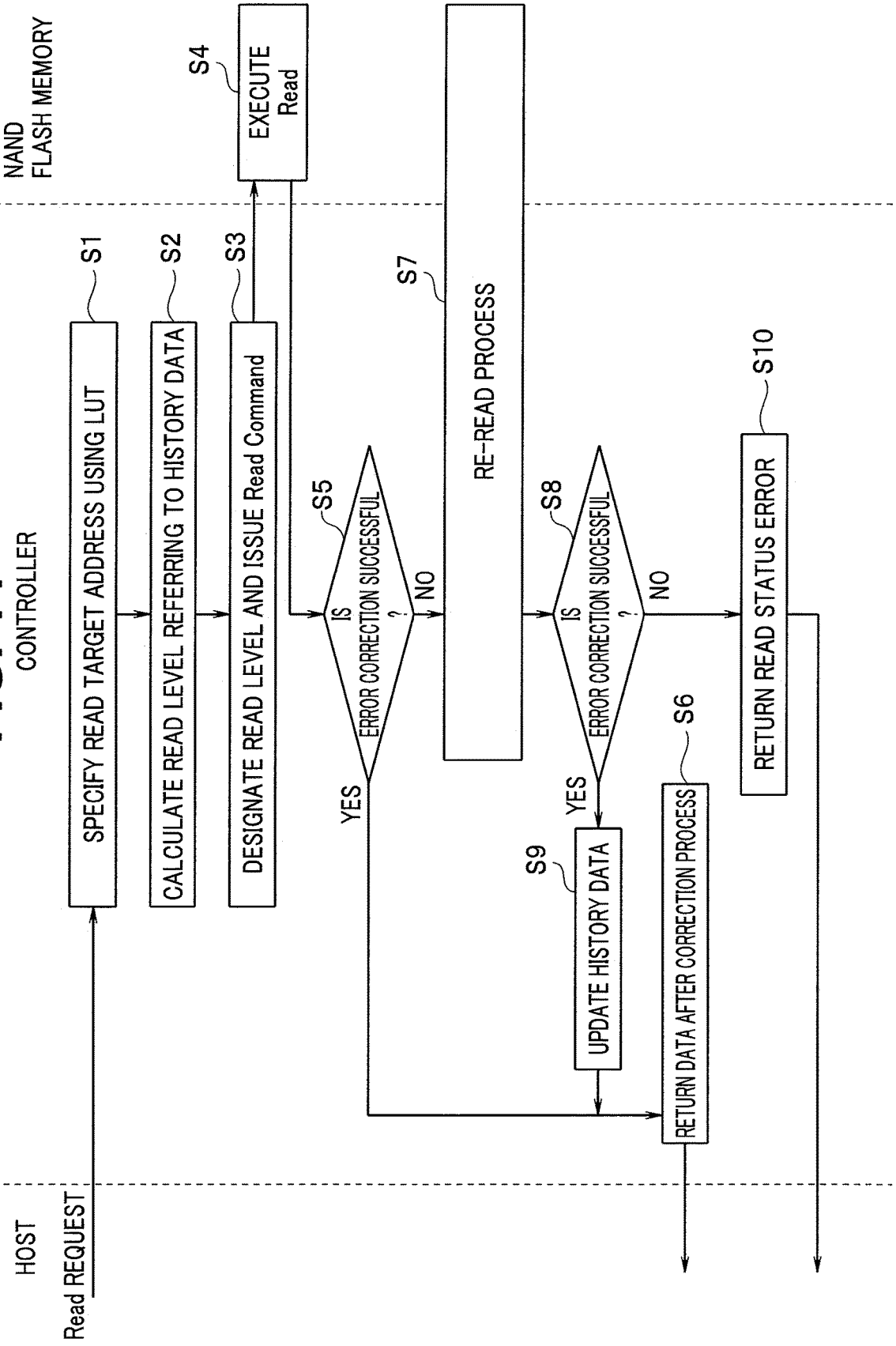
FIG. 14 is a flowchart showing an example of a flow of a data read process of a controller and a NAND flash memory at the time when a read request is received from a host, according to the first embodiment.

FIG. 14 is a flowchart showing an example of a flow of a data read process of the controller 200 and the NAND flash memory 100 at the time when a read request is received from a host. FIG. 14 shows a data read process for each of the pages. The controller 200 specifies, in response to a data read request from the host apparatus 300, a read target address (that is, a physical address) using the lookup table LUT (FIG. 1) in the RAM 220 (step (hereinafter abbreviated as S) 1).

The read request from the host apparatus 300 designates an address of read data with a logical address. The controller 200 stores correspondence relation information between logical addresses and physical addresses of the NAND flash memory 100 in the lookup table LUT as table information. In S1, when receiving the read request, the controller 200 specifies, referring to the lookup table LUT, a physical address corresponding to the logical address included in the read request.

When the physical address is specified, the controller 200 calculates a read level referring to the history data HD (S2). The history data HD is conventionally stored in the RAM 220. However, in the present embodiment, the history data HD is stored in a data latch group not used during data read. As explained above, the history data HD stores the index numbers of the shift amounts during the last read. During the shift read, voltages of shift amounts of the recorded index numbers are added to the read voltages corresponding to the respective states set in advance used during the normal read. An added-up voltage value is calculated as a read level.

Note that when the power supply is turned off, the lookup table LUT, the shift table information TBL, and the history data HD are stored, that is, updated in the management information storage area MIA of the memory cell array 110 of the NAND flash memory 100 and, thereafter, when the power supply is turned on, read from the NAND flash memory 100 and stored in the RAM 220 or the data latch groups.

The controller 200 issues a read command to the NAND flash memory 100 based on the specified physical address and the read level calculated in S2 (S3).

When receiving the read command from the controller 200, the NAND flash memory 100 performs data read based on the read command (S4). When the index numbers during the last read are not stored in the history data HD (that is, the index numbers are 0), the normal read is executed. When the index numbers during the last read are stored in the history data HD, the shift read using shift amounts corresponding to the index numbers is executed.

A result of the read is acquired by the controller 200. The controller 200 determines whether the data read is successfully performed, that is, error correction is successfully performed by the ECC circuit 260 even if an error is present (S5).

When the data read is successfully performed (YES in S5), the controller 200 returns read data (that is, data after a correction process) to the host apparatus 300 (S6).

When the data read is not successfully performed (that is, the error correction is not successfully performed) (NO in S5), the controller 200 executes a re-read process (S7). In the re-read process, the index numbers of the respective shift tables are incremented to change the shift amounts and, at the same time, the re-read is performed. Note that, instead of the re-read with the shift amounts changed, a read voltage may be determined by Vth tracking to perform the re-read. The Vth tracking is a process for determining, based on the number of memory cells (the number of ON cells) that are turned on when the read voltage is changed, a read voltage (a so-called trough position voltage) with which data can be correctly read.

The shift read is performed in the re-read process (S7). It is determined after the re-read process (S7) whether the error correction is successful (S8). When the error correction is unsuccessful, that is, the data read is not successfully performed (NO in S8), the controller 200 returns, to the host apparatus 300, a read status error indicating that the read is not successfully performed (S10).

When the shift read is performed in the re-read process (S7) and the error correction is successful, that is, the data read is successfully performed, the controller 200 updates the history data HD (S9) and returns the read data (that is, data after the correction process) to the host apparatus 300 (S6).

As explained above, the data is read from the NAND flash memory 100 using the history data HD and the shift table information TBL.

3) Basic Operation During Suspend Read

The controller 200 has a function of, when receiving a read request from the host apparatus 300 during the program operation, once interrupting (hereinafter referred to as "suspending" as well) the program operation of the NAND flash memory 100 and executing the read operation and, after the execution of the read operation, causing the NAND flash memory 100 to restart (hereinafter referred to as "resume" as well) the program operation.

When receiving a read command during the program operation, the NAND flash memory 100 once suspends such a program operation, executes the data read, and, thereafter, resumes the program operation. Such operation is operation for quickening a response to the read request and is referred to as suspend read.

The controller 200 includes a predetermined register (not shown) that stores suspend information at the time when the program operation is suspended. The controller 200 resumes the program operation based on the suspend information stored by the register.

Figure 15:
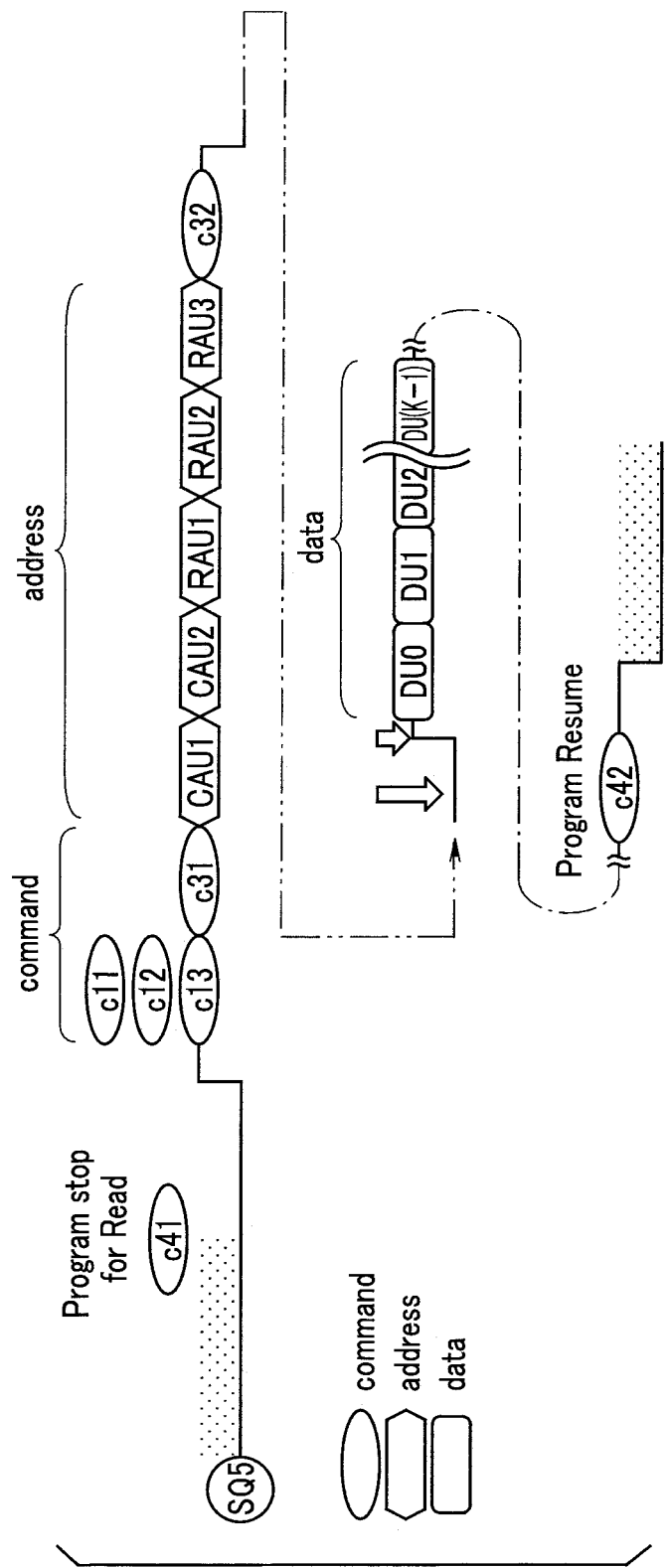
FIG. 15 is a diagram showing a command sequence during suspend read according to the first embodiment.

FIG. 15 is a diagram showing a command sequence during the suspend read.

When receiving a read request from the host apparatus 300 during the program operation of the NAND flash memory 100, as shown in a command sequence SQ5, the processor 230 of the controller 200 outputs a command "c41" for interrupting the program operation to the NAND flash memory 100 and stores suspend information in a predetermined register (not shown). After interrupting the program operation, the controller 200 causes the sequencer 170 to execute the read operation.

More specifically, after the command "c41" is outputted, the command and the address shown in FIG. 9 is supplied from the controller 200 to the NAND flash memory 100. Read data is supplied from the NAND flash memory 100 to the controller 200. When the data read ends, the controller 200 outputs a command "c42" for resuming the program operation. The sequencer 170 restarts the program operation according to the command "c42".

Figure 16:
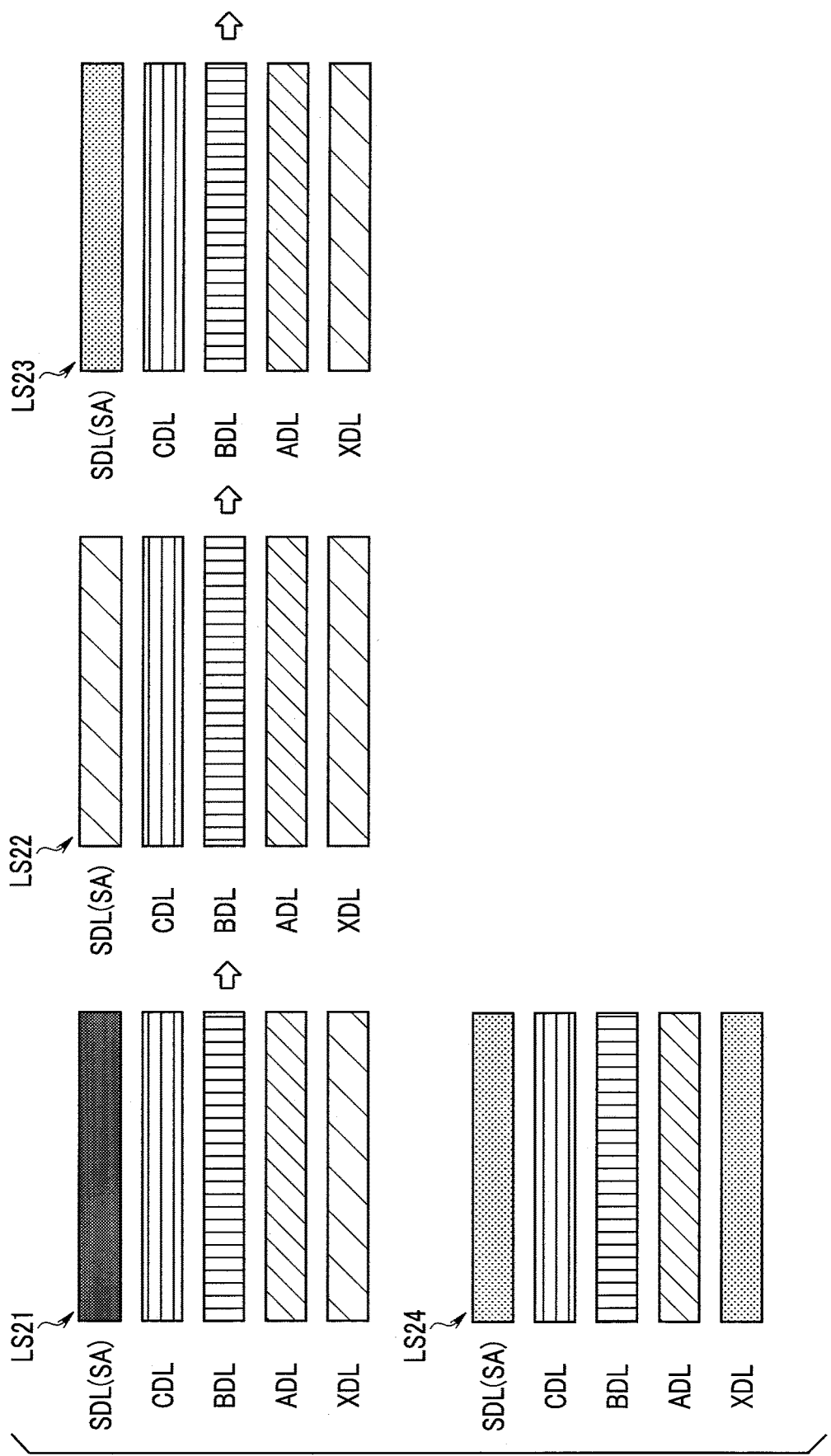
FIG. 16 is a diagram for explaining changes in stored states of data in the five data latches during the suspend read according to the first embodiment.

FIG. 16 is a diagram for explaining changes in stored states of data in the five data latches during the suspend read. LS21 in FIG. 16 shows states of the respective data latches during the program operation. Write data is stored in the data latch groups ADL, BDL, and CDL. Data for verify is stored in the data latch group SDL. LS22 in FIG. 16 shows states of the respective data latches immediately before program operation is interrupted and the read operation is started.

During the read operation, as shown in FIGS. 9 and 10, the data latch groups SDL and XDL are used. LS23 in FIG. 16 shows a state in which the sequencer 170 reads all data and stores the data in the data latch group SDL as indicated by a fine dot pattern. LS24 shows a state in which the data in the data latch group SDL is copied to the data latch group XDL. Accordingly, the controller 200 can read the data from the data latch group XDL.

During the suspend read, the data in the three data latch groups ADL, BDL, and CDL are not changed. Accordingly, when the program operation is resumed, the sequencer 170 can restart the program operation using the data in the data latch groups ADL, BDL, and CDL as they are. When the program operation is restarted, states of the data latch groups SDL, ADL, BDL, CDL, and XDL are the same as the states in LS21.

4) Storage Area and Steady State of Management Information

The controller 200 executes the write operation for writing data in and the read operation for reading data from the NAND flash memory 100 using the management information MI. The management information MI is information used by the controller 200, for example, when the read operation from the NAND flash memory 100 is performed and is, for example, data such as the lookup table LUT, the shift table information TBL, and the history data HD.

In general, when the power supply of the memory system 1 is turned on, the management information MI is read from the management information storage area MIA in the memory cell array 110 of the NAND flash memory 100, copied to the RAM 220 of the controller 200, and used by the processor 230. However, when the RAM 220 having a large data size cannot be provided in the controller 200 and a data size of the management information MI increases because, for example, the number of blocks increases, in some case, not all of the management information MI can be stored in the RAM 220.

The RAM 220, which stores the management information MI, is used to temporarily store a lot of data in a tracking process, a patrol process, and the like as well. Accordingly, a sufficient free space is also necessary in the RAM 220. The shift information updated by the tracking process, the patrol process, and the like is also stored in the management information storage area MIA in the memory cell array 110.

Further, when the number of bits of the data stored in the memory cell transistor MT increases, the data size of the management information MI also increases.

However, depending on a use, the NAND flash memory 100 may mostly perform data read after once writing data. For example, when the NAND flash memory 100 is used in a data center or the like, after data is written once, an occurrence frequency of the data read is higher than an occurrence frequency of the data write.

Therefore, in the present embodiment, by storing a part of the management information MI in a data latch group not used during the data read, the controller 200 is enabled to read the management information MI with small latency even if the RAM 220 having a large size cannot be provided in the controller 200. In other words, when executing or before executing the data read process from the NAND flash memory 100, the controller 200 stores the management information MI used for the data read in one of the data latch groups formed by the plurality of data latch circuits.

Note that, in the present embodiment, a data amount of a part of the management information MI stored in the data latch group not used during the data read is a data amount fit in one page and is stored in the data latch group ADL.

In the following explanation, a state in which a part of the management information MI is stored in the data latch group ADL is referred to as steady state of the data latch group.

Note that, in an example explained below, the history data HD used during the shift read is stored in the data latch group ADL as a part of the management information MI. In other words, the history data HD is stored in the data latch group ADL indicated by an alternate long and two short dashes line in FIG. 4.

When the history data HD is stored in the data latch group ADL, index numbers indicating shift amount data used for each of the blocks BLK are stored in the data latch group ADL as the shift information.

Accordingly, in the controller 200, a correspondence table CT storing a column address of the data latch group ADL corresponding to the block BLK of a read target address is generated and stored in the RAM 220. By referring to the correspondence table CT, the processor 230 can acquire shift information (an index number) corresponding to the block BLK of the read data from the data latch group ADL and execute the shift read.

In the present embodiment, the lookup table LUT and the shift table information TBL, both of which are the management information, are stored in the RAM 220 as indicated by a dotted line in FIG. 1. When data read is performed, the controller 200 reads an index number of a target address in the history data HD out of the data latch group ADL. The controller 200 can perform, referring to the shift table information TBL, the shift read using shift amount data determined from the read index number.

Note that when the history data HD, which is the management information MI, is stored in the data latch group ADL, the history data HD may be stored in the data latch group XDL as well.

A procedure for storing the management information MI in the data latch group ADL from the management information storage area MIA in the memory cell array 110.

Figure 17:
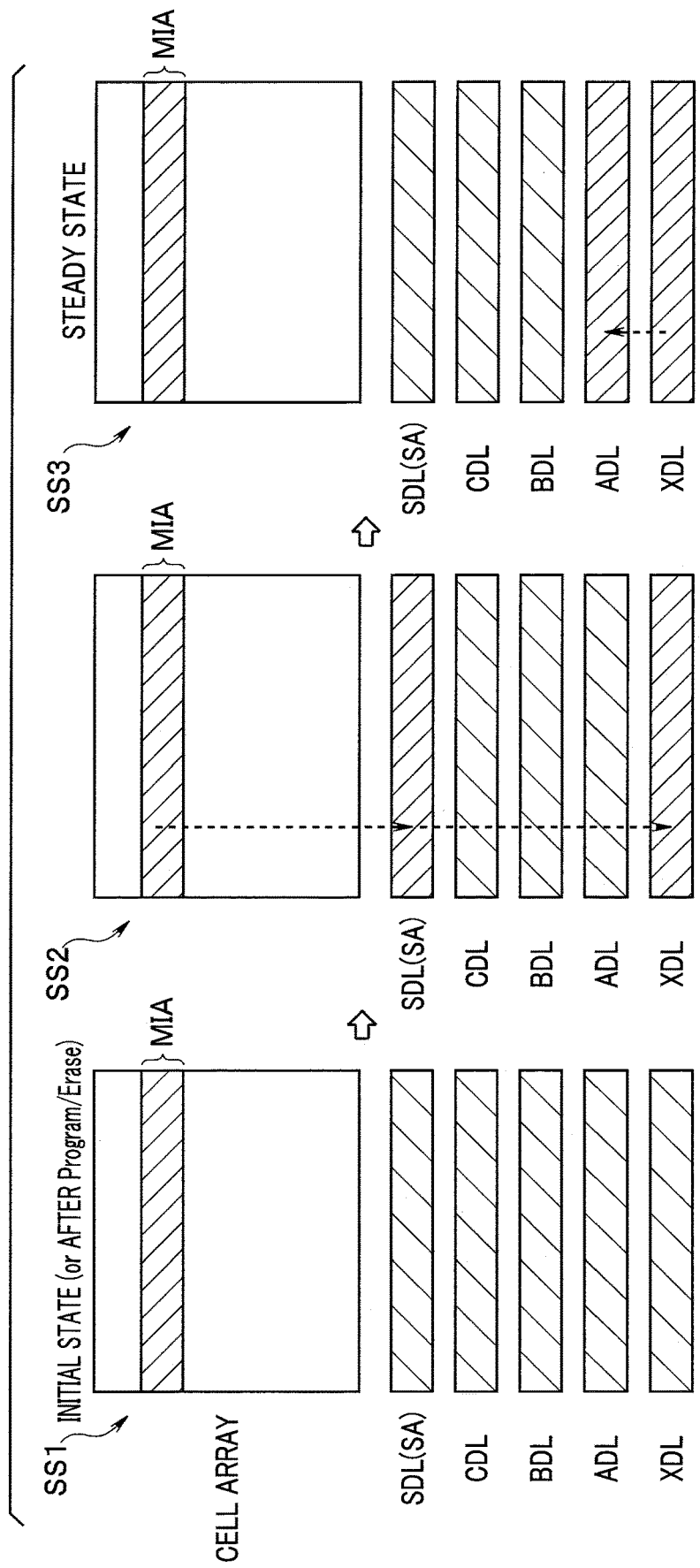
FIG. 17 is a diagram for explaining changes in stored states of management information until the management information is stored in data latch groups according to the first embodiment.
Figure 18:
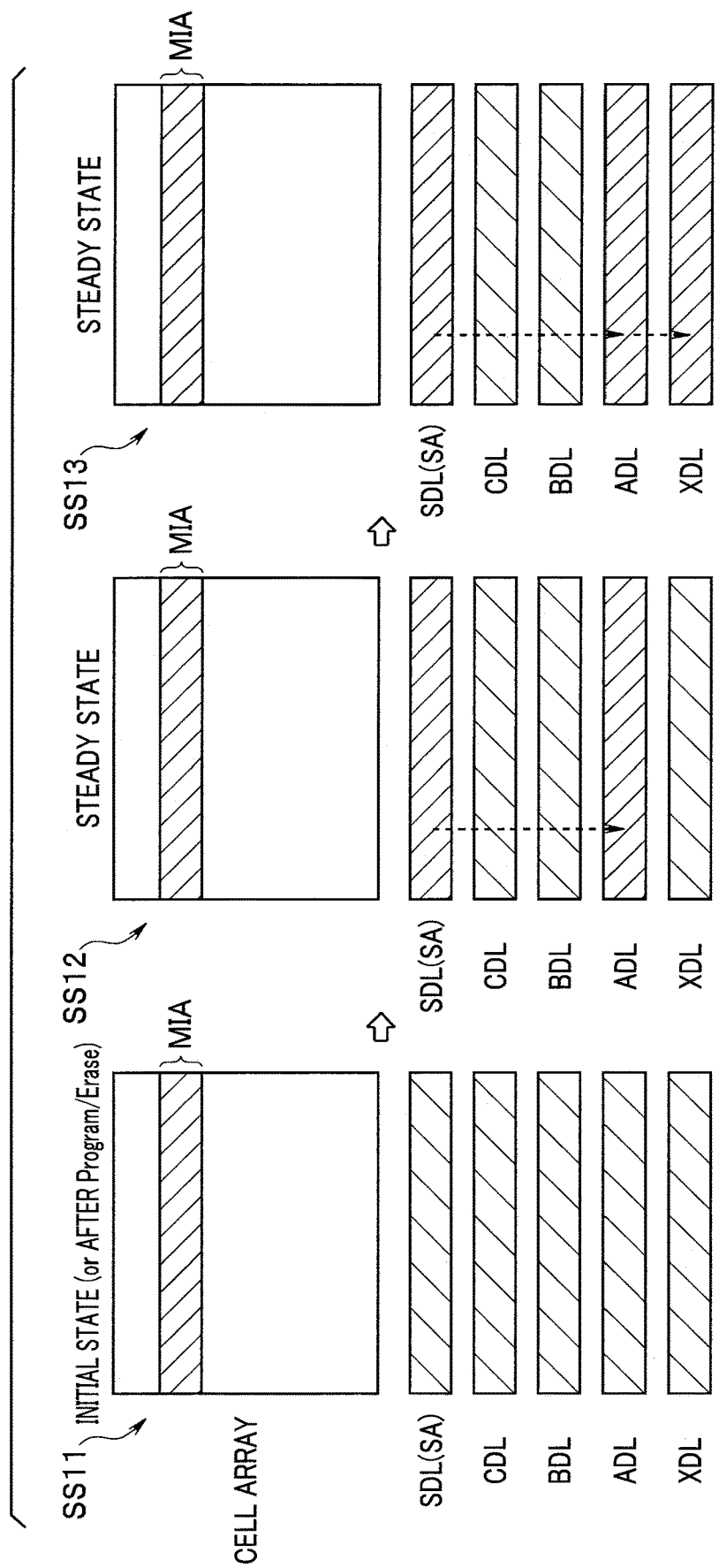
FIG. 18 is a diagram for explaining changes in stored states of management information until the management information is stored in the data latch groups according to the first embodiment.
Figure 19:
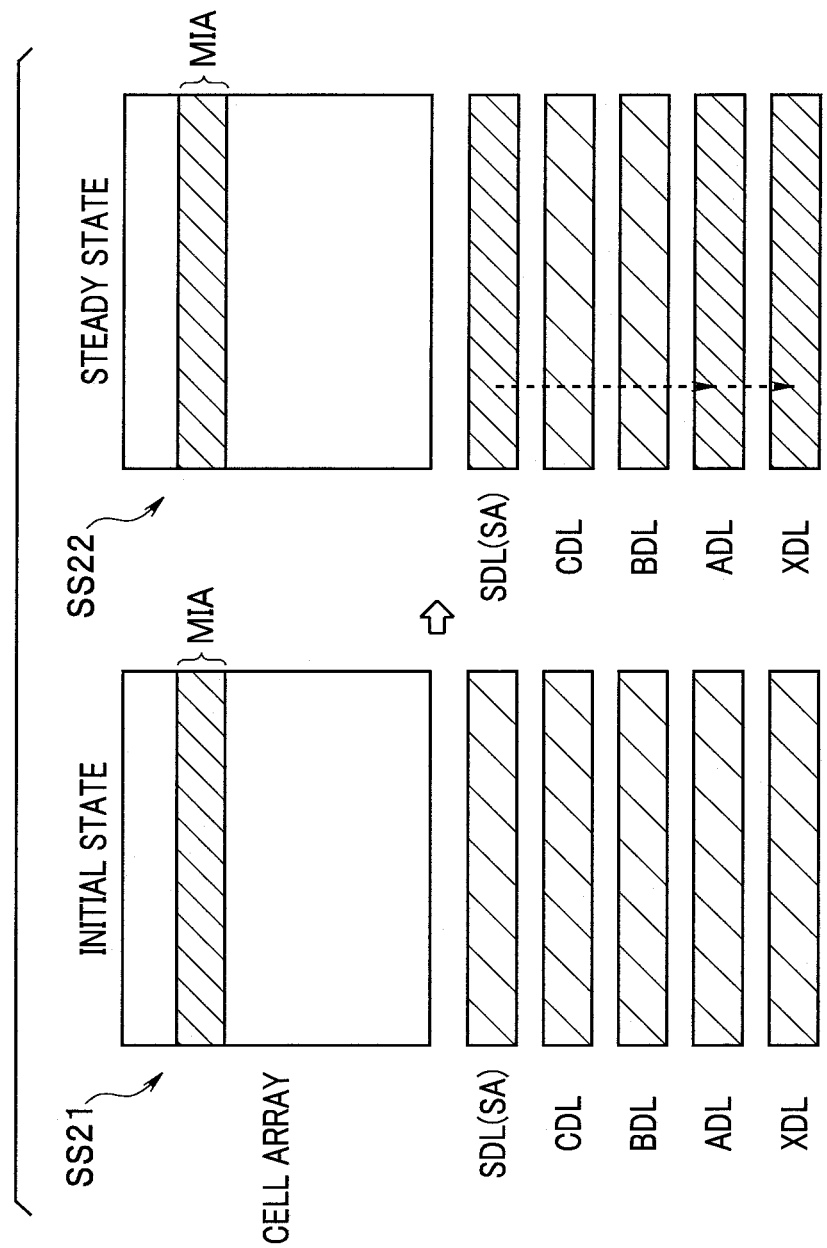
FIG. 19 is a diagram for explaining changes in stored states of management information until the management information is stored in the data latch groups according to the first embodiment.

First, the steady state set by transferring the management information MI to the data latch group ADL and a procedure of a process for converting the management information MI into the steady state are explained. The process for converting the management information MI into the steady state is performed before a data read process is executed by the controller 200 in response to a request from the host apparatus 300. FIGS. 17 to 19 are diagrams for explaining changes in stored states of the management information MI until the management information MI is stored in the data latch group ADL. FIGS. 17 to 19 show stored states of the management information MI in the memory cell array 110 and the five data latches.

A first storage procedure for the management information MI is explained. SS1 in FIG. 17 indicates that, in an initial state (or after write of data or after erasing of data), the management information MI is stored in the management information storage area MIA of the memory cell array 110.

In preparation for a data read request from the host apparatus 300, the processor 230 executes read of the management information MI from the management information storage area MIA in the SLC mode to thereby store the management information MI (the history data HD) in the data latch group SDL and further copy the management information MI to the data latch group XDL as indicated by a dotted line in SS2. Thereafter, as indicated by a dotted line in SS3, the processor 230 copies the management information MI from the data latch group XDL to the data latch group ADL. SS3 shows the steady state. The management information MI is stored in the data latch group XDL as well.

As explained above, before the read process corresponding to the request from the host apparatus 300 on the outside is executed, the controller 200 reads the management information MI from the predetermined storage area, that is, the management information storage area MIA and stores the management information MI in the data latch group ADL.

A second storage procedure for the management information MI is explained. From a state in SS11 in FIG. 18 same as SS1 in FIG. 17, as shown in FIG. 18, in preparation for a data read request from the host apparatus 300, the processor 230 executes read of the management information MI from the management information storage area MIA in the SLC mode to thereby store, as shown in SS12, the management information MI in the data latch group SDL. Thereafter, as indicated by a dotted line in SS12, the processor 230 copies the management information MI from the data latch group SDL to the data latch group ADL. SS12 shows a second steady state of the management information MI.

A third storage procedure for the management information MI is explained. From a state in SS12 in FIG. 18, as shown in SS13, the processor 230 copies the management information MI from the data latch group ADL to the data latch group XDL. SS13 shows a third steady state of the management information MI.

A fourth storage procedure for the management information MI is explained. From a state in SS21 in FIG. 19 same as SS1 in FIG. 17, as shown in FIG. 19, in preparation for a data read request from the host apparatus 300, the processor 230 executes read of the management information MI from the management information storage area MIA in the SLC mode to thereby store the management information MI in the data latch group SDL as shown in SS22. Thereafter, as indicated by a dotted line in SS22, the processor 230 copies the management information MI from the data latch group SDL to both of the two data latch groups ADL and XDL. SS22 shows a fourth steady state of the management information MI. The management information MI is stored in the data latch group XDL as well.

Figure 20:
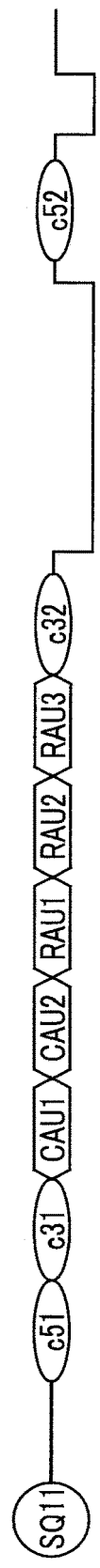
FIG. 20 is a diagram showing a command sequence of a first storage procedure according to the first embodiment.

FIG. 20 is a diagram showing a command sequence SQ11 of the first storage procedure. In an initial state (or after write of data or after erasing of data), the processor 230 outputs a command "c51" for executing read of the management information MI from the management information storage area MIA in the SLC mode. Subsequently to the command "c51", the processor 230 outputs the command "c31" to the input/output signals I/O. Subsequently to the command "c31", the controller 200 outputs five addresses to the input/output signals I/O. Subsequently to the five addresses, the controller 200 outputs the command "c32" to the input/output signals I/O.

Since the command "c32" is a command for instructing execution of data read, the sequencer 170 executes data read to a designated address. A result of the data read is stored in the plurality of sense amplifiers SA first and, thereafter, copied to the data latch group XDL.

The processor 230 outputs, to the input/output signals I/O, a command "c52" for copying data in the data latch group XDL to the data latch group ADL. As a result, the management information MI is stored in the plurality of sense units SAU in the steady state shown in SS3 in FIG. 17.

Figure 21:
FIG. 21 is a diagram showing command sequences of a second storage procedure and a third storage procedure according to the first embodiment.

FIG. 21 is a diagram showing a command sequence SQ12 of the second storage procedure and the third storage procedure. In an initial state (or after write of data or after erasing of data), the processor 230 outputs the command "c51" for executing read of the management information MI from the management information storage area MIA in the SLC mode. Subsequently to the command "c51", the processor 230 outputs commands "c53" and "c31" to the input/output signals I/O. The command "c53" is a command for instructing copy of the management information MI read and stored in the data latch group SDL to the data latch group ADL, not the data latch group XDL. Subsequently to the command "c31", the controller 200 outputs five addresses to the input/output signals I/O. Subsequently to the five addresses, the controller 200 outputs the command "c32" to the input/output signals I/O.

Since the command "c32" is a command for executing data read from a designated address, the sequencer 170 executes the data read from the designated address and stores read data in the data latch group ADL.

Consequently, the management information MI is stored in the plurality of sense units SAU in the steady state shown in SS12 in FIG. 18.

Further, thereafter, by outputting, to the input/output signals I/O, a command "c54" for copying data in the data latch groups ADL of the plurality of sense amplifiers SA to the data latch groups XDL as indicated by dotted lines in FIG. 21, the processor 230 can store the management information MI in the plurality of sense units SAU in the steady state shown in SS13 in FIG. 18.

Figure 22:
FIG. 22 is a diagram showing a command sequence of a fourth storage procedure according to the first embodiment.

FIG. 22 is a diagram showing a command sequence SQ13 of the fourth storage procedure. In an initial state (or after write of data or after erasing of data), the processor 230 outputs the command "c51" for executing read of the management information MI from the management information storage area MIA in the SLC mode. Subsequently to the command "c51", the processor 230 outputs commands "c55" and "c31" to the input/output signals I/O. The command "c55" is a command for instructing copy of the management information MI read and stored in the data latch group SDL to the data latch group XDL and the data latch group ADL. Subsequently to the command "c31", the controller 200 outputs five addresses to the input/output signals I/O. Subsequently to the five addresses, the controller 200 outputs the command "c32" to the input/output signals I/O.

Since the command "c32" is a command for executing data read from a designated address, the sequencer 170 executes the data read from the designated address and stores read data in the data latch groups ADL and XDL.

As explained above, the management information MI is stored in the plurality of sense units SAU in the steady state shown in SS22 in FIG. 19.

A data read operation in the steady state explained above is explained. In the data read operation, first, a read process for shift amount data included in the management information MI is performed.

5) Read and Setting of Shift Amount Data

Figure 23:
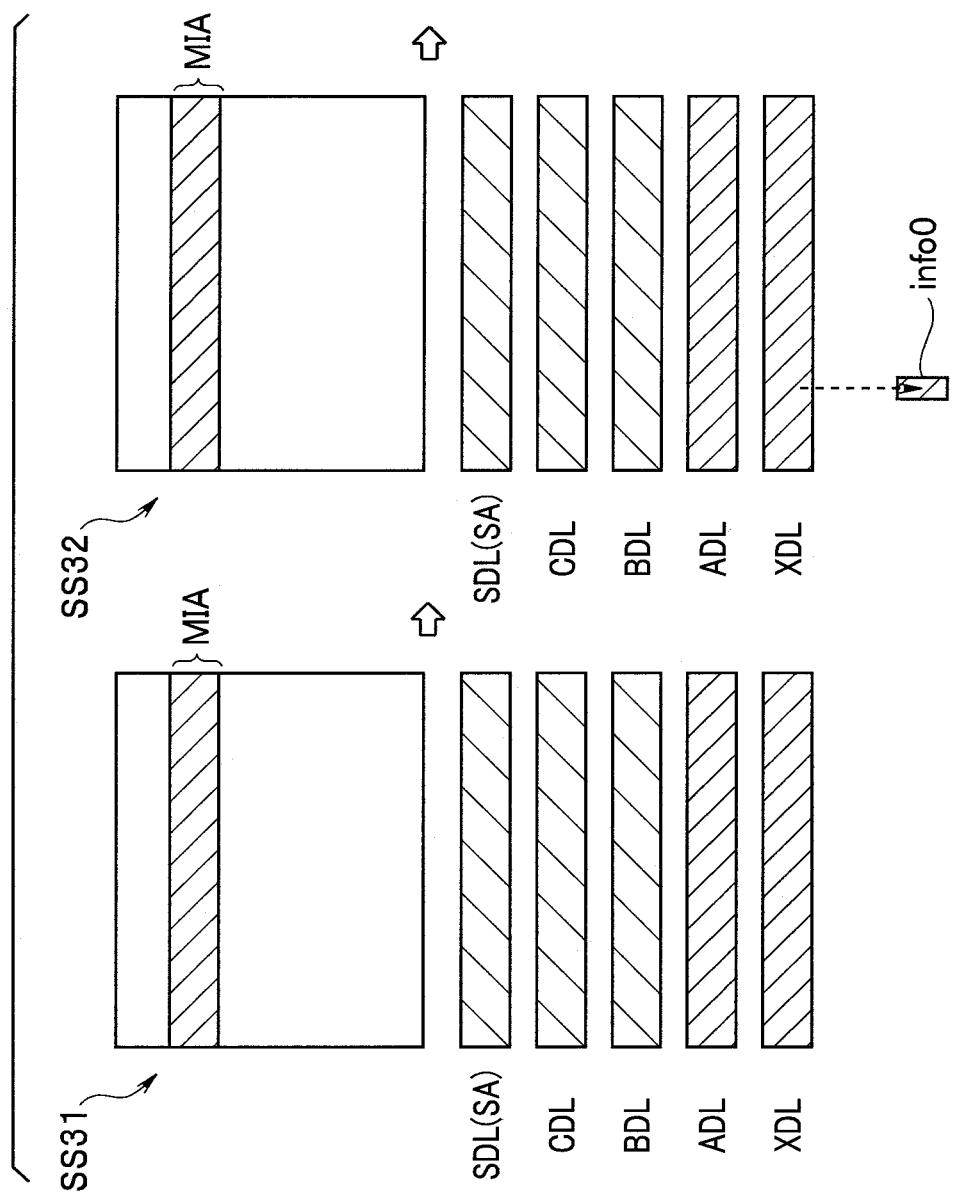
FIG. 23 is a diagram for explaining a case in which shift information, which is management information, is read from a data latch group according to the first embodiment.
Figure 24:
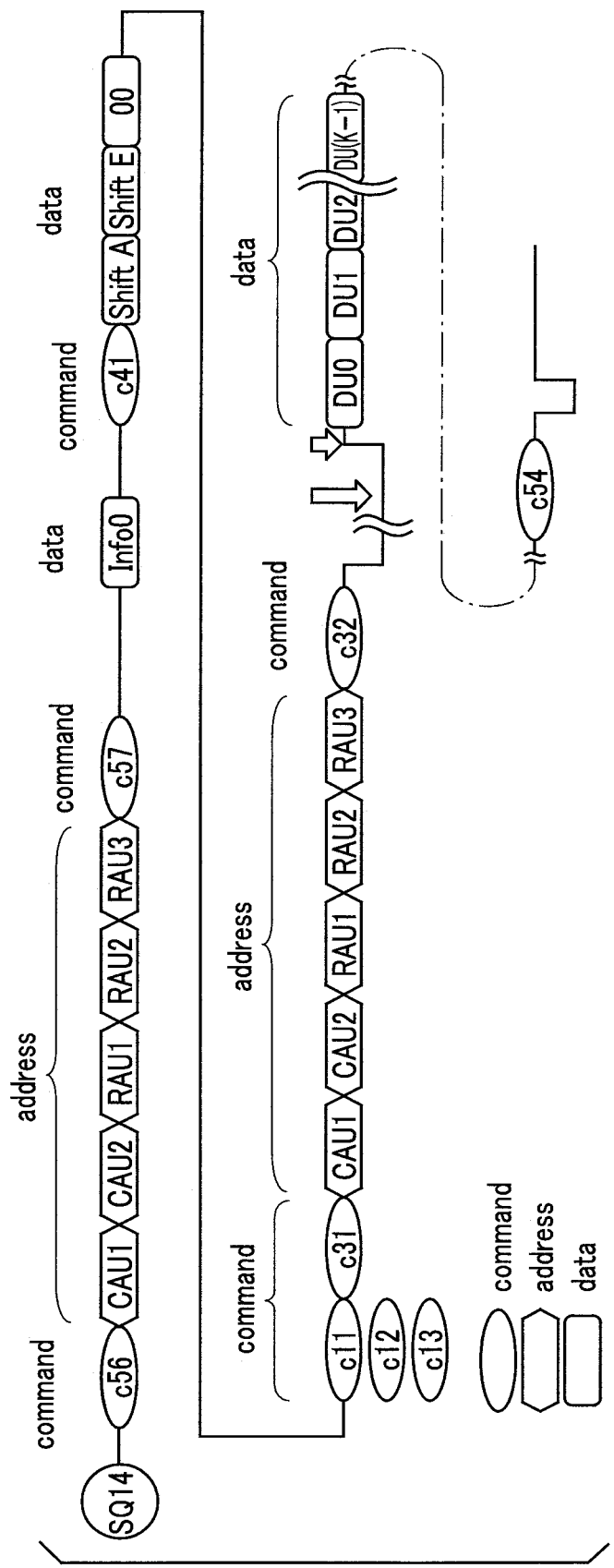
FIG. 24 is a diagram showing a command sequence of a data read procedure according to the first embodiment.

FIG. 23 is a diagram for explaining a case in which shift information (an index number), which is the management information MI, is read from the data latch group XDL. FIG. 24 is a diagram showing a command sequence SQ14 of a data read procedure. Read of an index number from the data latch group ADL is performed according to the command sequence and data read is performed using a shift amount corresponding to the read index number. In the following explanation, in the steady state, as shown in SS31, shift information, which is the management information MI, is stored in advance in the data latch group XDL as well.

The processor 230 outputs a command "c56", which is a register read command. Subsequently to the command "c56", the controller 200 outputs five addresses to the input/output signals I/O. Since only a column address is designated, three row addresses are neglected. Subsequently to the addresses, the controller 200 outputs a command "c57" to the input/output signals I/O.

The sequencer 170 executes read of data in the data latch group XDL in the designated column address and outputs read data "info0". The data "info0" is an index number corresponding to shift amount data relating to the read data. Accordingly, as shown in SS32 in FIG. 23, the controller 200 can acquire the index number from the data latch group XDL.

The processor 230 performs data read using the acquired data "info0". The processor 230 can acquire, referring to the shift table information TBL, shift amount data based on the acquired data "info0". As explained above, before execution of the read process, the controller 200 copies the management information MI from the data latch group ADL to the data latch group XDL in advance. The shift amount data is acquired from the data latch group XDL.

As shown in FIG. 24, the processor 230 outputs, to the input/output signals I/O, a shift amount setting command "c41" for setting, in the NAND flash memory 100, a shift amount used for read to be executed later and outputs shift amount data to the input/output signals I/O subsequently to the shift amount setting command "c41". In FIG. 24, shift amount data for the lower page "Shift A" and "Shift E" and "00" are outputted. Third data is neglected. As shift amount data for the middle page, three shift amount data are outputted. As shift amount data for the upper page, two shift amount data and "00" are outputted. As a result, the shift amount data is set in the NAND flash memory 100.

Figure 25:
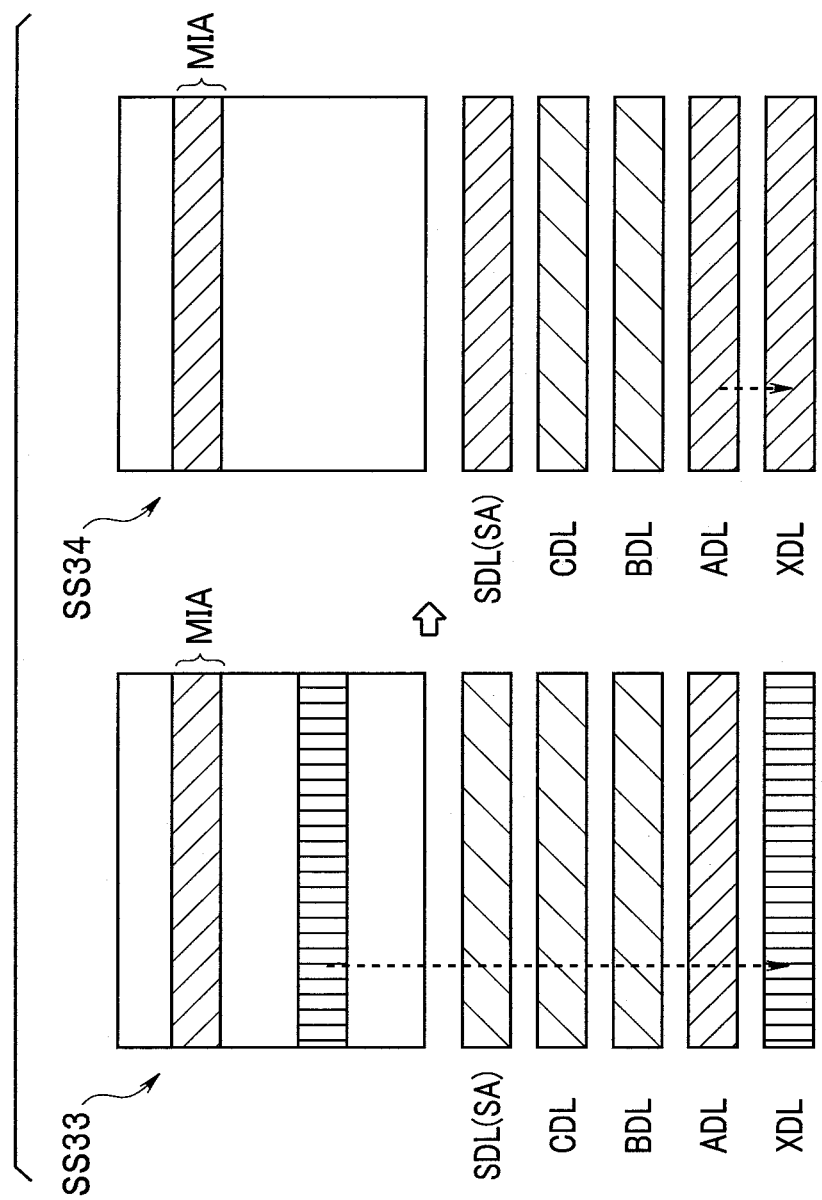
FIG. 25 is a diagram for explaining a case in which data is read from the memory cell array according to the first embodiment.

FIG. 25 is a diagram for explaining a case in which data is read from the memory cell array 110.

As shown in FIG. 24, the controller 200 outputs, to the input/output signals I/O, the command "c11", "c12", or "c13" for performing read reservation for any one of the lower, middle, and upper bits corresponding to read data. In FIG. 24, subsequently to the command "c11", the controller 200 outputs the command "c31" to the input/output signals I/O and, subsequently to the command "c31", outputs five addresses to the input/output signals I/O.

When the controller 200 outputs the command "c32" to the input/output signals I/O, the sequencer 170 executes the shift read using the set shift amount. A result of the data read is stored in the data latch group SDL first and, as shown in SS33 in FIG. 25, stored in the data latch group XDL. As a result, the controller 200 can acquire user data from the data latch group XDL. In FIG. 24, timing of a long white arrow indicates that the ready/busy signal RBn is low and timing of a short arrow indicates that the ready/busy signal RBn is high.

Thereafter, the controller 200 outputs the command "c54" to the input/output signals I/O as indicated by an alternate long and short dash line. As shown in SS34 in FIG. 25, all data in the data latch group ADL are copied to the data latch group XDL.

6) Overall Flow of Read Process

A flow of a data read process in the memory system 1 according to the present embodiment is explained.

Figure 26:
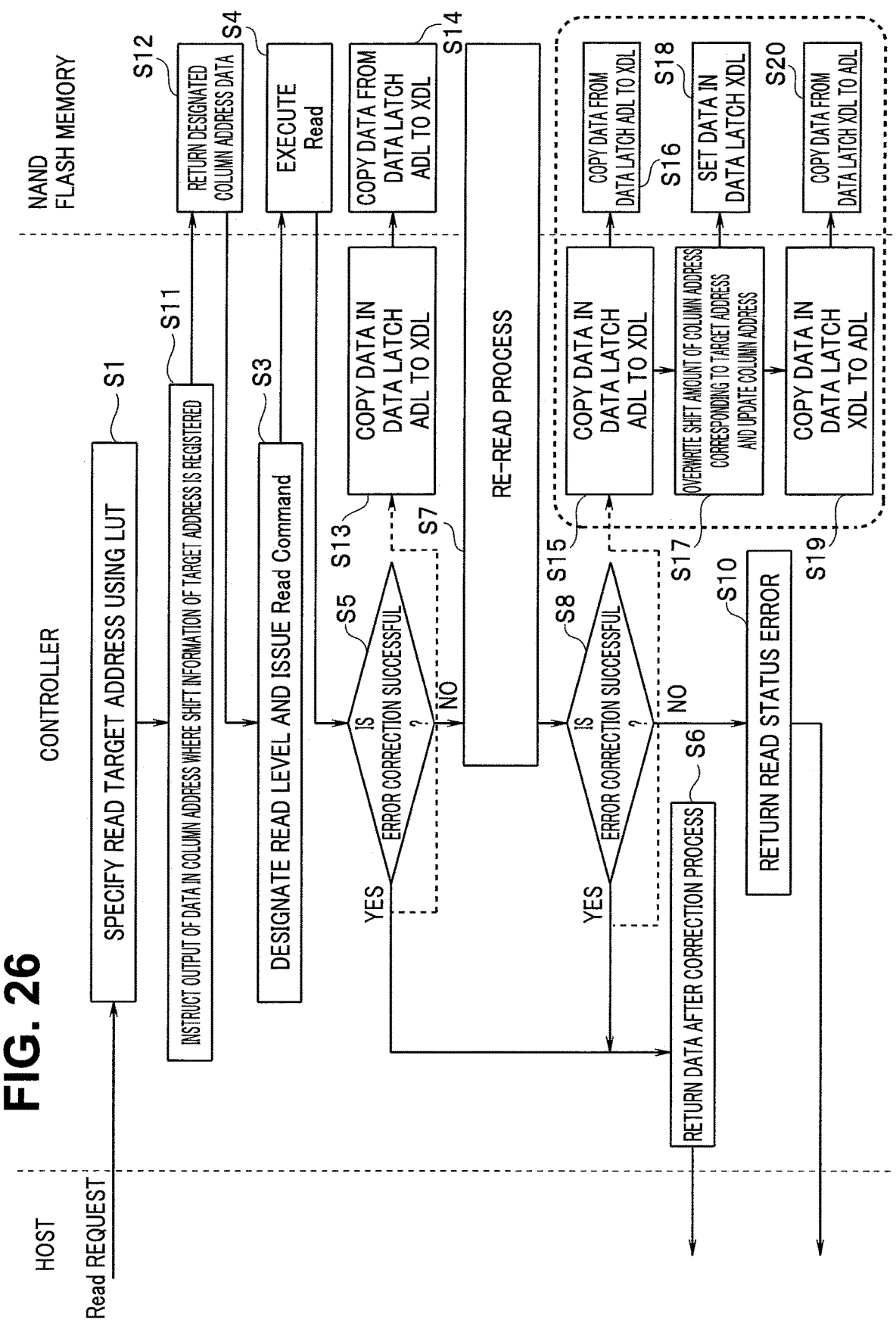
FIG. 26 is a flowchart showing an example of a flow of a data read process of the controller and the NAND flash memory according to the first embodiment.

FIG. 26 is a flowchart showing an example of a flow of a data read process of the controller 200 and the NAND flash memory 100. In FIG. 26, the same processes as the processes in FIG. 14 are denoted by the same step numbers as the step numbers in FIG. 14 and explanation of the processes is simplified. FIG. 26 shows a data read process for each of the pages. When receiving a read request from the host apparatus 300, the controller 200 specifies a read target address (that is, a physical address) using the lookup table LUT in the RAM 220 (S1).

When the physical address is specified, the controller 200 outputs, referring to the correspondence table CT explained above, a command for outputting data in the data latch group XDL in a column address where shift information, that is, a history value (an index number) of a target address in the history data HD is registered (S11). According to the command, the NAND flash memory 100 executes a process for returning data (that is, an index number) of the data latch group XDL in the designated column address to the controller 200 (S12). The processes in S11 and S12 are shown in FIG. 24.

The controller 200 outputs a read command to the NAND flash memory 100 based on the specified physical address and shift amount data corresponding to the acquired index number (S3).

When receiving the read command from the controller 200, the NAND flash memory 100 executes data read based on the read command (S4). The normal read is executed when an index number during the last read is not stored in the history data HD, that is, when the index number is 0. When an index number during the last read is stored in the history data HD, the shift read using a shift amount corresponding to the index number is executed.

Since the data read is performed in units of pages, as a result of the data read, as shown in SS33 in FIG. 25, data for one page is stored in the data latch group XDL.

A result of the read is acquired by the controller 200. The controller 200 determines whether the data read is successfully performed, that is, error correction is successfully performed by the ECC circuit 260 even if an error is present (S5).

When the data read is successfully performed (YES in S5), the controller 200 returns the read data to the host apparatus 300 (S6).

Note that, since the management information MI of the data latch group XDL is erased by the data read, when the data read is successfully performed (YES in S5), in order to change the data latch group XDL to the steady state, as indicated by a dotted line in FIG. 26, the controller 200 further outputs, to the input/output signals I/O, a command for copying the data in the data latch group ADL to the data latch group XDL (S13). As a result, as shown in SS34 in FIG. 25, the sequencer 170 copies the data in the data latch group ADL to the data latch group XDL (S14).

When the data read is not successfully performed (NO in S5), the controller 200 executes the re-read process explained above (S7).

In S7, the shift read or the like is performed and, at the same time, the re-read process explained above is performed. The controller 200 determines whether the error correction is successful, that is, the data read is successfully performed (S8). When the error correction is successful, that is, the data read is successfully performed (YES in S8), the controller 200 returns data subjected to an error correction process to the host apparatus 300 (S6).

Further, when the error correction is successful, that is, the data read is successfully performed (YES in S8), in order to change the data latch groups ADL and XDL to the steady state, as indicated by a dotted line in FIG. 26, the controller 200 outputs, to the input/output signals I/O, the command "c54" for copying the data in the data latch group ADL to the data latch group XDL (S15). As a result, the sequencer 170 copies the data in the data latch group ADL to the data latch group XDL (S16).

Further, after S15, the controller 200 outputs a command for overwriting a column address corresponding to the target address with an index number corresponding to shift amount data at the time when the re-read is successfully performed and updating the column address (S17). As a result, the sequencer 170 updates data in the designated column address in the data latch group XDL with the index number of the shift amount data at the time when the re-read is successfully performed (S18).

Further, after S17, the controller 200 outputs a command for copying the data in the data latch group XDL to the data latch group ADL (S19). As a result, the sequencer 170 copies the data in the data latch group XDL to the data latch group ADL (S20).

As explained above, when the error correction is successful in S5 and S8 (YES in S5 and S8), the controller 200 can return the user data subjected to an error correction to the host apparatus 300 (S6).

When the error correction is successful in S8 (YES in S8), the controller 200 updates the data latch group ADL and changes the data latch groups ADL and XDL to the steady state and, in addition, executes a process for writing the updated shift information (index number of the shift amount data) in the management information storage area MIA of the memory cell array 110.

Figure 27:
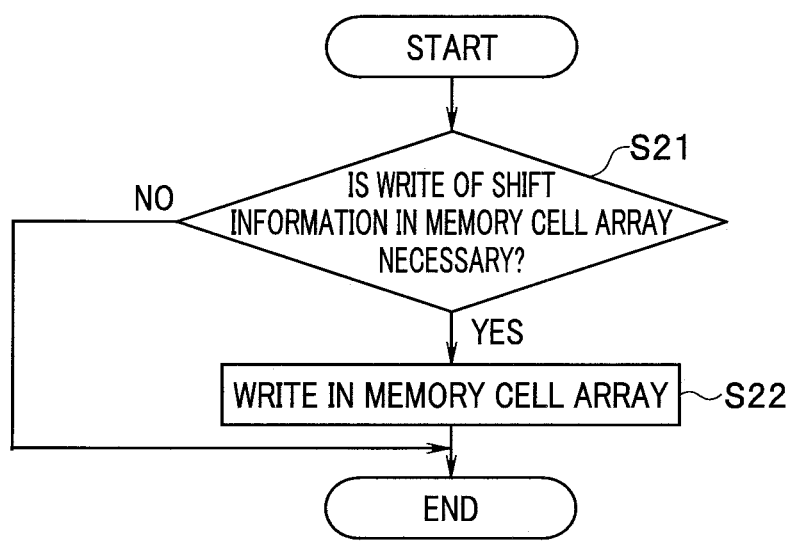
FIG. 27 is a flowchart showing an example of a flow of a process for writing updated shift information in a management information storage area according to the first embodiment.

In other words, when the management information MI is updated by the re-read process, the controller 200 stores the updated management information MI in the NAND flash memory 100. FIG. 27 is a flowchart showing an example of a flow of a process for writing the updated shift information in the management information storage area MIA.

The controller 200 determines whether it is necessary to write the updated shift information in the management information storage area MIA of the memory cell array 110, in other words, the error correction is successful in S8 (S21). When it is unnecessary to write the updated shift information in the management information storage area MIA of the memory cell array 110 (NO in S21), the controller 200 does nothing.

When it is necessary to write the updated shift information in the management information storage area MIA of the memory cell array 110 (YES in S21), the controller 200 writes the updated shift information (index number corresponding to the shift amount data) in the management information storage area MIA of the memory cell array 110 in the SLC mode (S22). In other words, the updated shift information is stored in the memory cell array 110, which is the nonvolatile memory.

Accordingly, when the error correction is successfully performed in S5, the controller 200 does not write the updated shift information in the memory cell array 110, which is the nonvolatile memory. However, when the error correction is successfully performed in S8, the controller 200 writes the updated shift information in the memory cell array 110, which is the nonvolatile memory.

Referring back to FIG. 26, if the error correction is unsuccessful, that is, if the data read is not successfully performed (NO in S8), the controller 200 returns a read status error indicating that the read is not successfully performed to the host apparatus 300 (S10).

Figure 28:
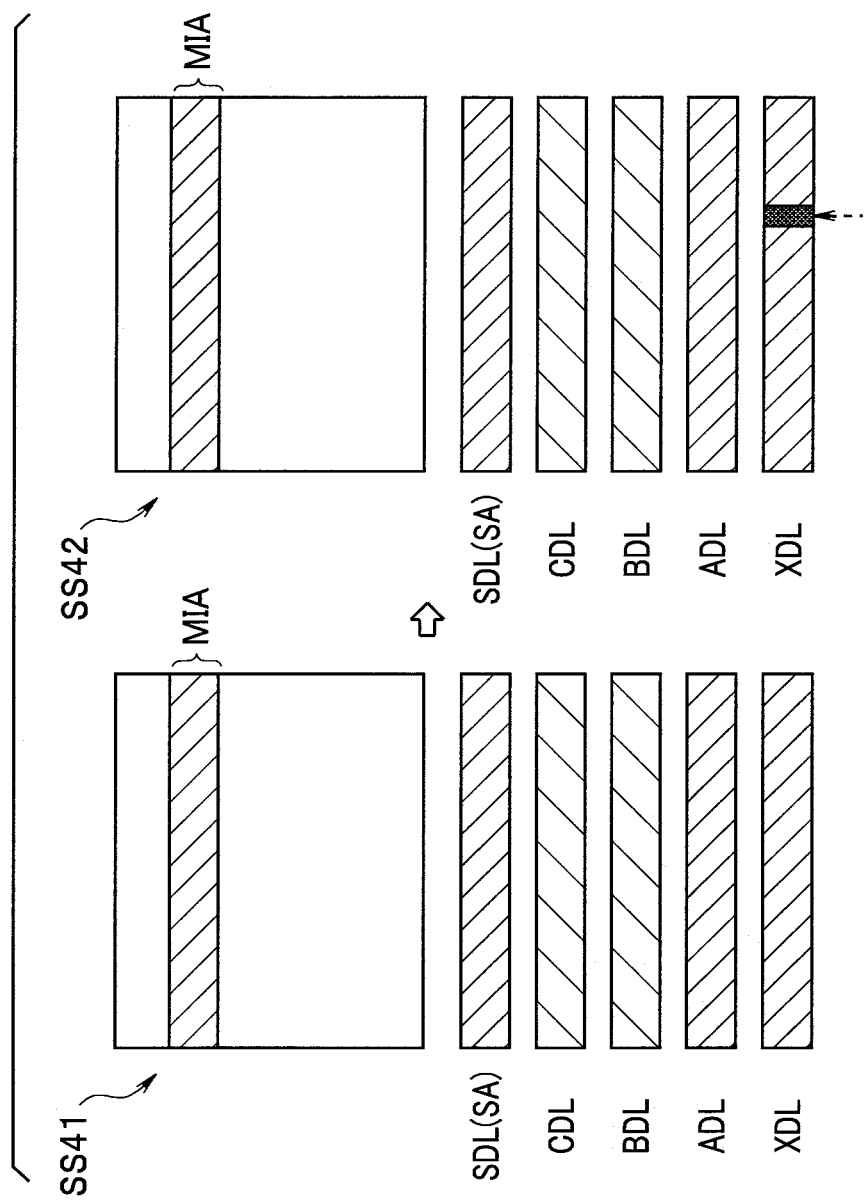
FIG. 28 is a diagram for explaining changes in storage states of data in the memory cell array and five data latch groups in the data read process in FIG. 26 and the write process of the updated management information in a nonvolatile memory in FIG. 27 according to the first embodiment.
Figure 29:
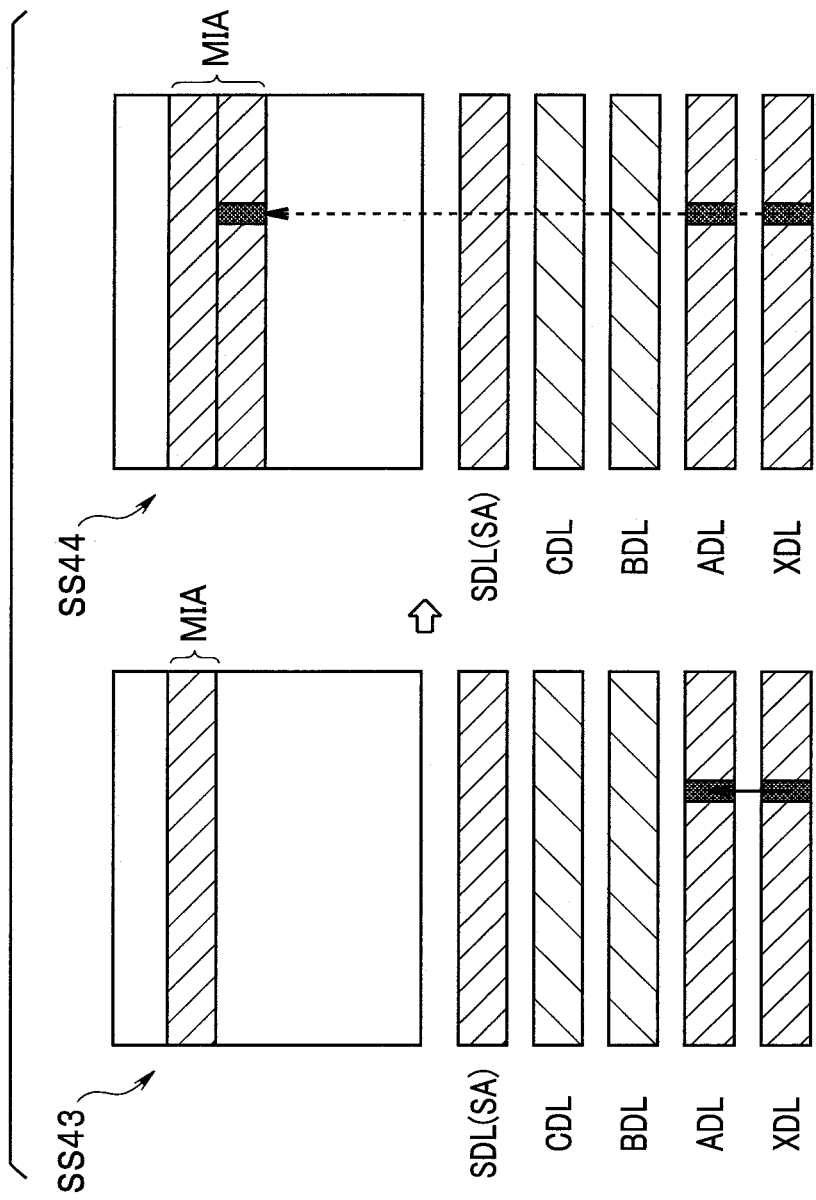
FIG. 29 is a diagram for explaining changes in storage states of data in the memory cell array and the five data latch groups in the data read process in FIG. 26 and the write process of the updated management information in the nonvolatile memory in FIG. 27 according to the first embodiment.

FIGS. 28 and 29 are diagrams for explaining changes in stored states of data in the memory cell array and the five data latch groups in the data read process in FIG. 26 and the write process of the updated management information in the nonvolatile memory in FIG. 27.

SS41 in FIG. 28 shows a state in which the data in the data latch group ADL is copied to the data latch group XDL in S14 and S16 in FIG. 26.

SS42 in FIG. 28 shows a state in which the index number of the shift amount data at the time when the re-read of the data in the designated column address in the data latch group XDL is successfully performed in S18 in FIG. 26.

SS43 in FIG. 29 shows a state in which the data in the data latch group XDL is copied to the data latch group ADL in S20 in FIG. 26.

SS44 in FIG. 29 shows a state in which the index number of the updated shift amount data is stored in another address in the memory cell array 110, which is the nonvolatile memory, in S21 in FIG. 27.

FIG. 30 is a diagram showing a command sequence for an update process for data in a designated column address in the data latch group XDL in SS42 in FIG. 28.

A command "c61" is a command for designating a column address desired to be updated in the data latch group XDL and updating data. A column address is designated by two column addresses subsequent to the command "c61". Since data is only written in a plurality of data latches XDL in the designated column address, a row address is neglected. The subsequent data "info" is updated data. The data "info" is outputted and the process ends at timing indicated by a white arrow. As shown in S43 in FIG. 29, the data in the data latch group XDL is copied to the data latch group ADL according to the command "c52".

FIG. 31 is a diagram showing a command sequence for write of the management information MI in the memory cell array 110 in SS44 in FIG. 29.

The command "c51" for designating the SLC mode is a command for designating that the write mode is SLC. Subsequently to the command "c61", a column address and a row address are designated. The command "c61" is a command for updating data corresponding to the designated column address in the data latch group XDL. When the command "c23" is outputted, the sequencer 170 writes the data in the data latch group XDL in the management information storage area MIA designated by the addresses. As a result, as shown in S44 in FIG. 29, updated shift information is stored in the memory cell array 110.

As explained above, the update of the shift amount data is performed.

Operation during the suspend read in the present embodiment is explained.

Figure 32:
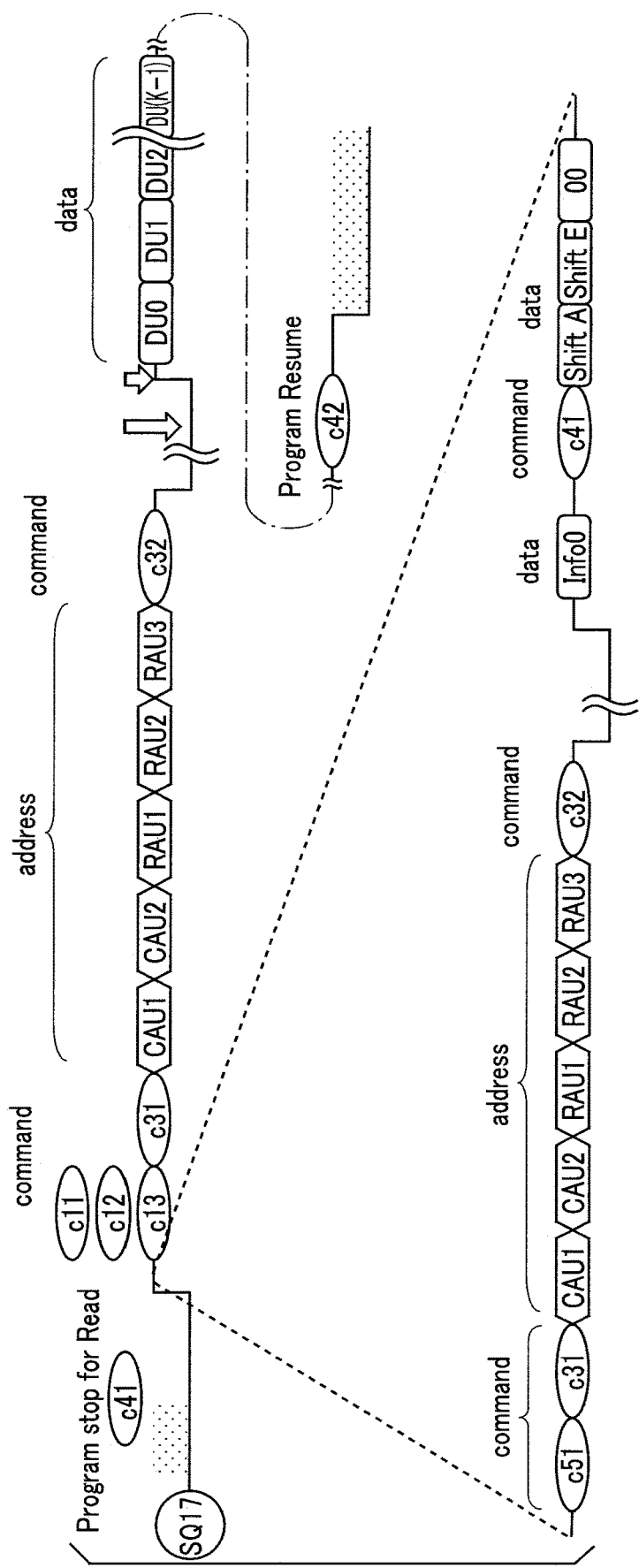
FIG. 32 is a diagram showing a command sequence showing changes in input and output signals of a controller during the suspend read according to the first embodiment.
Figure 33:
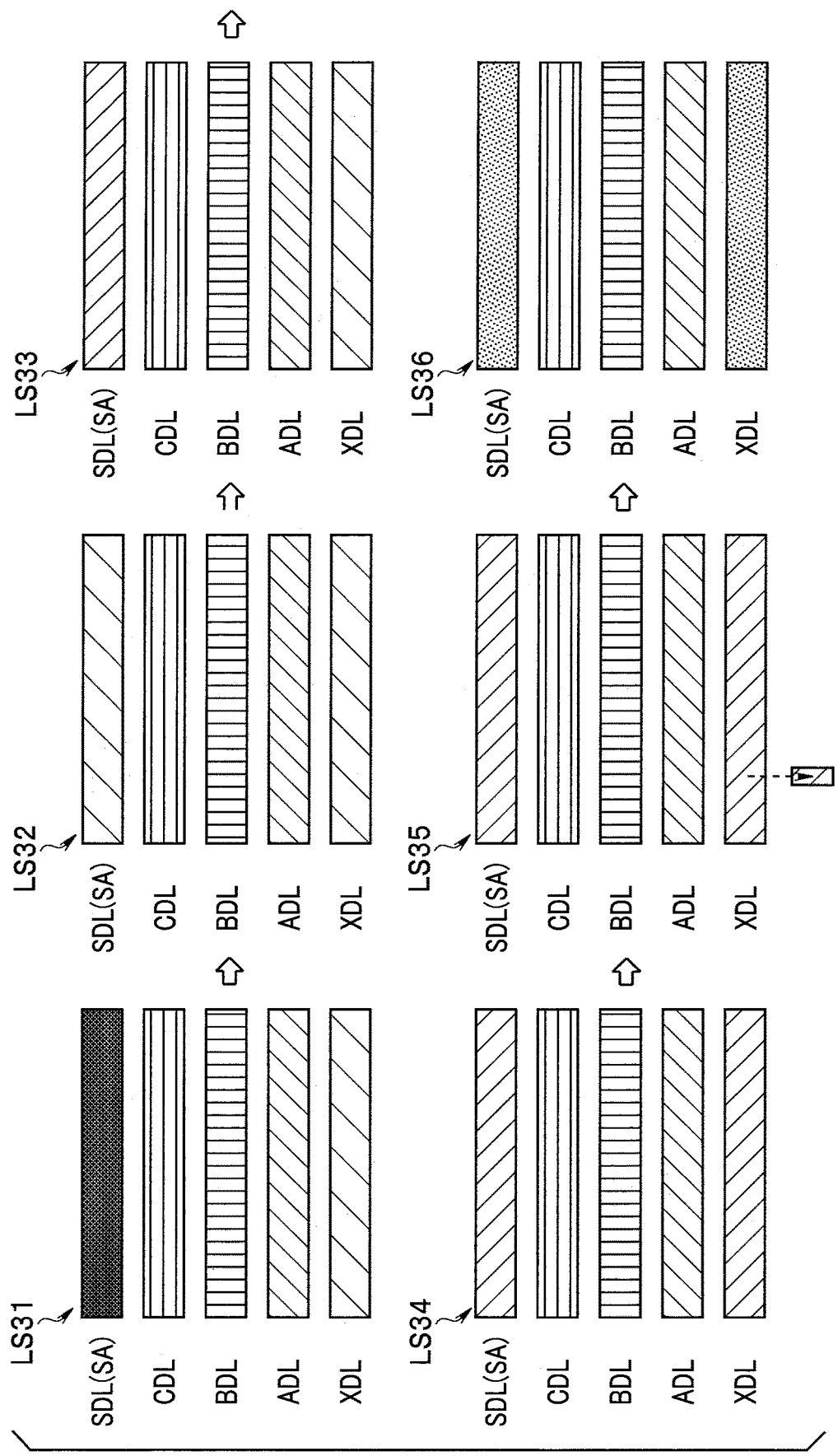
FIG. 33 is a diagram for explaining changes in stored states of data in a plurality of data latch groups involved in the execution of the command sequence according to the first embodiment.

FIG. 32 is a diagram showing a command sequence showing a change in the input/output signals I/O of the controller 200 during the suspend read. FIG. 33 is a diagram for explaining changes in stored states of data in the plurality of data latch groups involved in execution of the command sequence.

As shown in a command sequence SQ17, when the suspend read is performed, the controller 200 outputs a predetermined command "c41" and suspends write of a program, that is, data. In FIG. 33, LS31 indicates that, in the plurality of data latch groups in the program, data for write is stored in the data latch groups ADL, BDL, and CDL and verify voltage data is stored in the data latch group SDL. LS32 shows a state of the plurality of data latch groups in the program at the time when the write is suspended. In LS32, valid data is not stored in the data latch groups SDL and XDL. In other words, since the write of the program, that is, the data is performed to that point, the management information MI is not stored in all the data latch groups. Accordingly, when the suspend read is performed, it is necessary to acquire the management information MI for data read. In FIG. 32, timing of a long white arrow indicates that the ready/busy signal RBn is low and timing of a short arrow indicates that the ready/busy signal RBn is high.

Accordingly, subsequently, the controller 200 outputs the commands "c51" and "c31" for executing read of the management information MI in the SLC mode. Subsequently to the commands, the controller 200 outputs five addresses and the command "c32" subsequent to the addresses to the input/output signals I/O. According to the command "c32", the management information MI is stored in the data latch group SDL and, thereafter, stored in the data latch group XDL.

LS33 in FIG. 33 shows a state in which the management information MI read in the SLC mode is stored in the data latch group SDL. LS34 shows a state in which the management information MI is stored in the data latch group XDL.

Further, according to the command "c32", read of data in a designated column address in the data latch group XDL is executed. The sequencer 170 executes the read of the data in the designated column address and outputs the read data "info0".

The processor 230 performs the read of the data using the acquired data "info0". LS35 in FIG. 33 shows a state in which an index number of shift amount data in the designated column address in the management information MI is read from the data latch group XDL corresponding to the index number.

The processor 230 outputs the shift amount setting command "c41" for setting a shift amount to the input/output signals I/O and, subsequently to the shift amount setting command "c41", outputs shift amount data selected based on the index number to the input/output signals I/O.

Thereafter, the processor 230 outputs the commands "c11" and "c12" or "c13" and "c31" for performing read reservation of any one of the lower, middle, and upper bits to the input/output signals I/O and, thereafter, outputs addresses and the command "c32". As a result, the processor 230 can perform data read. LS36 in FIG. 33 shows a state in which the processor 230 is executing the data read.

In the last of the suspend read, the processor 230 outputs a program resume command "c42".

Accordingly, during the suspend read as well, it is possible to read the shift information, which is the management information MI, from the management information storage area MIA of the memory cell array 110 and executes the shift read.

Note that, during the suspend read, when the shift information is changed by the re-read, the changed shift information (index number) is written in the management information storage area MIA.

As explained above, a part of the management information MI is stored in the data latch group ADL not used during the read. Therefore, even if the management information MI increases when a capacity of the RAM of the controller 200 is limited, it is possible to use the management information at high speed.

As explained above, when a storage capacity of the memory cell transistor MT increases, for example, when the number of bits that can be stored in one memory cell transistor MT increases from three bits to four bits, the shift amount data also increases and sometimes cannot be stored in the RAM 220 of the controller 200.

Depending on the NAND flash memory 100, after data is once written, data read is mostly performed. During the data read or before the data read, the data latch groups ADL, BDL, and the like used for data write are not used.

In such a case, according to the embodiment explained above, even if the data amount of the history data HD of the shift information, which is the management information MI, increases, by storing the history data HD in the data latch group ADL, the RAM 220 of the controller 200 may not be used.

Note that, in the embodiment explained above, the history data HD of the shift amount data, which is the management information, is stored in the data latch group ADL. However, the history data HD may be stored in another data latch, for example, the data latch group BDL or CDL.

Furthermore, in the embodiment explained above, the shift information used during the shift read is an example of the management information MI stored in the data latch group ADL and the like. However, the management information MI other than the shift information may be stored in the data latch group ADL and the like.

As explained above, according to the embodiment explained above, it is possible to provide a memory system and a memory controller that can read the management information with small latency even in a memory controller that does not have a sufficient RAM area for storing the management information.

Since a part of the management information is stored in the data latch group not used during the data read, the memory controller 200 can read the management information MI with small latency as long as the read request from the host apparatus 300 continues.

Second Embodiment

In the first embodiment, the management information MI such as the shift information can be stored in one data latch group ADL, that is, in a data latch group for one page of the NAND flash memory 100. In a second embodiment, when necessary management information MI exceeds the data latch group for one page, the management information MI is stored in two or more data latch groups using the data latch group BDL and the like other than the data latch group ADL.

A configuration of a memory system in the second embodiment is the same as the configuration of the memory system in the first embodiment. Therefore, in the memory system in the second embodiment, the same components as the components of the memory system in the first embodiment are denoted by the same reference numerals and signs and explanation of the components is omitted. Only components different from the components of the memory system in the first embodiment are explained.

Figure 34:
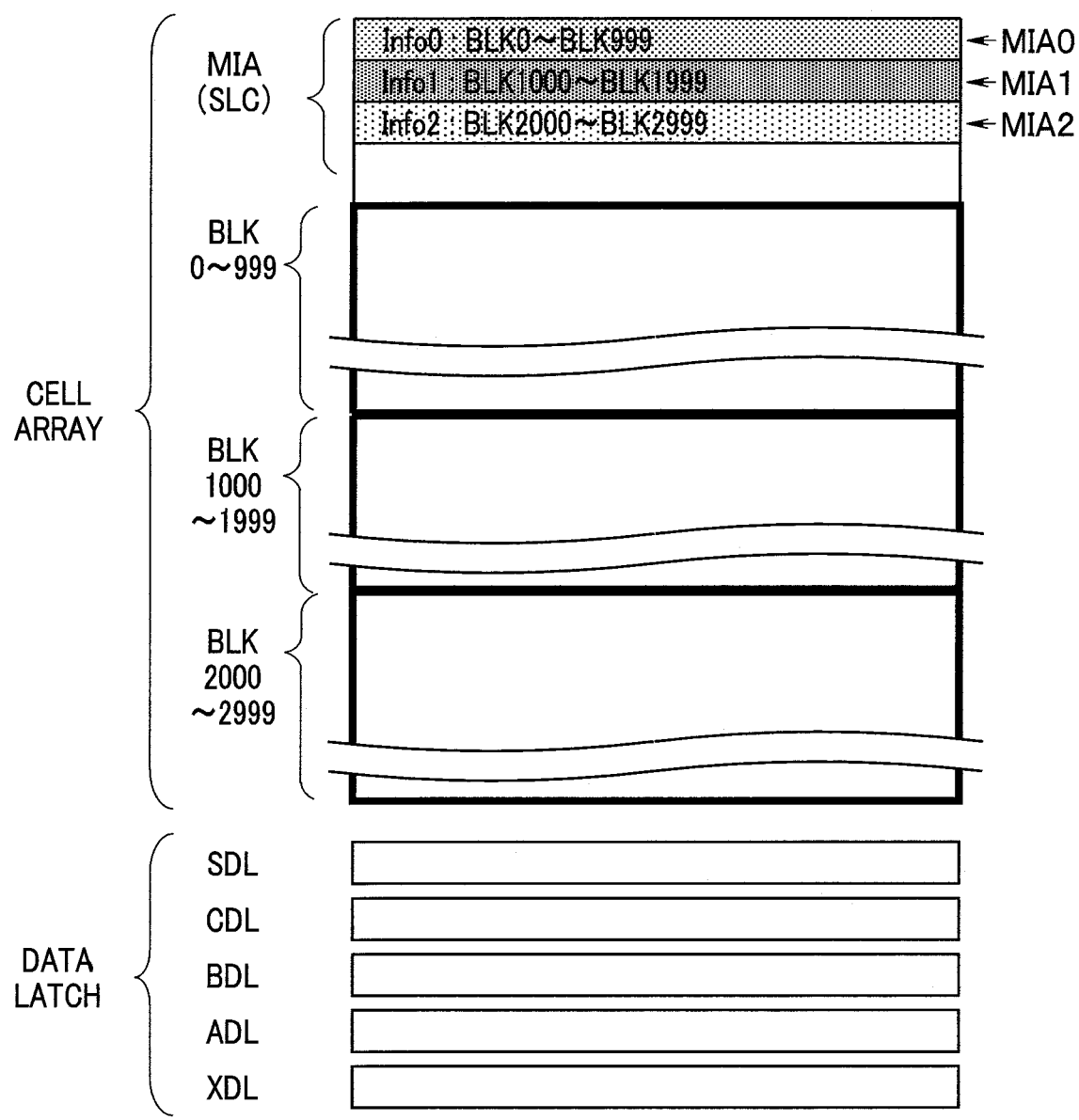
FIG. 34 is a diagram showing stored states of data in a management information storage area MIA and a plurality of data latch groups during power off or the like according to a second embodiment.

FIG. 34 is a diagram showing data stored states in the management information storage area MIA and a plurality of data latch groups during power-off or the like according to the present embodiment.

FIG. 34 shows data stored states in the management information storage area MIA and the plurality of data latch groups after write (program) of data or after erasing of data during the power-off. In each of the data latch groups ADL, BDL, and CDL, management information of a physical block corresponding thereto is stored.

More specifically, the memory cell array 110 includes three thousand blocks BLK. Shift information of data, which is the management information MI, in blocks 0 to 999, is stored in a first storage area MIA0 of the management information storage area MIA. Shift information of data in blocks 1000 to 1999 is stored in a second storage area MIA1 of the management information storage area MIA. Shift information of data in blocks 2000 to 2999 is stored in a third storage area MIA2 of the management information storage area MIA.

In the present embodiment, each of the sense units SAU includes the data latches ADL, BDL, CDL, and XDL.

Figure 35:
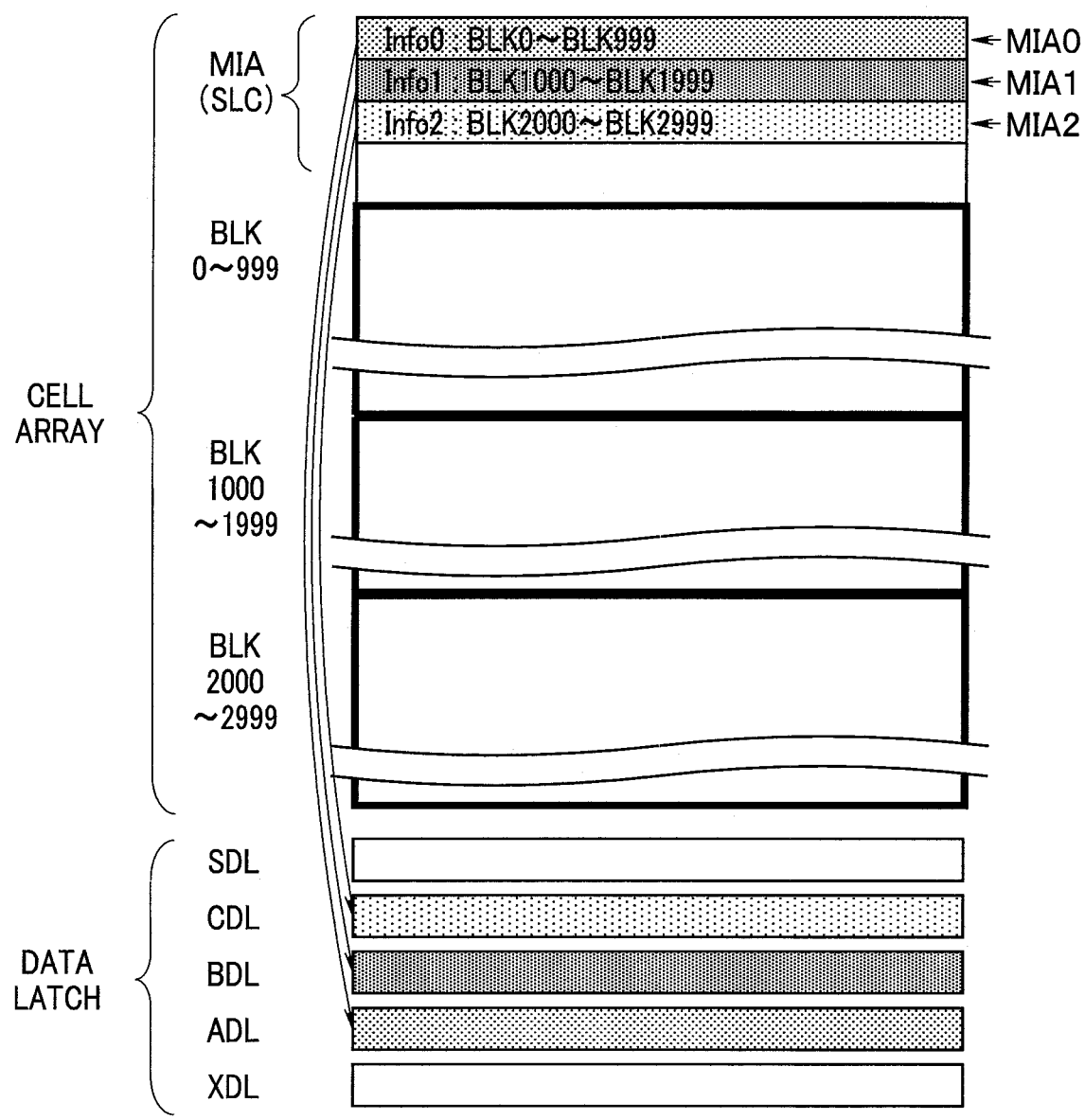
FIG. 35 is a diagram showing stored states of management information in a memory cell array and the plurality of data latch groups in a steady state according to the second embodiment.

FIG. 35 shows stored states of the management information MI in the memory cell array 110 and the plurality of data latch groups in a steady state according to the present embodiment.

After write (program) of data or after erasing of data during the power-on, the controller 200 outputs the various commands explained in the first embodiment to the NAND flash memory 100 to thereby change the plurality of data latch groups to the steady state in which a part of the management information MI is stored.

In the steady state, the management information MI stored in the first storage area MIA0 is copied to the data latch group ADL, the management information MI stored in the second storage area MIA1 is copied to the data latch group BDL, and the management information MI stored in the third storage area MIA2 is copied to the data latch group CDL.

By changing to the steady state, the plurality of data latch groups can cope with data read.

When a target address of the read data is found, the management information MI is copied from a data latch group storing a copy of the management information MI of the block BLK relating to the target address to the data latch group XDL.

For example, when receiving a read request for data in the blocks BLK0 to 999, the controller 200 can store data in the storage area of the data latch group ADL in the data latch group XDL and perform data read using shift information about the block BLK designated by the target address in the data latch group XDL.

A process for changing the plurality of data latch groups to the steady state is briefly explained.

Figure 36:
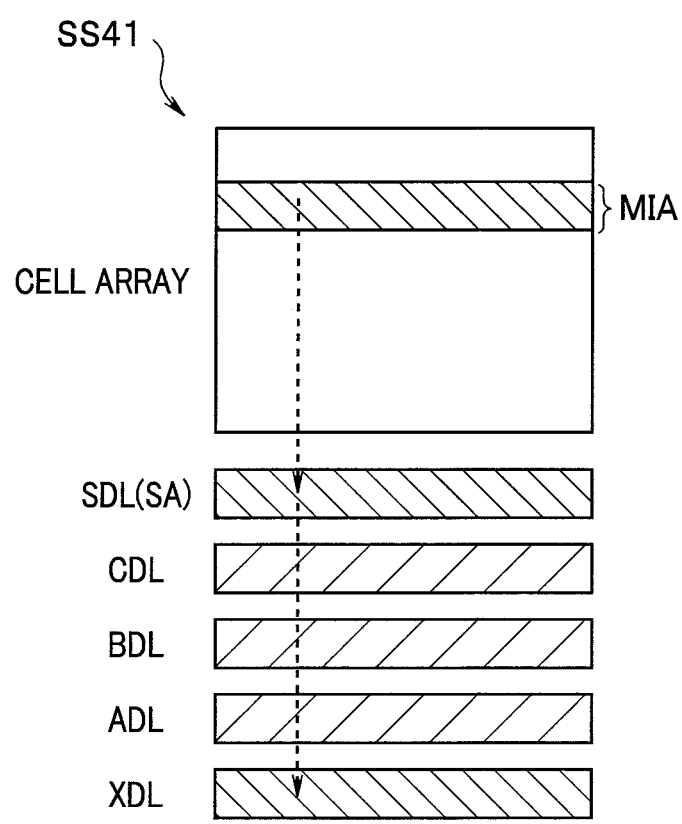
FIG. 36 is a diagram for explaining transfer of data in a case in which management information is read and stored in a data latch group according to the second embodiment.

FIG. 36 is a diagram for explaining transfer of data in the case in which the management information MI is read and stored in the data latch group XDL. As shown in SS41, the management information MI in the management information storage area MIA is read in the SLC mode and stored in the data latch group XDL through the data latch group SDL.

Figure 37:
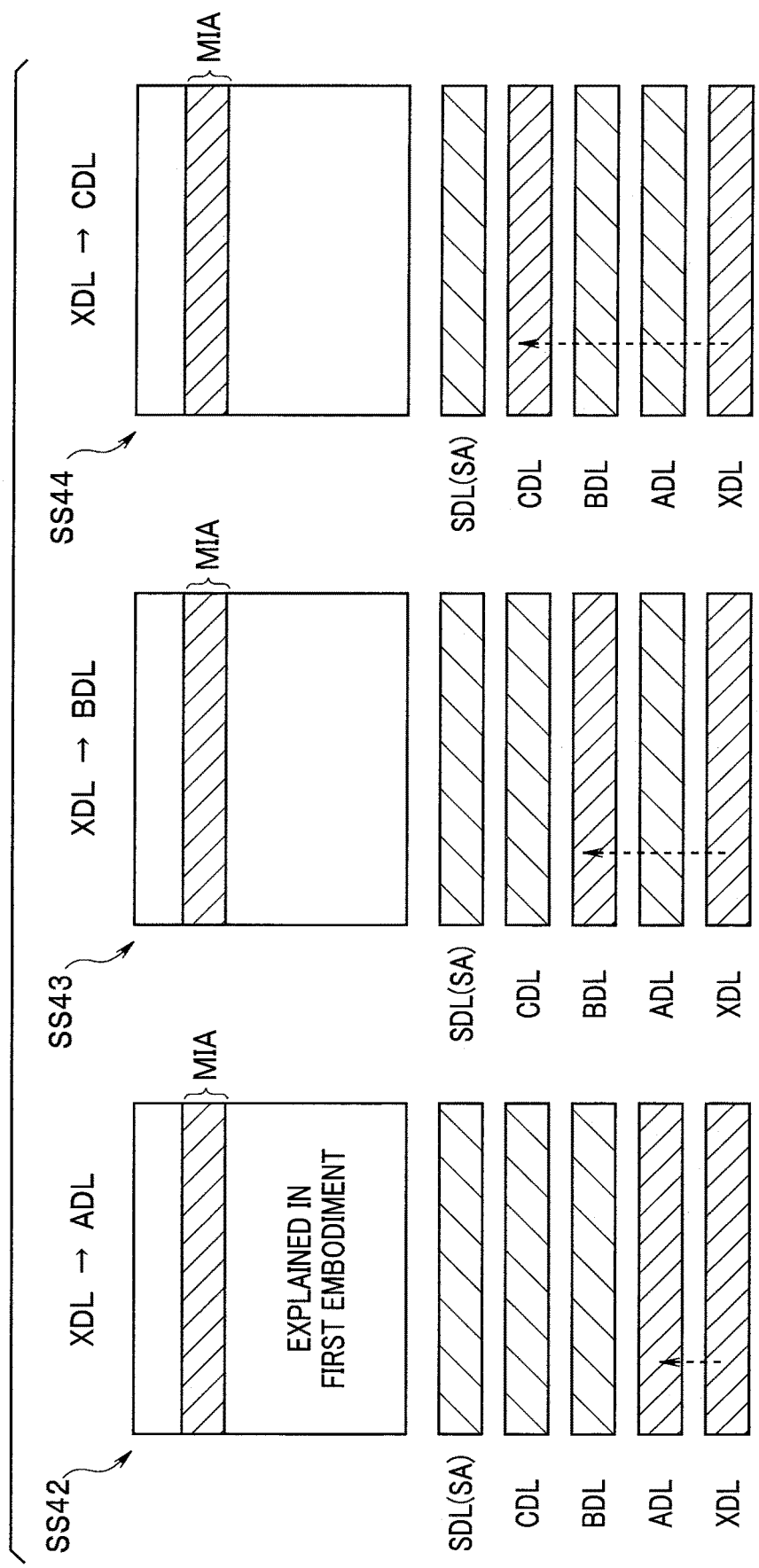
FIG. 37 is a diagram showing a method of copying management information read in an SLC mode from the data latch group XDL to any one of data latch groups ADL to CDL and converting the plurality of data latch groups to a steady state according to the second embodiment.

FIG. 37 is a diagram showing a method of copying the management information MI read in the SLC mode from the data latch group XDL to any one of the data latch groups ADL to CDL and converting the plurality of data latch groups into the steady state. SS42 shows a case in which the management information MI read in the SLC mode is copied from the data latch group XDL to the data latch group ADL. In other words, the management information MI changes from the state in SS41 to the state in SS42. S43 shows a case in which the management information MI read in the SLC mode is copied from the data latch group XDL to the data latch group BDL. In other words, the management information MI changes from the state in SS41 to the state in SS43.

S44 shows a case in which the management information MI read in the SLC mode is copied from the data latch group XDL to the data latch group CDL. In other words, the management information MI changes from the state in SS41 to the state in SS44.

Figure 38:
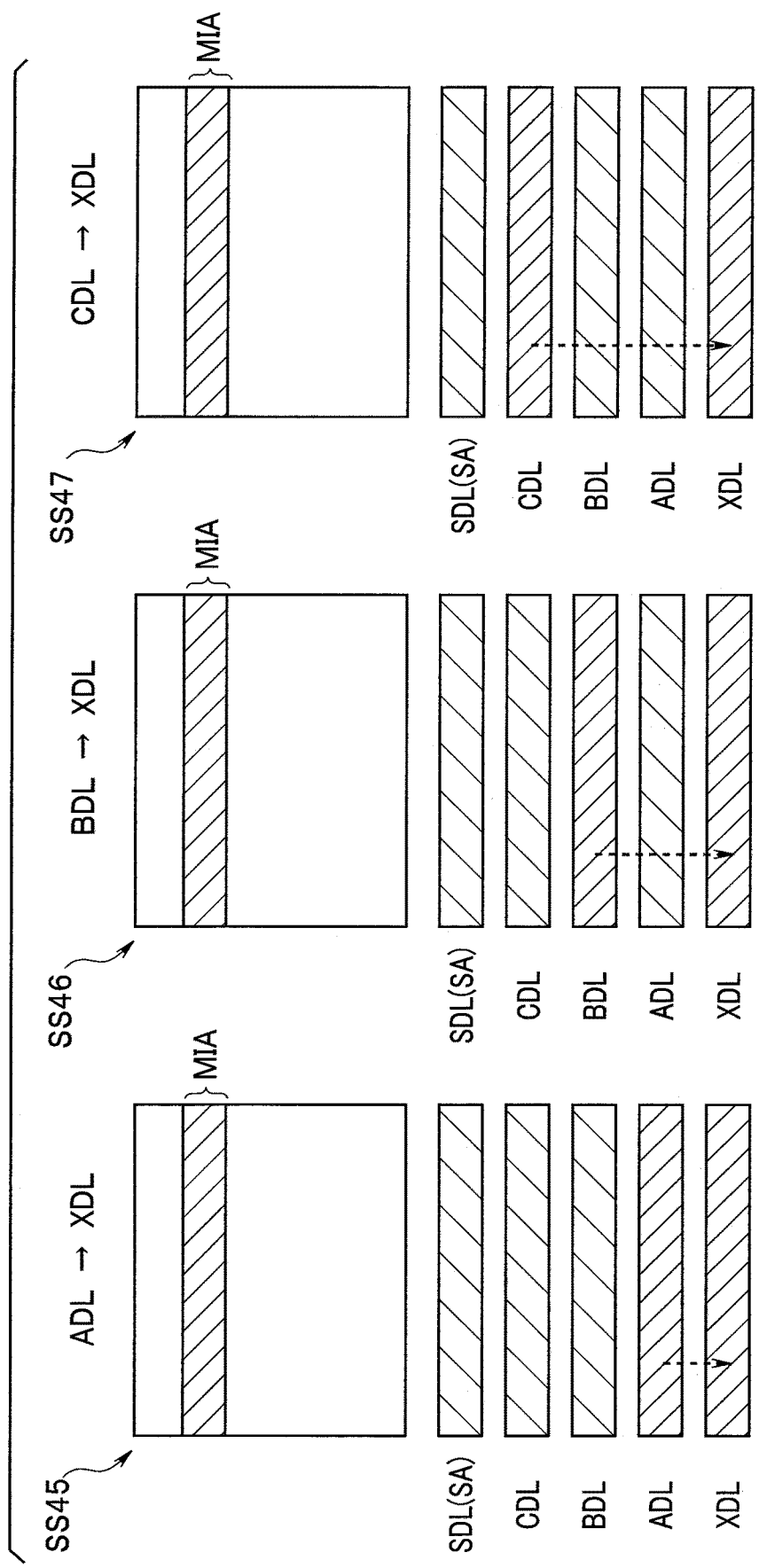
FIG. 38 is a diagram showing another method of transferring management information stored in the data latch groups ADL, BDL, and CDL to the data latch XDL and converting the plurality of data latch groups into the steady state according to the second embodiment.

FIG. 38 is a diagram showing another method of copying the management information MI stored in the data latch groups ADL, BDL, and CDL to the data latch group XDL and converting the plurality of data latch groups into the steady state. SS45 shows a case in which the management information MI is copied from the data latch group ADL to the data latch group XDL. SS46 shows a case in which the management information MI is copied from the data latch group BDL to the data latch group XDL. SS47 shows a case in which the management information MI is copied from the data latch group CDL to the data latch group XDL.

In FIG. 37, the management information MI is stored in the data latch group XDL and then copied to any one of the data latch groups ADL, BDL, and CDL. However, the management information MI may be directly copied to any one of the data latch groups ADL, BDL, and CDL through the data latch group SDL.

Figure 39:
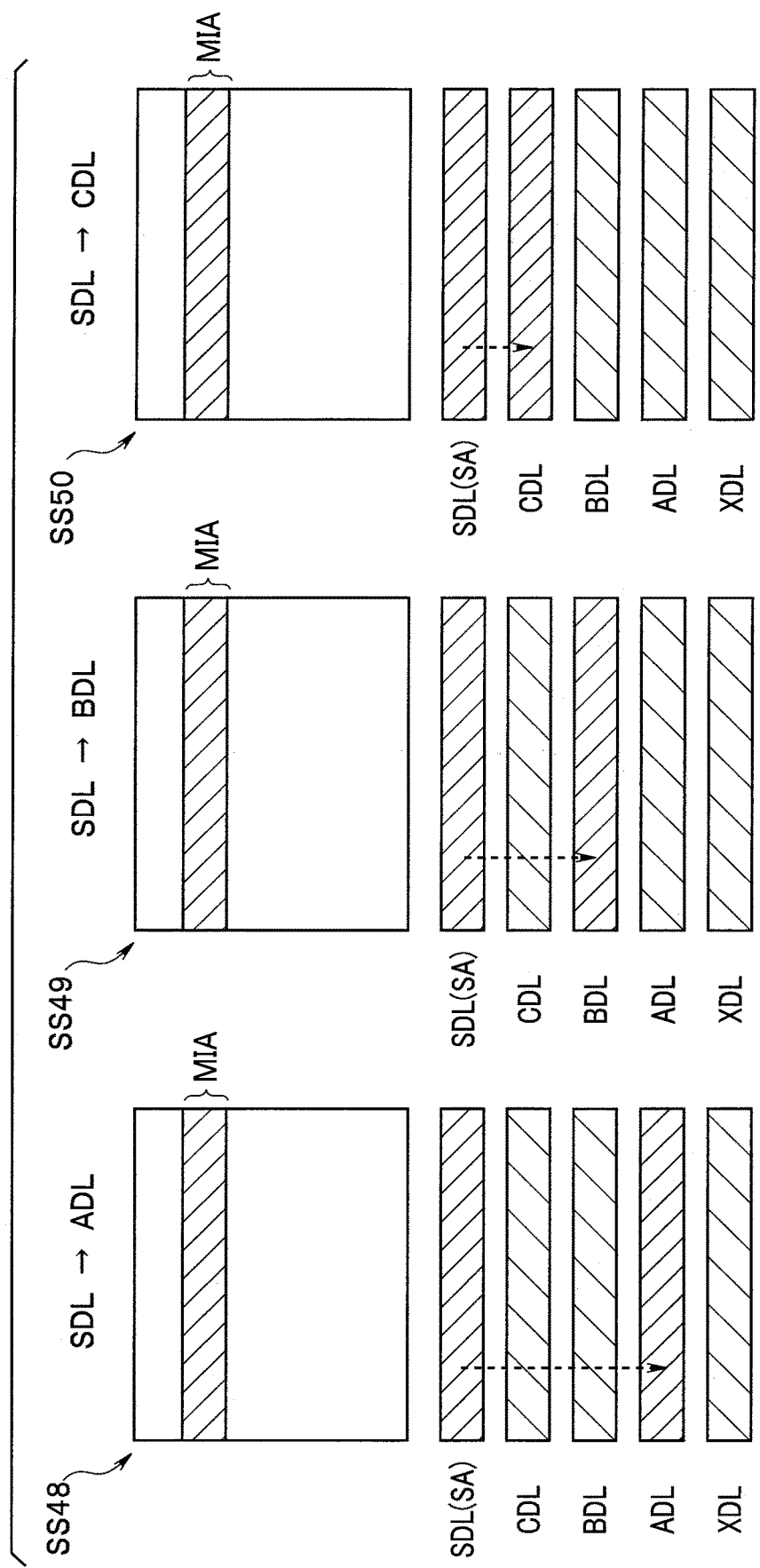
FIG. 39 is a diagram showing a case in which management information is transferred to any one of the data latch groups ADL, BDL, and CDL through a data latch group SDL according to the second embodiment.

FIG. 39 is a diagram showing a case in which the management information MI is transferred to any one of the data latch groups ADL, BDL, and CDL through the data latch group SDL. SS48 shows a case in which the management information MI is directly copied from the data latch group SDL to the data latch group ADL. SS49 shows a case in which the management information MI is directly copied from the data latch group SDL to the data latch group BDL. SS50 shows a case in which the management information MI is directly copied from the data latch group SDL to the data latch group CDL.

Note that the management information MI may be copied from any one of the data latch groups ADL, BDL, and CDL shown in FIG. 39 to the data latch group XDL and stored in the data latch group XDL as shown in FIG. 38.

Figure 40:
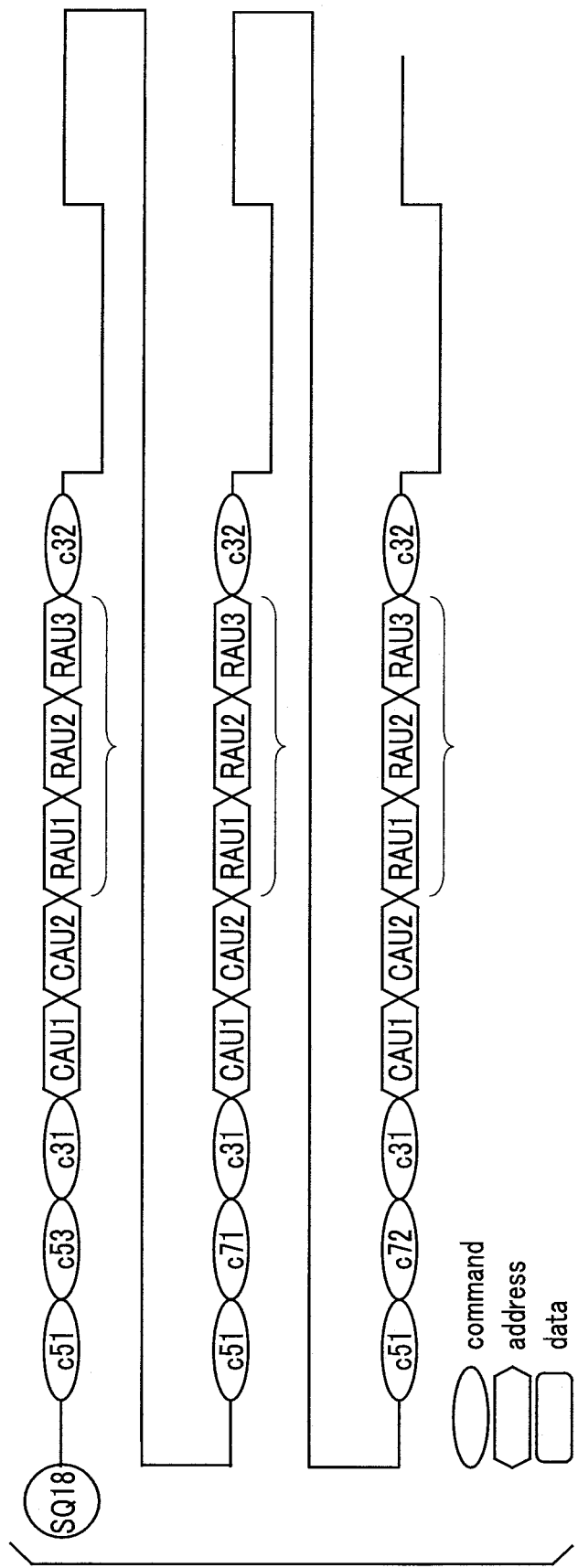
FIG. 40 is a diagram showing a command sequence for converting the plurality of data latch groups into the steady state according to the second embodiment.
Figure 41:
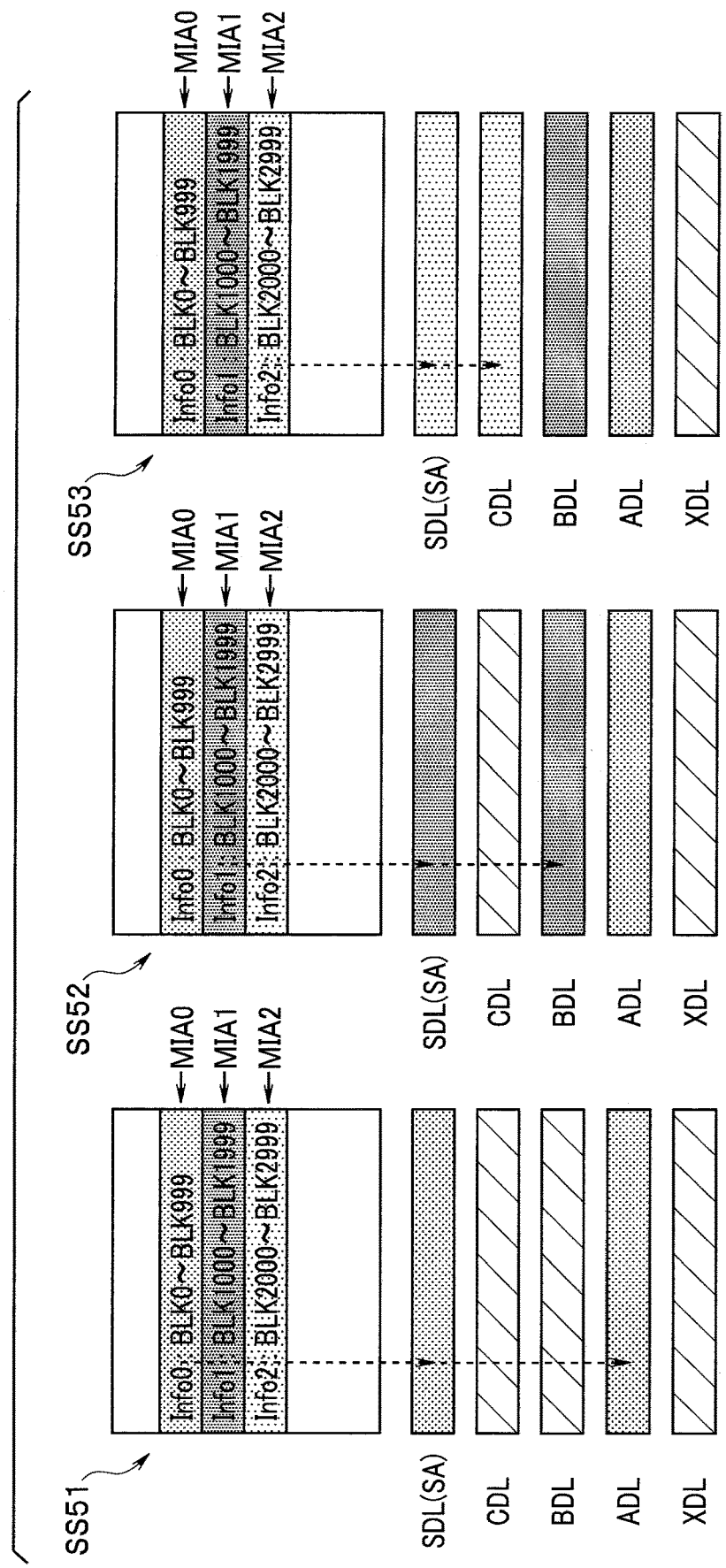
FIG. 41 is a diagram for explaining changes in store states of management information until the management information is stored in the plurality of data latch groups according to the second embodiment.

FIG. 40 is a diagram showing a command sequence SQ18 for converting the plurality of data latch groups into the steady state according to the present embodiment. FIG. 41 is a diagram for explaining changes in stored states of the management information MI until the management information MI is stored in the plurality of data latch groups.

As shown in FIG. 40, the processor 230 outputs the command "c51" for executing read of the management information MI from the management information storage area MIA in the SLC mode. Subsequently to the command "c51", the processor 230 outputs the command "c53" and the command "c31" to the input/output signals I/O. Subsequently to the command "c31", the controller 200 outputs five addresses to the input/output signals I/O. Three row addresses among the five addresses indicate addresses of the data "info0". Subsequently to the five addresses, the controller 200 outputs the command "c32" to the input/output signals I/O. Consequently, as shown in SS51 in FIG. 41, the management information MI in the first storage area MIA0 is transferred to the data latch group ADL.

Thereafter, in order to transfer the management information MI in the second storage area MIA1 to the data latch group BDL, the processor 230 outputs the command "c51" for executing read of the management information MI from the management information storage area MIA in the SLC mode to the input/output signals I/O and, subsequently to the command "c51", outputs a command "c71" and the command "c31" to the input/output signals I/O. The command "c71" is a command for designating the data latch group BDL, not the data latch group XDL as a transfer destination of the management information MI. The command "c51" is outputted before the command "c71", whereby the transfer destination of the management information MI is set to the data latch group BDL. Subsequently to the command "c31", the controller 200 outputs five addresses to the input/output signals I/O. Three row addresses among the five addresses indicate addresses of data "info1". Subsequently to the five addresses, the controller 200 outputs the command "c32" to the input/output signals I/O. Consequently, as shown in SS52 in FIG. 41, the management information MI in the second storage area MIA1 is transferred to the data latch group BDL.

Thereafter, a command and data for transferring the management information MI in the third storage area MIA2 to the data latch group CDL are outputted to the input/output signals I/O. The processor 230 outputs the command "c51" for executing read of the management information MI from the management information storage area MIA in the SLC mode to the input/output signals I/O and, subsequently to the command "c51", outputs a command "c72" and the command "c31" to the input/output signals I/O. The command "c72" is a command for setting a transfer destination of the management information MI to the data latch group CDL, not the data latch group XDL. The command "c51" is outputted before the command "c72", whereby the transfer destination of the management information MI is set to the data latch group CDL. Subsequently to the command "c31", the controller 200 outputs five addresses to the input/output signals I/O. Three row addresses among the five addresses indicate addresses of the data "info1". Subsequently to the five addresses, the controller 200 outputs the command "c32" to the input/output signals I/O. Consequently, as shown in SS53 in FIG. 41, the management information MI in the third storage area MIA2 is transferred to the data latch group CDL.

Figure 42:
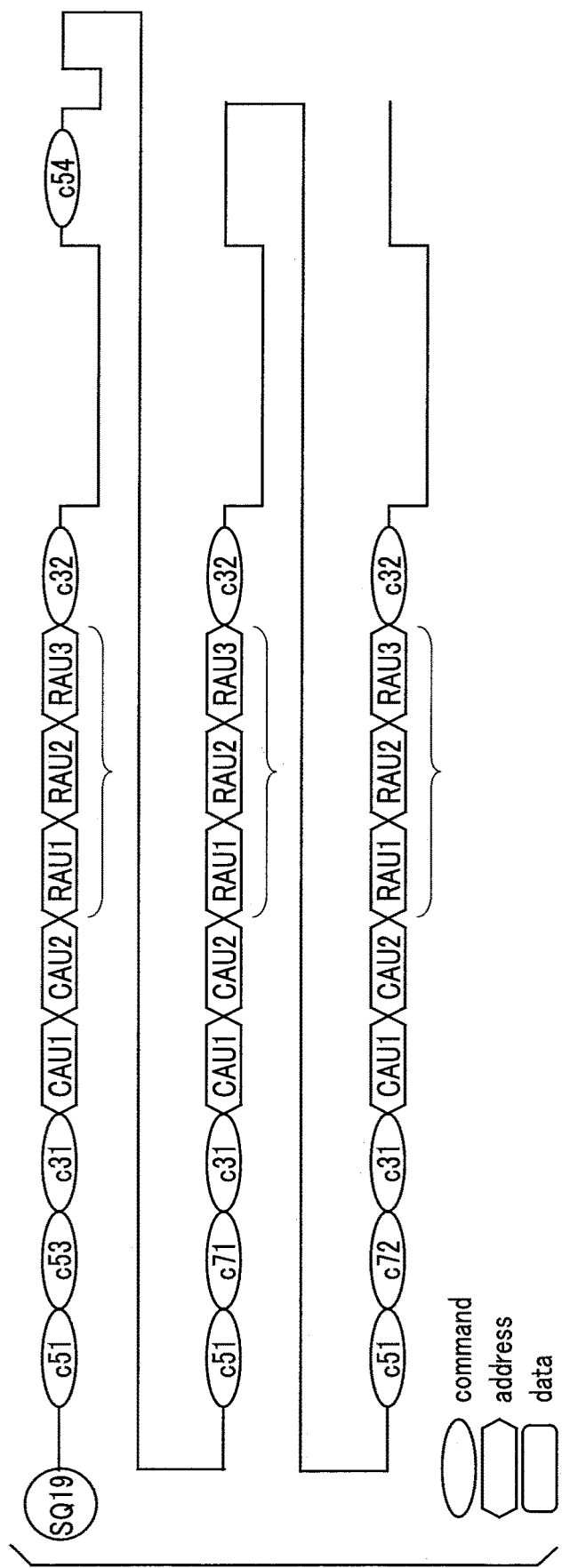
FIG. 42 is a diagram showing another command sequence for converting the plurality of data latch groups into the steady state according to the second embodiment.
Figure 43:
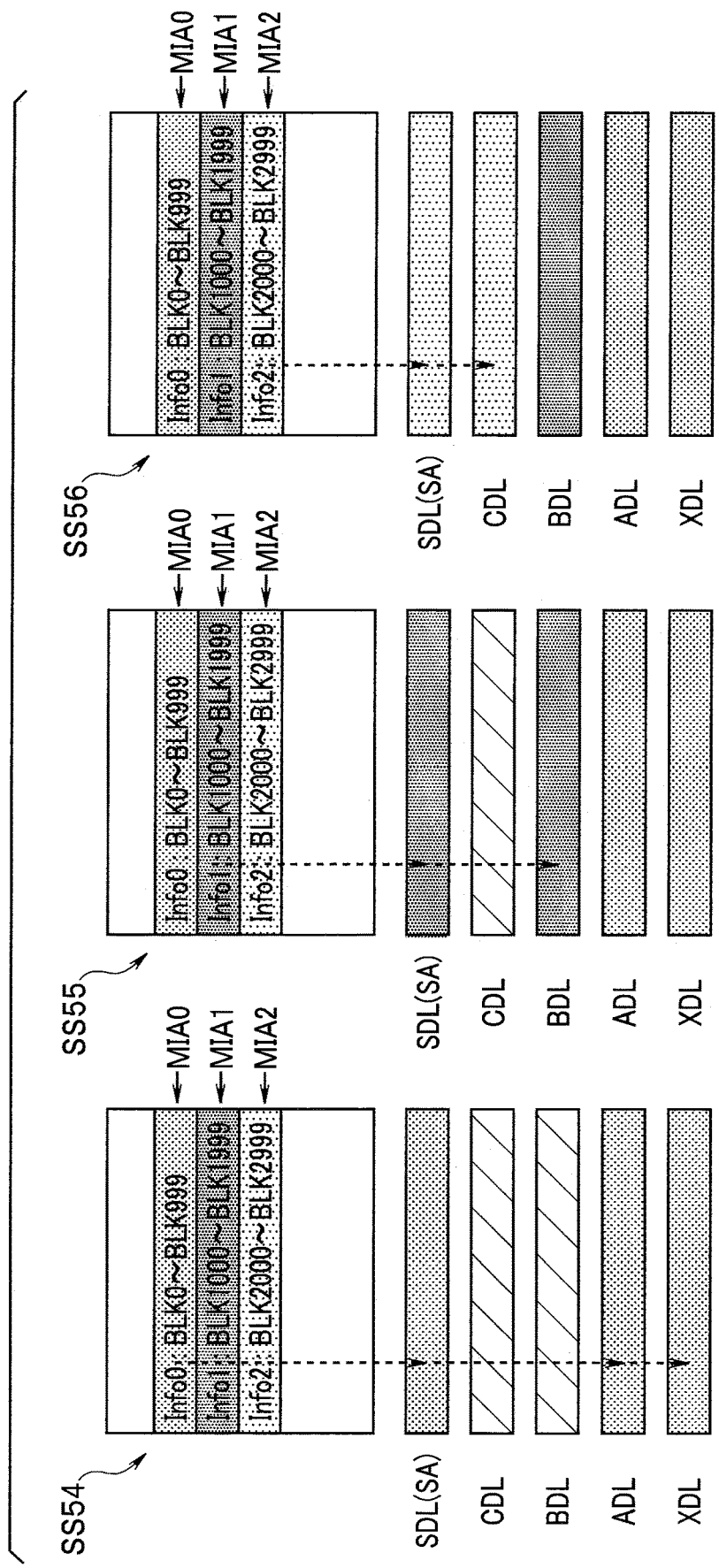
FIG. 43 is a diagram for explaining changes in stored states of management information until the management information is stored in the plurality of data latch groups according to the second embodiment.

FIG. 42 is a diagram showing another command sequence SQ19 for converting the plurality of data latch groups into the steady state according to the present embodiment. FIG. 43 is a diagram for explaining changes in stored states of the management information MI until the management information MI is stored in the plurality of data latch groups.

As shown in FIG. 42, the processor 230 outputs the command "c51" for executing read of the management information MI from the management information storage area MIA in the SLC mode. Subsequently to the command "c51", the processor 230 outputs the command "c53" and the command "c31" to the input/output signals I/O. Subsequently to the command "c31", the controller 200 outputs five addresses to the input/output signals I/O. Three row addresses among the five addresses indicate addresses of the data "info0". Subsequently to the five addresses, the controller 200 outputs the command "c32" to the input/output signals I/O. Consequently, as shown in SS54 in FIG. 43, the management information MI in the first storage area MIA0 is transferred to the data latch group ADL through the data latch group SDL.

Note that, in FIG. 43, the data in the data latch group ADL is copied to the data latch group XDL. Accordingly, after the transfer of the management information MI to the data latch group ADL, the command "c54" for copying the data in the data latch group ADL to the data latch group XDL is outputted to the input/output signals I/O.

Thereafter, in order to transfer the management information MI in the second storage area MIA1 to the data latch group BDL, the processor 230 outputs the command "c51" for executing read of the management information MI from the management information storage area MIA in the SLC mode to the input/output signals I/O and, subsequently to the command "c51", outputs the command "c71" and the command "c31" to the input/output signals I/O. Subsequently to the command "c31", the controller 200 outputs five addresses to the input/output signals I/O. Three row addresses among the five addresses indicate addresses of the data "info1". Subsequently to the five addresses, the controller 200 outputs the command "c32" to the input/output signals I/O. Consequently, as shown in SS55 in FIG. 43, the management information MI in the second storage area MIA1 is transferred to the data latch group BDL.

Thereafter, a command and data for transferring the management information MI in the third storage area MIA2 to the data latch group CDL are outputted to the input/output signals I/O. The processor 230 outputs the command "c51" for executing read of the management information MI from the management information storage area MIA in the SLC mode to the input/output signals I/O and, subsequently to the command "c51", outputs the command "c72" and the command "c31" to the input/output signals I/O. Subsequently to the command "c31", the controller 200 outputs five addresses to the input/output signals I/O. Three row addresses among the five addresses indicate addresses of data "info2". Subsequently to the five addresses, the controller 200 outputs the command "c32" to the input/output signals I/O. Consequently, as shown in SS56 in FIG. 43, the management information MI in the third storage area MIA2 is transferred to the data latch group CDL.

A management information acquisition sequence for data read from the steady state of the plurality of data latch groups is explained. As an example, a selected block BLK belongs to the blocks BLK1000 to BLK1999 and read of the management information MI is performed about the selected block BLK.

Figure 44:
FIG. 44 is a diagram showing a command sequence for reading management information from the steady state according to the second embodiment.
Figure 45:
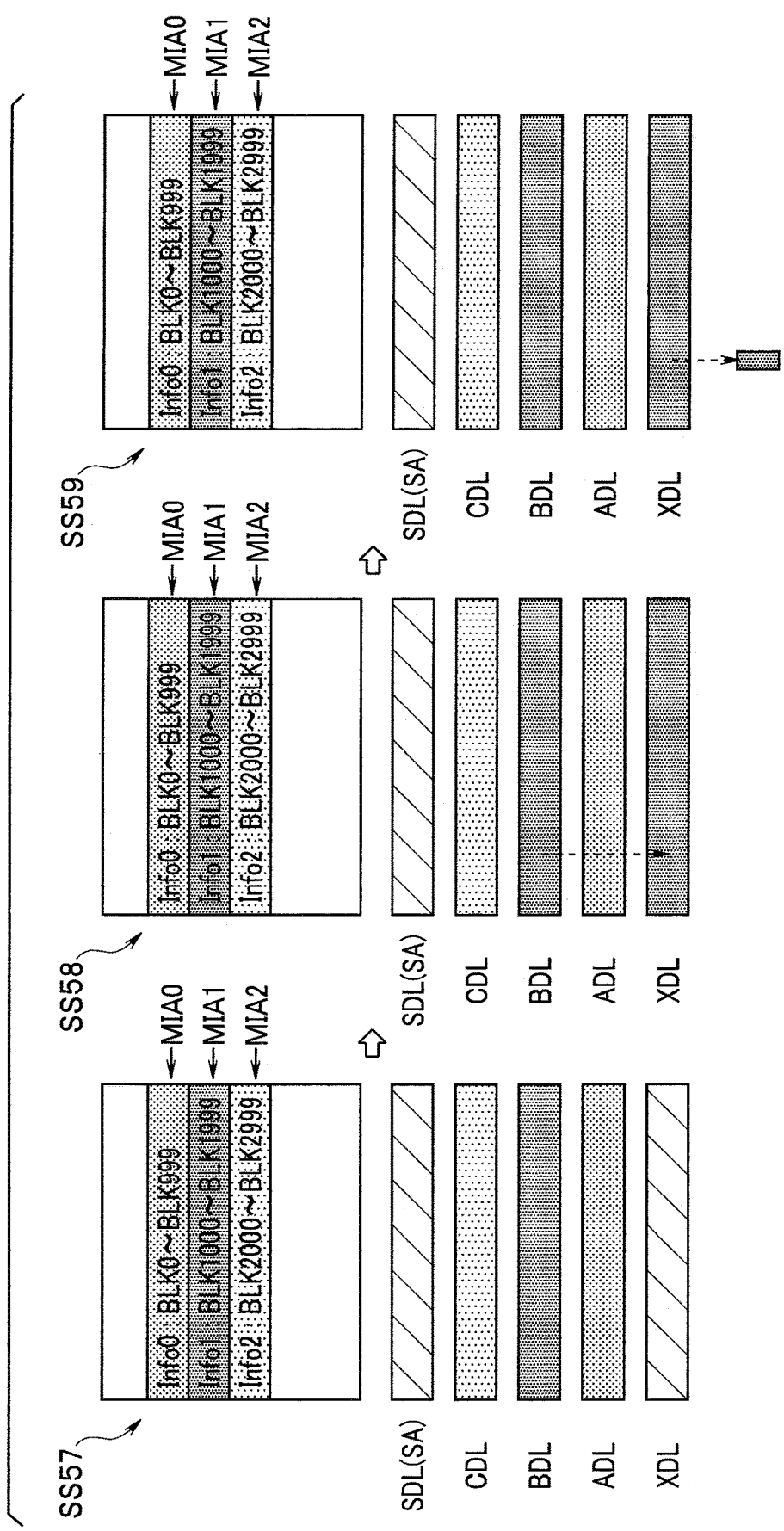
FIG. 45 is a diagram for explaining changes in stored states of data in the memory cell array and five data latch groups in a read process for management information according to the second embodiment.

FIG. 44 is a diagram showing a command sequence for reading the management information MI from the steady state. FIG. 45 is a diagram for explaining changes in stored states of data in the memory cell array and the five data latch groups in a read process for the management information MI.

As shown in FIG. 44, in a command sequence SQ20, first, a command "c73" for copying data in the data latch group BDL to the data latch group XDL is outputted. As shown in SS57 to SS58 in FIG. 45, the data is copied from the data latch group BDL to the data latch group XDL.

Thereafter, the controller 200 outputs the command "c56" and five addresses to the input/output signals I/O and outputs the command "c57" to the input/output signals I/O. The sequencer 170 can execute read of data in the data latch group XDL in a designated column address and output read data "info" as shown in SS59 in FIG. 45.

Thereafter, the controller 200 can perform data read by executing a data read sequence using the read data (shift information).

A process for updating the management information MI and writing the management information MI in the memory cell array 110 is explained.

Figure 46:
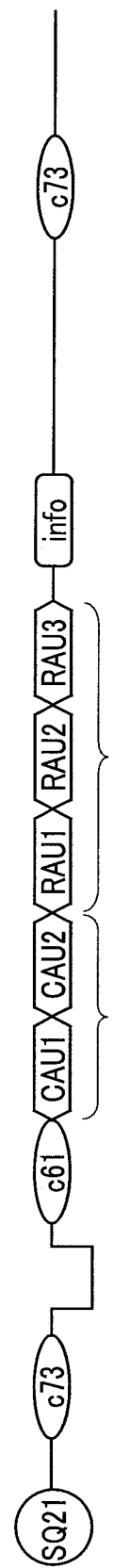
FIG. 46 is a diagram showing a command sequence of an update process for management information MI in the steady state according to the second embodiment.
Figure 47:
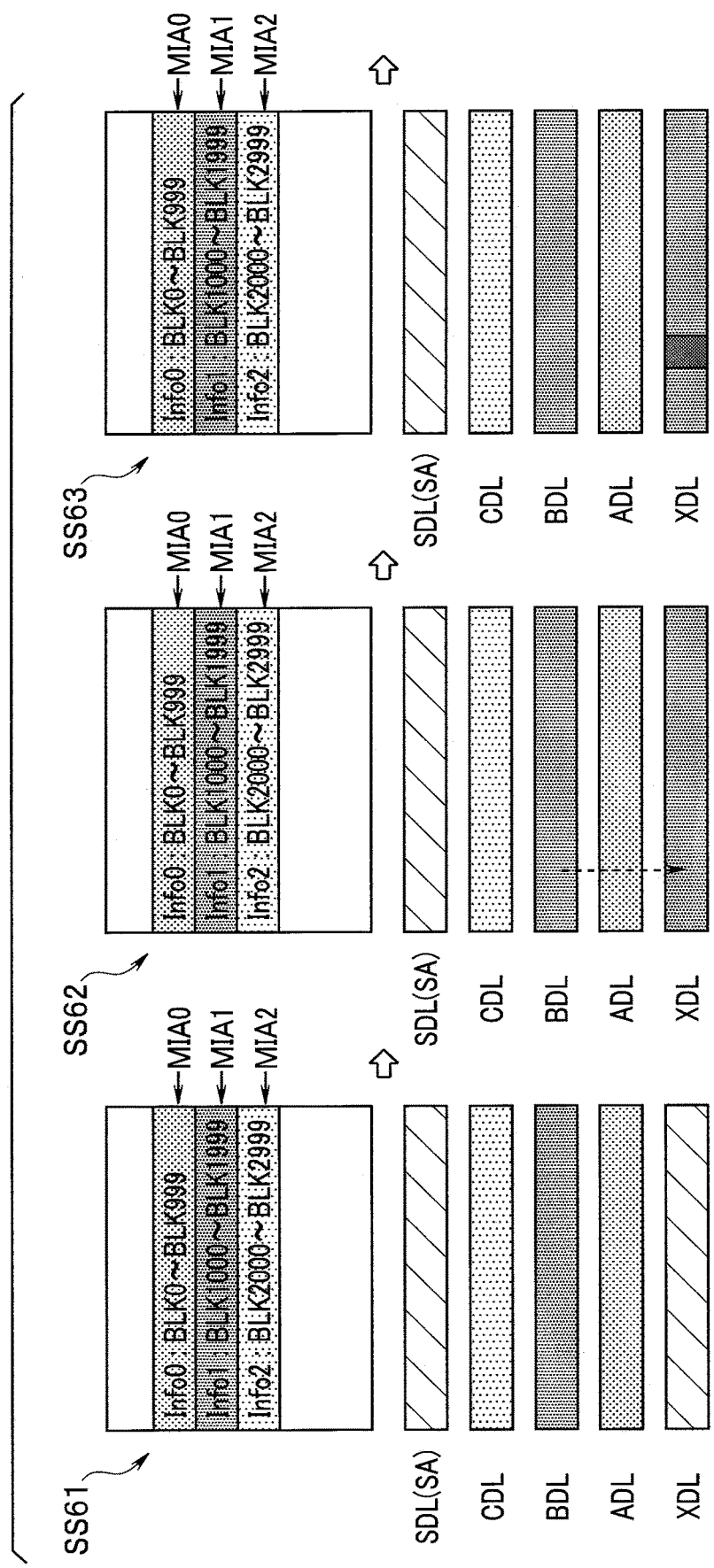
FIG. 47 is a diagram for explaining changes in stored states of data in the memory cell array and the five data latch groups in the update process for the management information according to the second embodiment.

FIG. 46 is a diagram showing a command sequence of an update process for the management information MI in the steady state. FIG. 47 is a diagram for explaining changes in stored states of data in the memory cell array and the five data latch groups in the update process for the management information MI. Update of the management information MI in the data latch group BDL is explained.

In a command sequence SQ21 of the update process, the command "c73" is outputted first. As shown in SS61 to SS62 in FIG. 47, data is copied from the data latch group BDL to the data latch group XDL.

Thereafter, the controller 200 outputs the command "c61" for updating data in a designated column address in the data latch group XDL and five addresses to the input/output signals I/O. Then, as shown in SS63 in FIG. 47, a part of the data in the data latch group XDL is updated.

After the command sequence SQ21 shown in FIG. 46, the controller 200 executes the command shown in FIG. 31, whereby the updated data is stored in the memory cell array 110.

Figure 48:
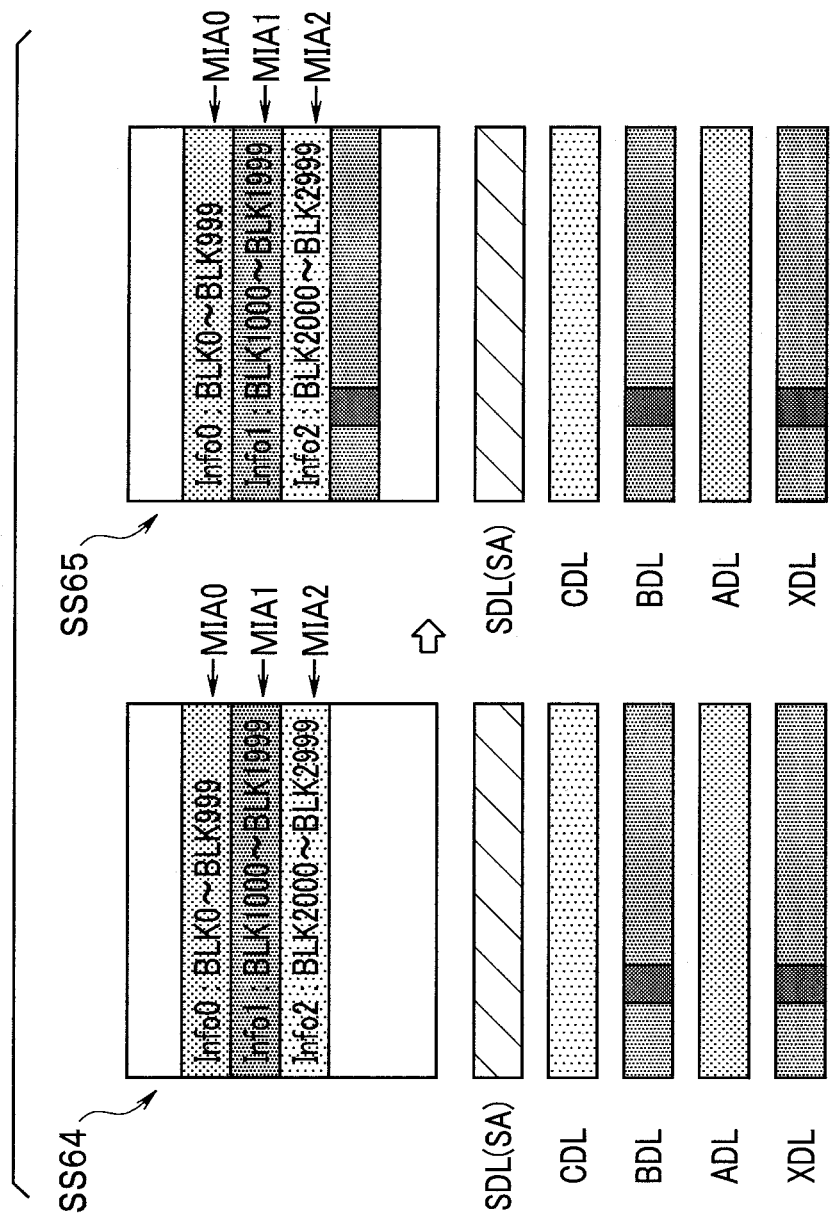
FIG. 48 is a diagram for explaining changes in stored states of data in write of updated data to the memory cell array according to the second embodiment.

FIG. 48 is a diagram for explaining changes in stored states of data in write of the updated data in the memory cell array 110. As shown in FIG. 48, data in the memory cell array and the five data latch groups change from a state in SS64 to a state in SS65.

A data read operation in the case in which the management information MI for three pages is stored in the data latch groups ADL, BDL, and CDL is explained.

When it is found to which block BLK a read request from the host apparatus 300 relates, the controller 200 transfers the management information MI in the block BLK relating to the read request to the data latch group XDL, acquires the management information MI from the data latch group XDL, and then outputs a read command using the acquired management information MI.

Figure 49:
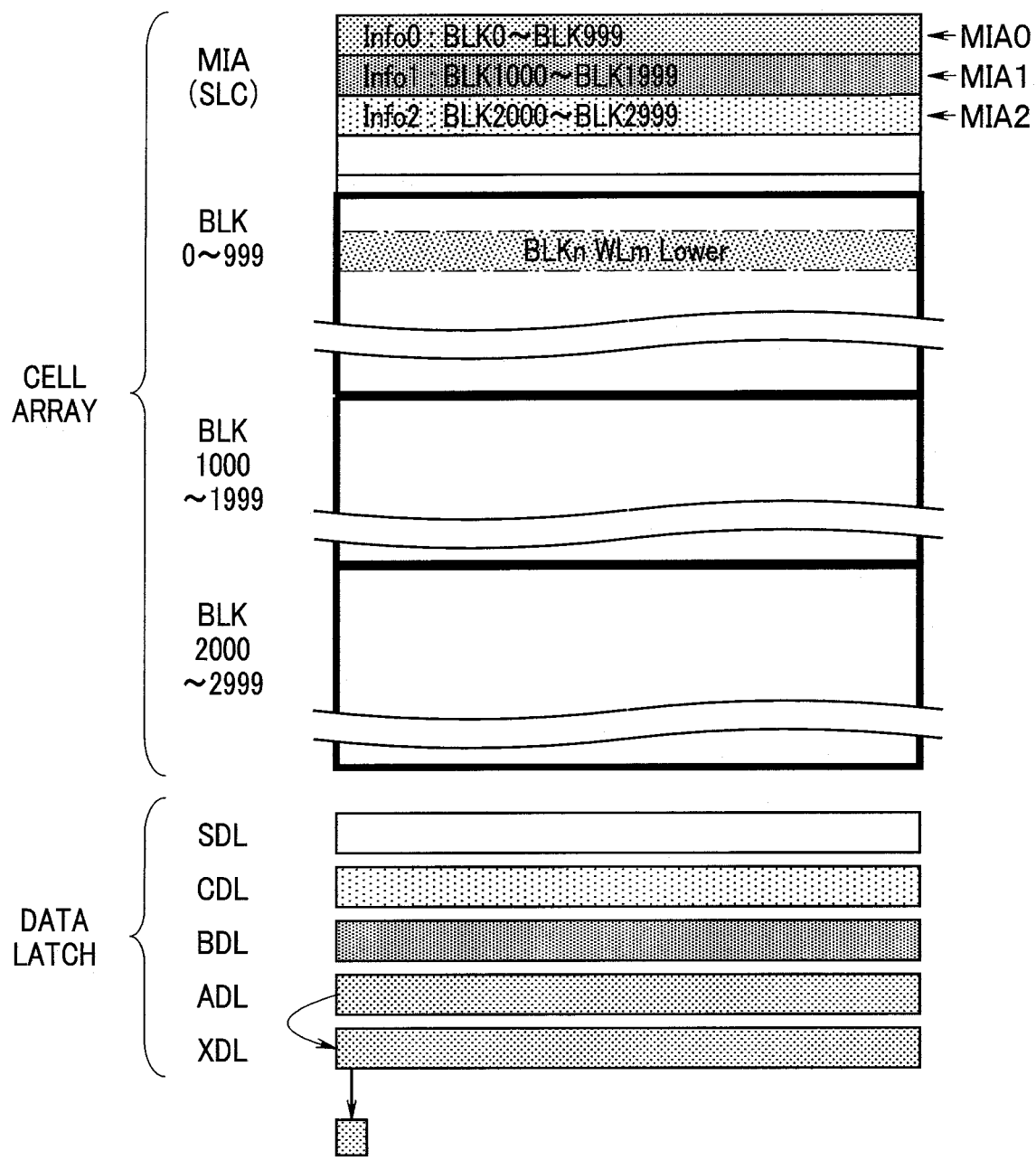
FIG. 49 is a diagram for explaining selection of shift information, which is the management information MI, used when data read is performed according to the second embodiment.
Figure 50:
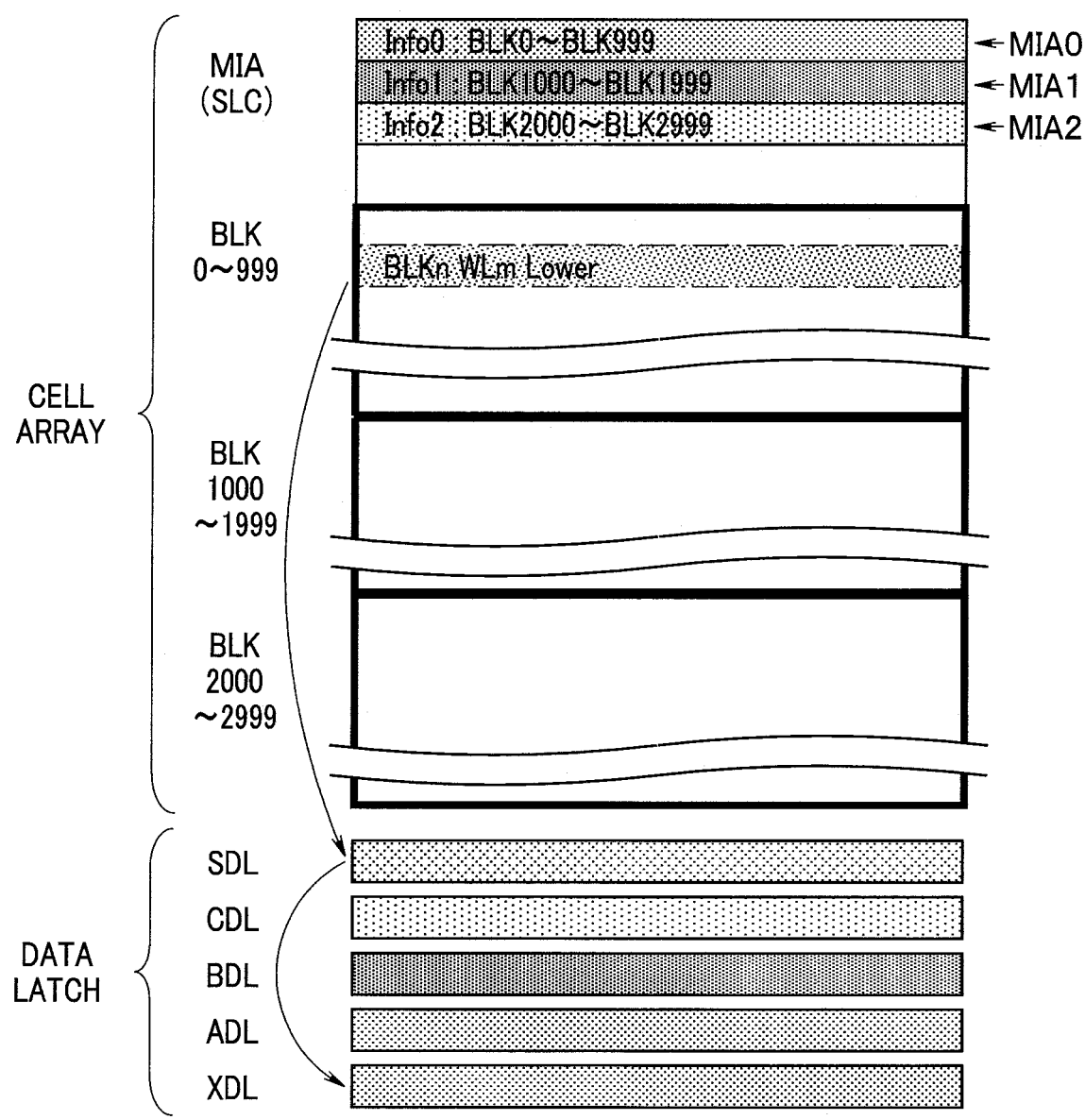
FIG. 50 is a diagram showing a state of six data latch groups at a time when data read is performed according to the second embodiment.

FIG. 49 is a diagram for explaining selection of shift information, which is the management information MI, used when data read is performed. FIG. 50 is a diagram showing states of the five data latch groups at the time when the data read is performed.

In the steady state, since shift amount data of read data is absent in the data latch group XDL, after a read request is received from the host apparatus 300, the management information MI is copied from a data latch group storing the management information MI (for example, shift information) relating to the read data to a storage area of the data latch group XDL.

For example, after it is found that read of data in an m-th word line WLm of a block BLKn among the blocks BLK0 to BLK999 is performed, the controller 200 copies data in the data latch group ADL storing the management information MI corresponding to the block BLKn among the blocks BLK0 to BLK999 to the data latch group XDL and reads shift information corresponding to the word line WLm of the block BLKn in a data area of the data latch group XDL. The controller 200 can perform data read using the read shift information.

As shown in FIG. 50, when the data read is performed, the data latch group XDL is used for storage of read data. User data in the word line WLm of the block BLKn is transferred to the data latch group SDL and, thereafter, copied to the data area of the data latch group XDL. The controller 200 can read data from the data area of the data latch group XDL.

Note that, the transfer of the management information MI to the data latch group XDL is not performed after the read request is received from the host apparatus 300, but the management information MI may be transferred from any one of the data latch groups ADL, BDL, and CDL to the data latch group XDL beforehand.

In that case, data in one of the three data latch groups ADL, BDL, and CDL is copied to the data latch group XDL. Therefore, the shift information of the read data is present in the data latch group XDL at a probability of ⅓.

Figure 51:
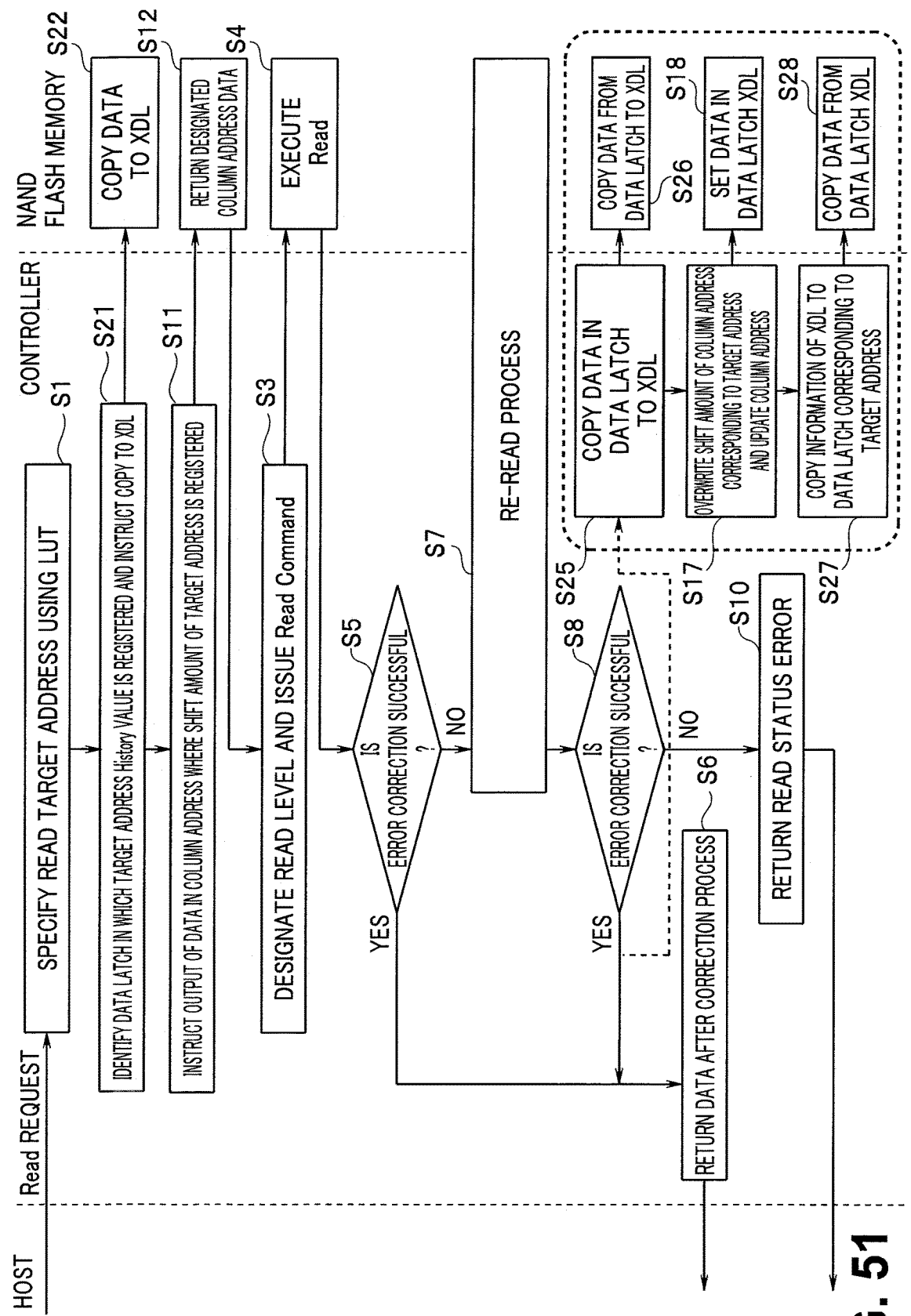
FIG. 51 is a flowchart showing an example of a flow of a data read process of a controller and a NAND flash memory according to the second embodiment.

FIG. 51 is a flowchart showing an example of a flow of a data read process of the controller 200 and the NAND flash memory 100. In FIG. 51, the same processes as the processes in FIGS. 14 and 26 are denoted by the same step numbers as the step numbers in FIGS. 14 and 26 and explanation of the processes is simplified.

The controller 200 specifies a target address relating to a read request from the host apparatus 300 (S1) and, thereafter, outputs a command for identifying a data latch group in which a history value, that is, shift information of the target address is stored and coping data in the identified data latch group to the data latch group XDL (S21).

If a history value relating to a target address relating to a read command is already stored in the data latch group XDL, this process is skipped. However, when a history value relating to a target address relating to a read command is not stored in the data latch group XDL, the process in S21 is executed. As a result of the execution of S21, in the NAND flash memory 100, data is copied from the plurality of data latch groups, in which the history value, that is, the shift information of the target address is registered, to the data latch group XDL (S22).

After the execution of S21 or the skip of S21, the controller 200 outputs a command for outputting data in the data latch group XDL in a column address where shift information, that is, a history value (an index number) of a target address in the history data HD is registered (S11). According to the command, the NAND flash memory 100 executes a process for returning data (that is, an index number) in the data latch group XDL in a designated column address to the controller 200 (S12).

The controller 200 outputs a read command to the NAND flash memory 100 based on the specified physical address and shift amount data corresponding to the acquired index number (S3). When receiving the read command from the controller 200, the NAND flash memory 100 executes data read based on the read command (S4).

A result of the read is acquired by the controller 200. The controller 200 determines whether the data read is successfully performed, that is, error correction is successfully performed by the ECC circuit 260 even if an error is present (S5).

When the data read is successfully performed (YES in S5), the controller 200 returns read data to the host apparatus 300 (S6).

When the data read is not successfully performed (NO in S5), the controller 200 executes the re-read process explained above (S7).

In S7, the shift read or the like is performed and, at the same time, the re-read process explained above is performed. The controller 200 determines whether the error correction is successful, that is, the data read is successfully performed (S8). When the error correction is successful, that is, the data read is successfully performed (YES in S8), the controller 200 returns the data subjected to an error correction process to the host apparatus 300 (S6).

Further, after the re-read process (S7), when the error correction is successful, that is, the data read is successfully performed (YES in S8), the controller 200 outputs, to the input/output signals I/O, a command for copying, to the data latch group XDL, the data in the data latch group in which the history value, that is, the shift information of the target address is registered (S25). As a result, the sequencer 170 copies, to the data latch group XDL, the data in the data latch group in which the history value, that is, the shift information of the target address is registered (S26).

Further, after S25, the controller 200 outputs a command for overwriting a column address corresponding to the target address with an index number corresponding to shift amount data at the time when the re-read is successfully performed and updating the column address (S17). As a result, the sequencer 170 updates data in the designated column address in the data latch group XDL with the index number of the shift amount data at the time when the re-read is successfully performed (S18).

Further, after S17, the controller 200 outputs a command for copying the data in the updated data latch group XDL to the data latch group in which the history value, that is, the shift information of the target address is registered (S27). As a result, the sequencer 170 copies, from the data latch group XDL, the data in the data latch group in which the history value, that is, the shift information of the target address is registered (S28).

[Patrol Process]

In the NAND flash memory 100, in order to cope with deterioration of stored data involved in elapse of time, a patrol process for reading stored data and inspecting, that is, verifying a stored state of the read data is executed. As a result of the patrol process, update of a read level, that is, update of shift information is performed. In other words, when the patrol process for verifying a stored state of data is executed on the memory cell array 110, the controller 200 stores, in the memory cell array 110, management information, that is, the shift information updated as the result of the patrol process.

Figure 52:
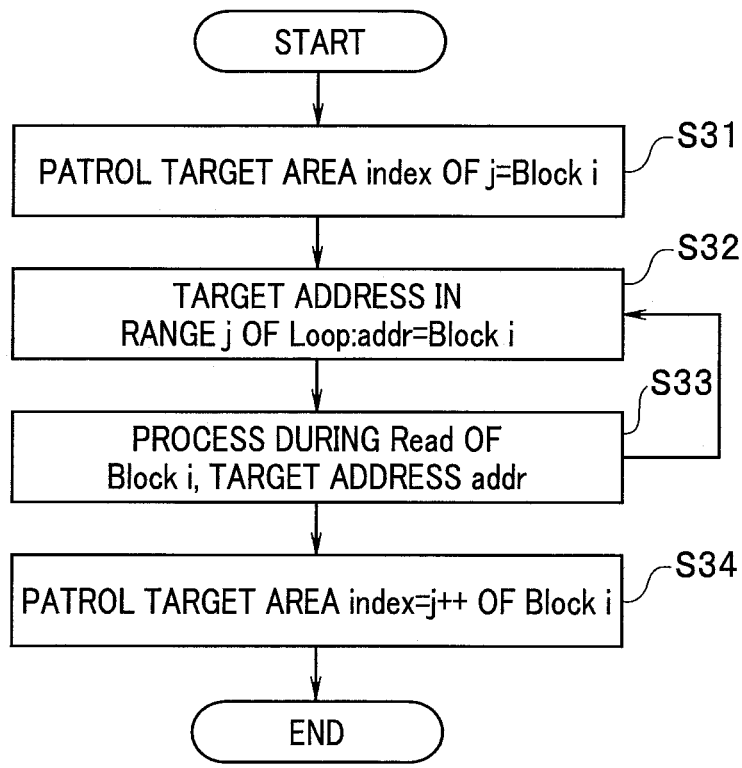
FIG. 52 is a flowchart showing an example of a flow of a patrol process according to the second embodiment.

FIG. 52 is a flowchart showing an example of a flow of the patrol process. The patrol process is executed under a predetermined condition at a predetermined period. The patrol process is executed for each predetermined target area (hereinafter referred to as patrol target area) of the block BLK. The controller 200 selects a target block BLK of the patrol process, selects a patrol target area in the block BLK, and executes the patrol process.

First, the controller 200 sets an index j of a patrol target area of a target block BLKi of the patrol process (S31).

The controller 200 sets a target address addr of the patrol target area having the index j (S32) and executes a predetermined process during read of the target address addr (S33). S32 and S33 are repeated such that the predetermined process is executed on all target blocks in the target block BLK.

When the read process for the patrol target area set in S31 ends, the controller 200 increments the index j of the patrol target area of a block i by one.

The controller 200 executes the patrol process at predetermined timing on each one of a plurality of patrol target areas in each of the blocks BLK.

Figure 53:
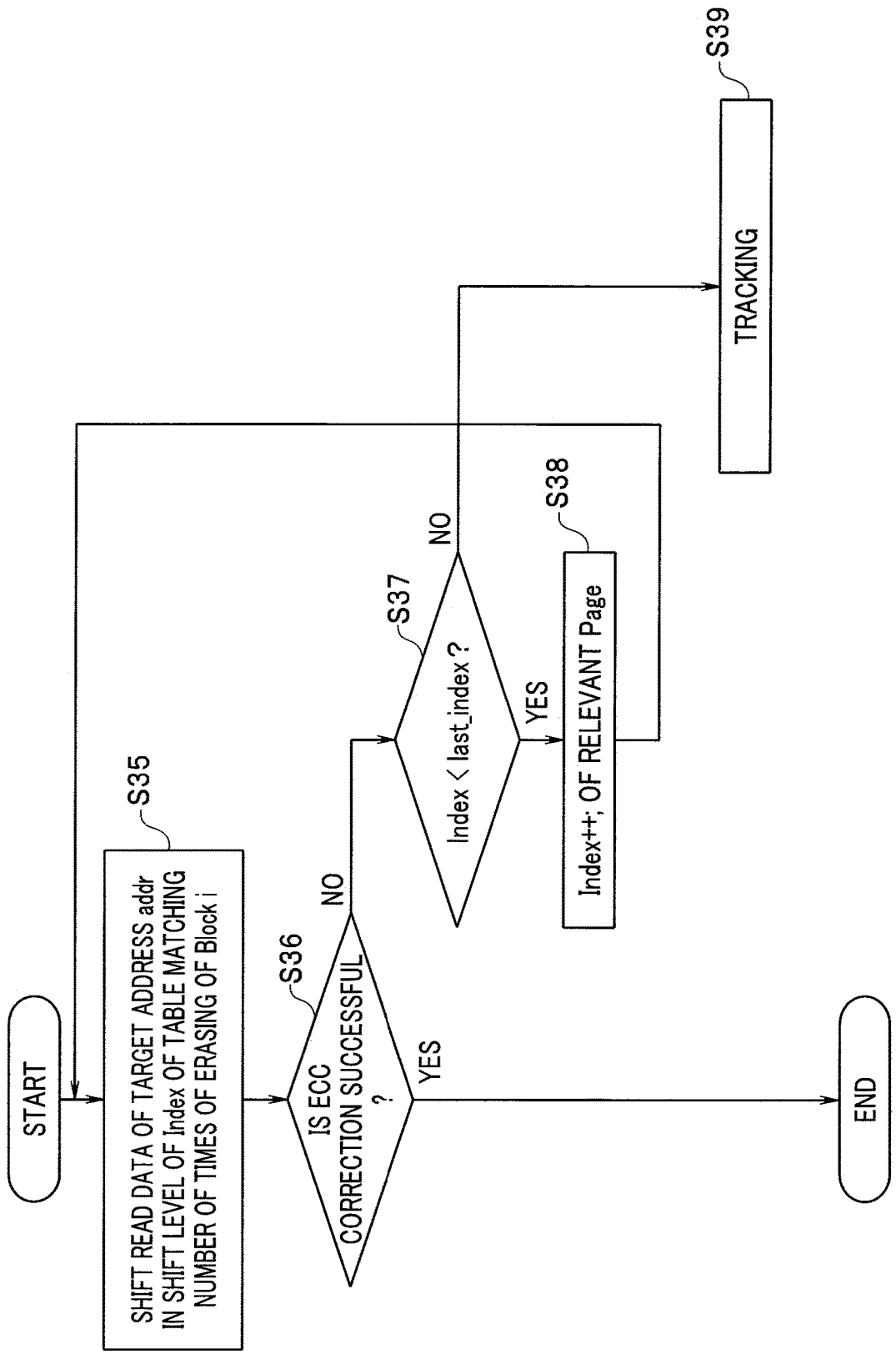
FIG. 53 is a flowchart showing an example of a flow of a predetermined process during read to a target address in the patrol process according to the second embodiment.

FIG. 53 is a flowchart showing an example of a flow of a predetermined process during read to a target address in the patrol process.

The controller 200 reads, that is, shift-reads data in a target address with a shift amount of an index number of a table corresponding to the number of times of erasing of the block i (S35).

The controller 200 determines whether the error correction by the ECC is successful (S36). When the error correction is successful (YES in S36), the controller 200 performs no process. When the error correction is unsuccessful (NO in S36), the controller 200 determines whether the index number of the table is smaller than a last number (S37).

When the index number of the table is smaller than the last number (YES in S37), the controller 200 increments an index number of a relevant page (S38). The process returns to S35. The controller 200 repeats the processes in S35 and S36.

When the index number of the table is not smaller than the last number (NO in S37), the controller 200 executes another process such as a tracking process (S39).

FIGS. 54 to 57 are diagrams for explaining changes in states of the memory cell array 110 and the plurality of data latch groups at the time when the patrol process is performed.

Figure 54:
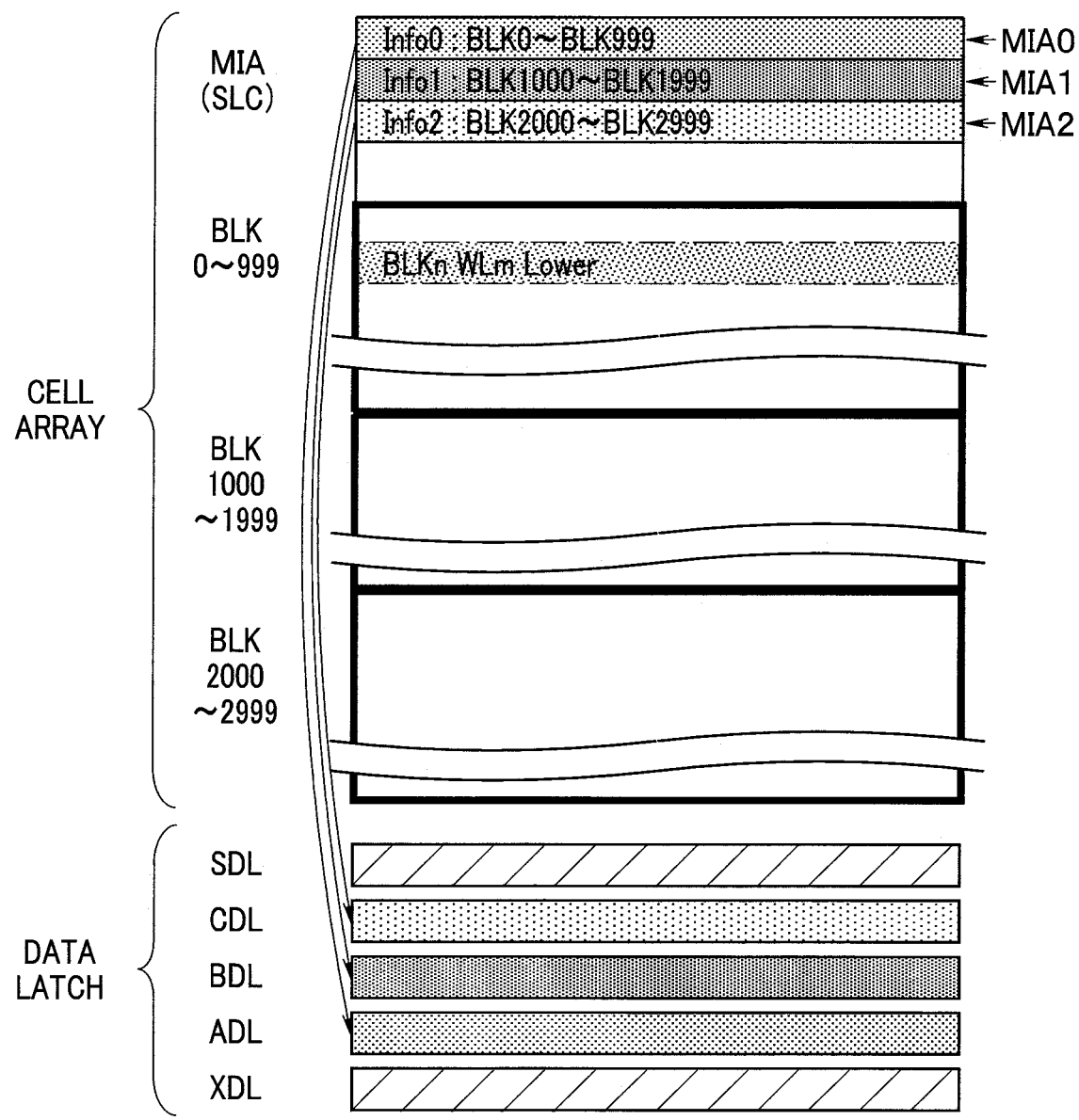
FIG. 54 is a diagram showing stored states of data in the management information storage area and the plurality of data latch groups in an idle state according to the second embodiment.

FIG. 54 is a diagram showing stored states of data in the management information storage area MIA and the plurality of data latch groups in an idle state. In the idle state, neither write nor read is performed.

Figure 55:
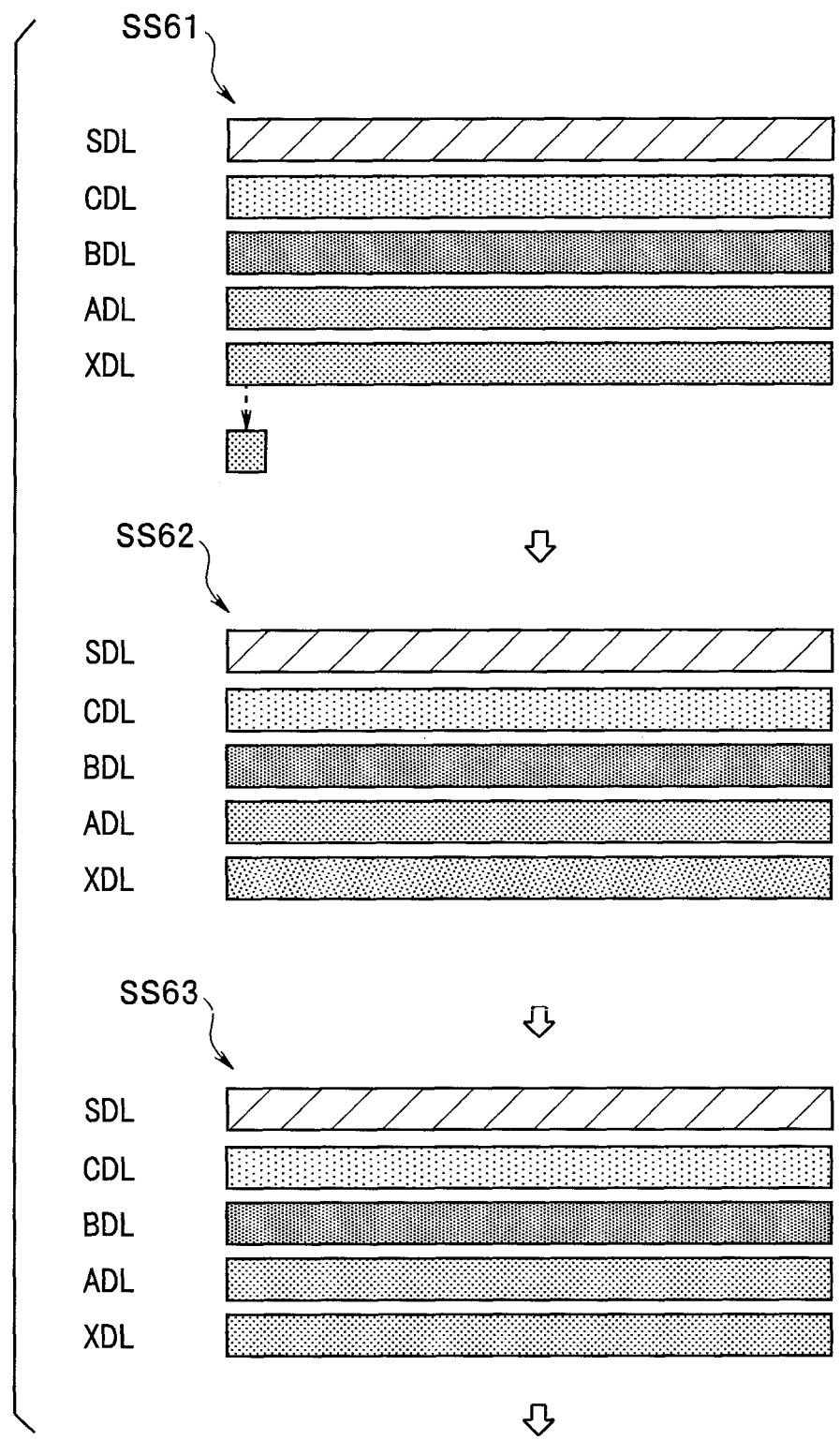
FIG. 55 is a diagram for explaining changes in stored states of data in the five data latch groups at a time when the patrol process is executed according to the second embodiment.
Figure 56:
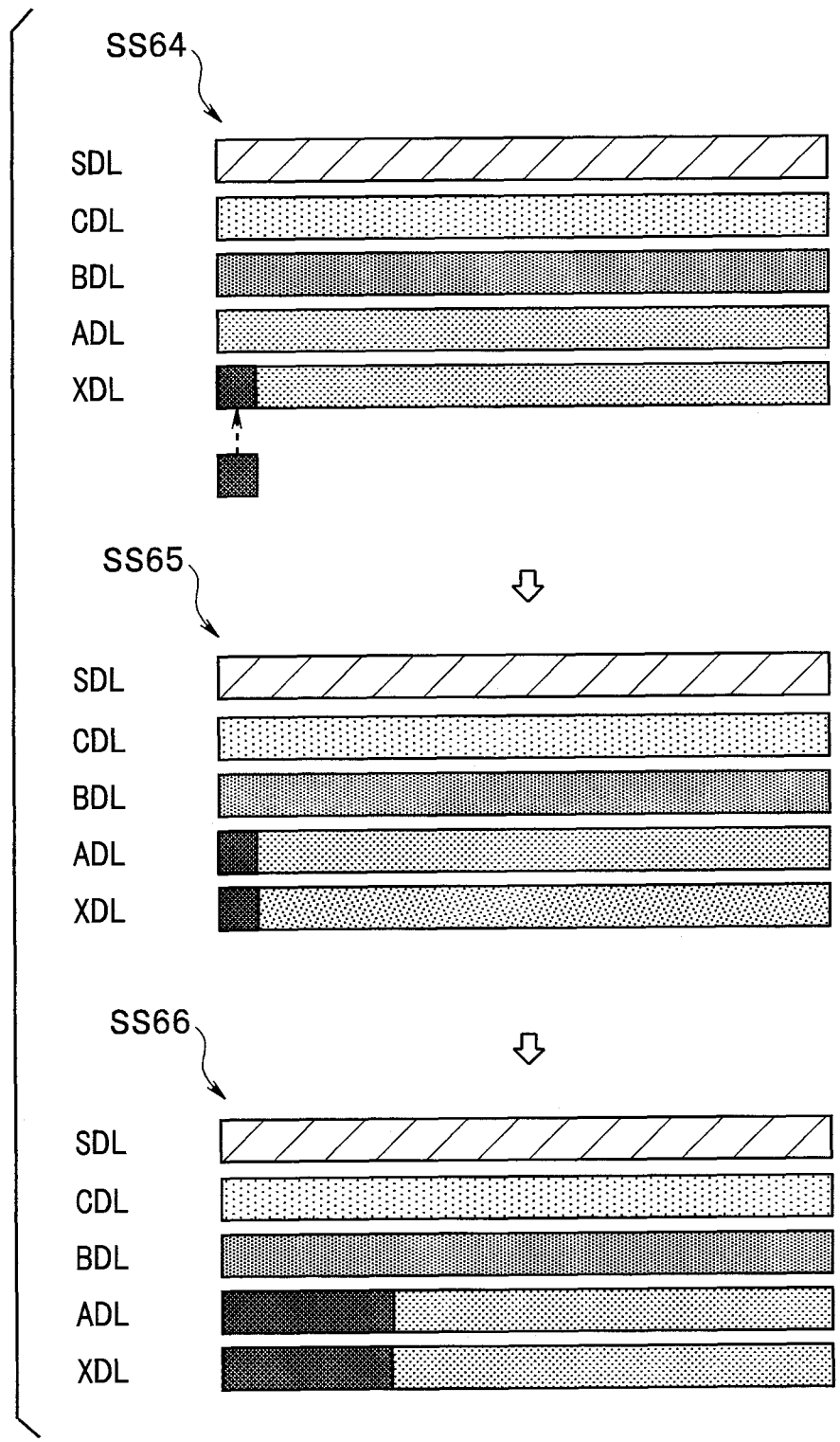
FIG. 56 is a diagram for explaining changes in stored states of data in the five data latch groups at the time when the patrol process is executed according to the second embodiment.

FIGS. 55 and 56 are diagrams for explaining changes in stored states of data in five data latch groups at the time when the patrol process is executed.

In order to execute the patrol process on data in the blocks BLK0 to BLK999, the controller 200 copies data in a storage area of the data latch group ADL to the storage area of the data latch group XDL. As shown in SS61 in FIG. 55, the controller 200 executes an inspection, that is, verification of stored states of data using shift information of the data latch group XDL. As shown in SS62 in FIG. 55, data read is performed. Therefore, data in the storage area of the data latch group XDL is used for the read.

When the inspection ends and it is determined from an inspection result that update of the shift information is necessary, as shown in SS63 in FIG. 55, the controller 200 copies the data in the data latch group ADL to the data latch group XDL.

The controller 200 changes the shift information (for example, the index number) in the data latch group XDL. SS64 in FIG. 56 shows a state in which a part of data in the data latch groups XDL is rewritten. As shown in SS65 in FIG. 56, the controller 200 copies the data in the data latch group XDL to the data latch group ADL.

When the patrol process for the data in the blocks BLK0 to BLK999 is executed by repeating the process explained above, as shown in SS66, the data in the data latch group XDL is copied to the data latch group ADL.

Figure 57:
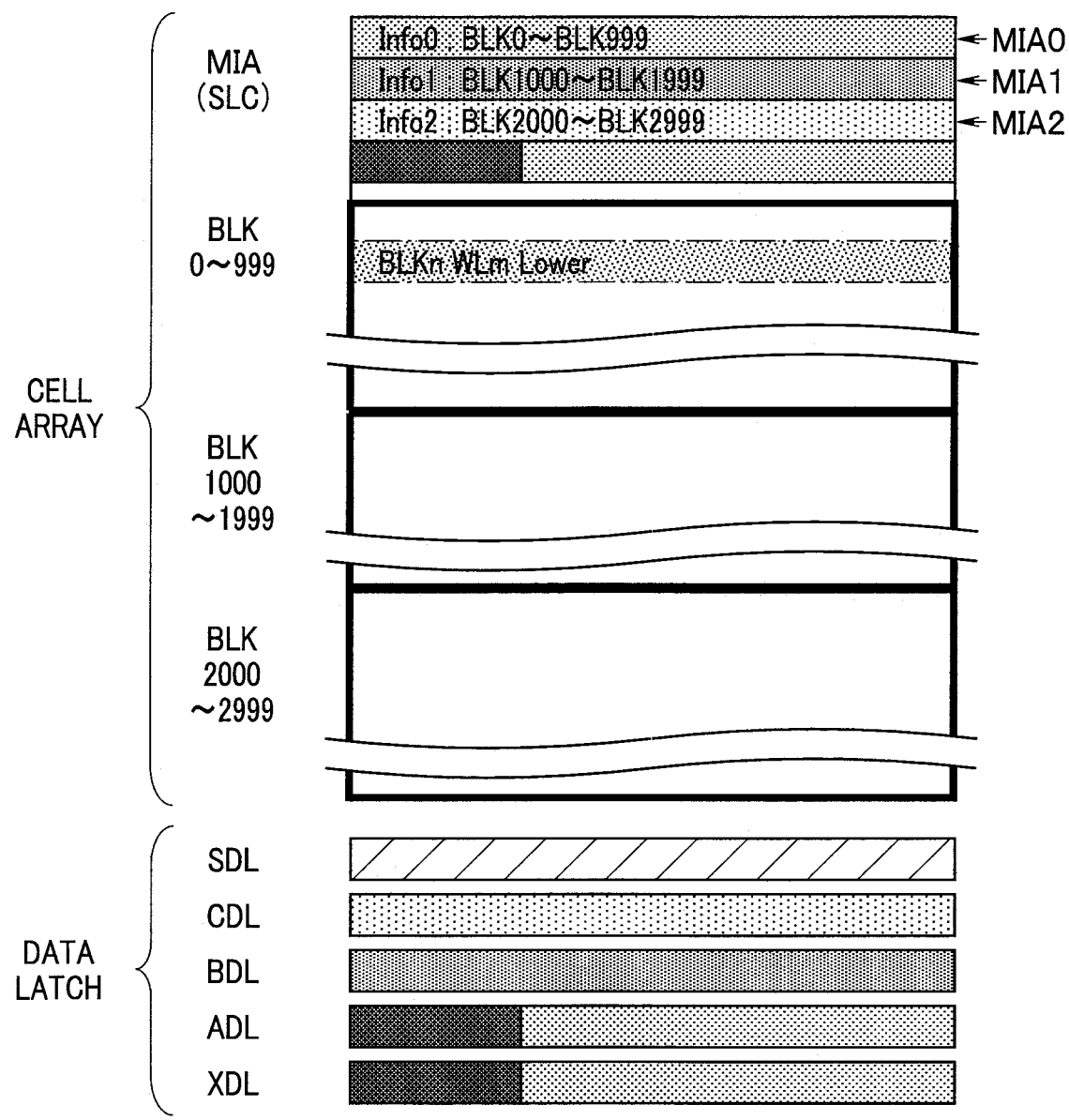
FIG. 57 is a diagram showing stored states of data in the management information storage area and the plurality of data latch groups relating to data in blocks BLK0 to BLK999 according to the second embodiment.

FIG. 57 is a diagram showing stored states of data in the management information storage area MIA and the plurality of data latch groups relating to the data in the blocks BLK0 to BLK999. From a state in SS66, the controller 200 performs write of the management information MI in the management information storage area MIA of the memory cell array 110. FIG. 57 shows, for example, a state in which update of shift information about a quarter of the data in the blocks BLK0 to BLK999 is performed.

Note that, in the example explained above, the updated data is stored in the data latch group XDL and, thereafter, copied to the data latch group ADL. However, the updated data may be temporarily stored in the RAM 220 and transferred from the RAM 220 to the data latch group ADL.

Figure 58:
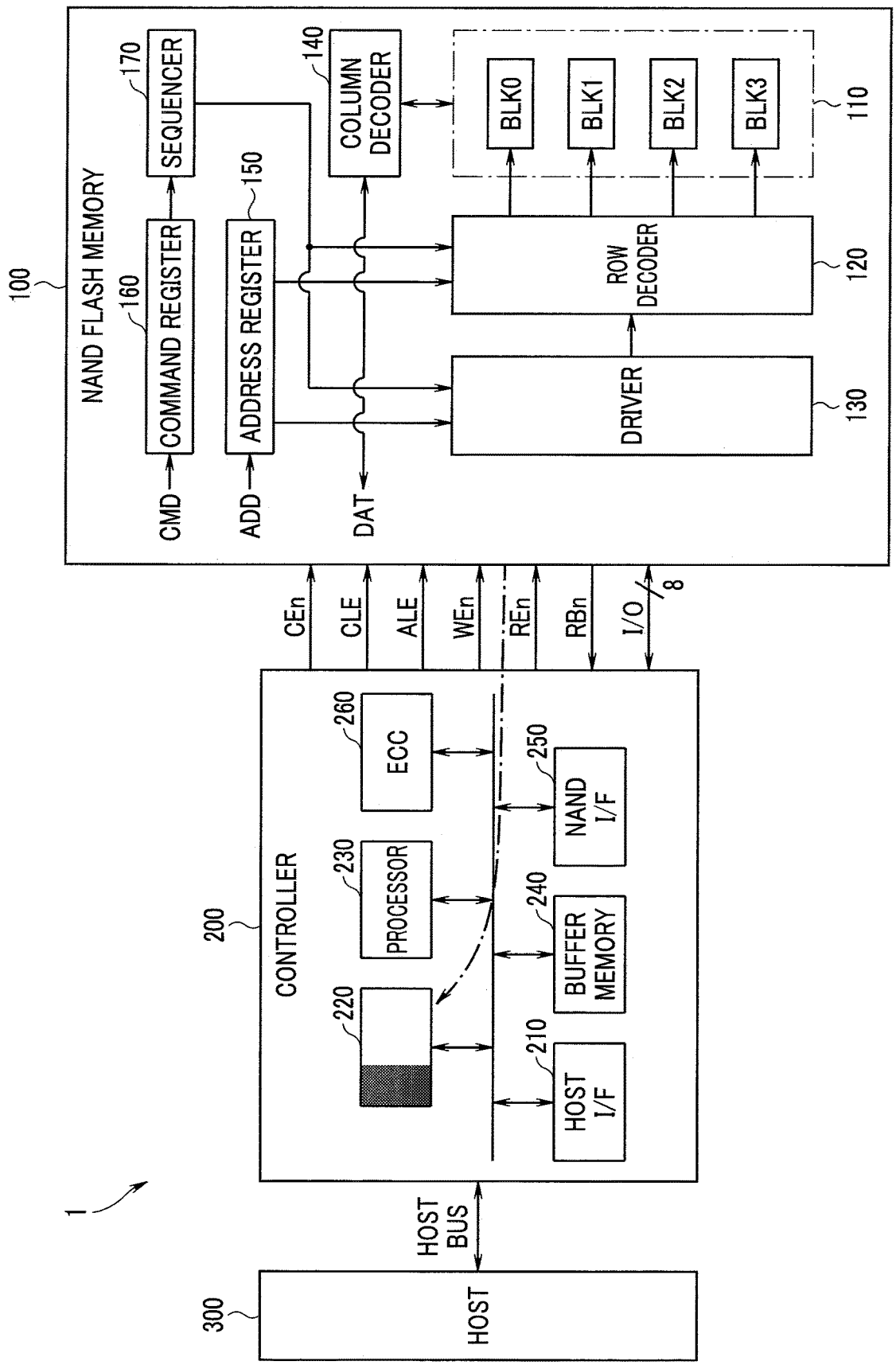
FIG. 58 is a block diagram for explaining a configuration of a memory system, the block diagram showing a state during storage of updated data in a RAM according to the second embodiment.
Figure 59:
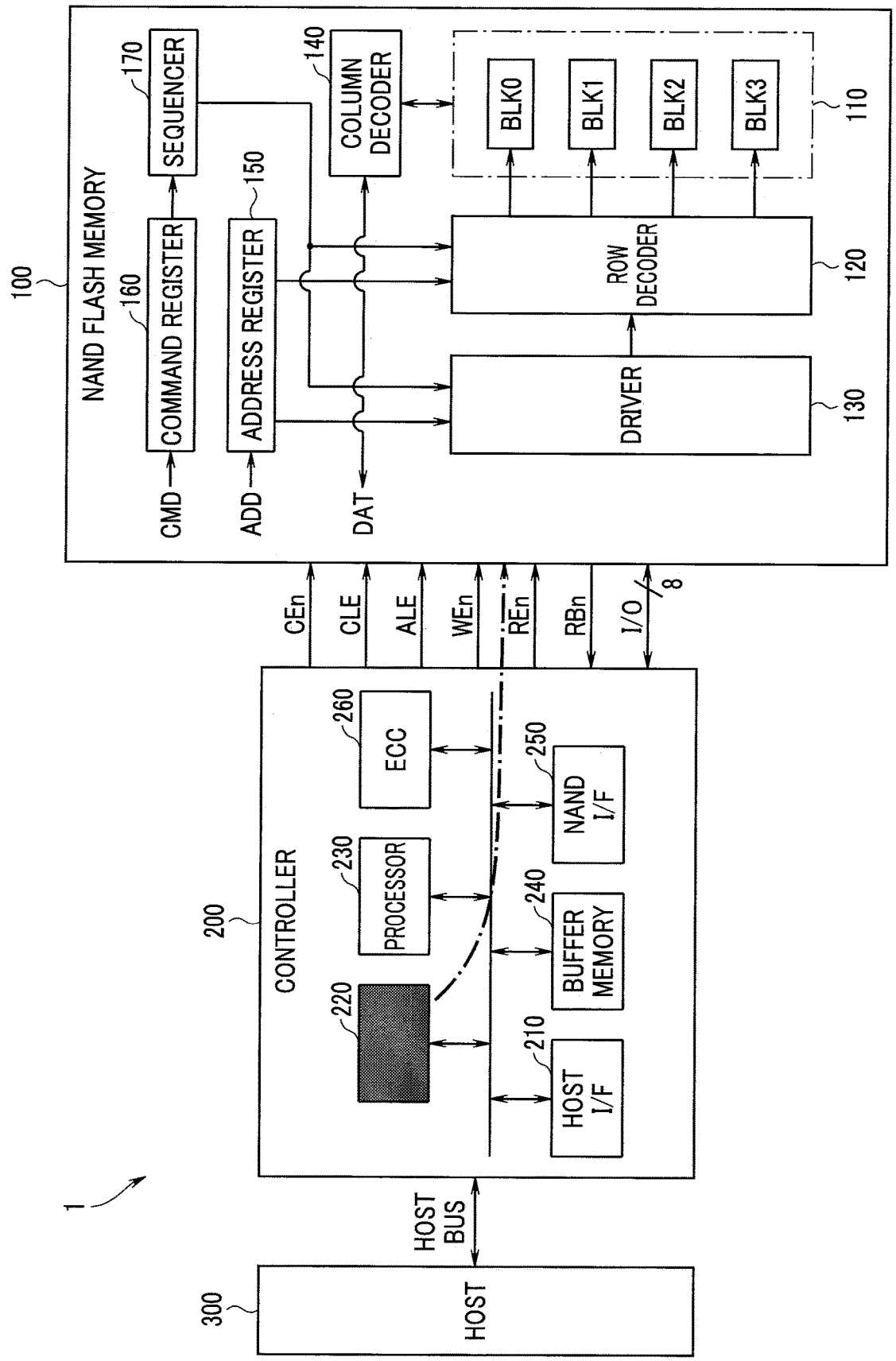
FIG. 59 is a block diagram for explaining the configuration of the memory system, the block diagram showing a state in which the updated data is finished to be stored in the RAM and is transferred to a data latch group according to the second embodiment.

FIG. 58 is a block diagram showing a state during storing the updated data in the RAM 220 and for explaining a configuration of a memory system. FIG. 59 is a block diagram showing a state in which the updated data is finished to be stored in the RAM 220 and is transferred to the data latch group ADL and for explaining the configuration of the memory system.

As shown in FIG. 58, the updated data is stored in a partial area in the RAM 220. The updated data stored in the RAM 220 is transferred from the controller 200 to the data latch group ADL of the NAND flash memory 100 as shown in FIG. 59.

As explained above, according to the present embodiment, the same effects as the effects in the first embodiment can be obtained. It is possible to provide a memory system and a memory controller that can read more management information MI with small latency.

In particular, when the updated data is temporarily stored in the RAM 220 and then transferred to the data latch group ADL, even if a program operation occurs halfway, it is possible to restart the transfer of the updated data to the data latch group ADL after an end of the program operation without saving the data in the RAM 220 to the memory cell array 110.

Third Embodiment

In the first and second embodiments, the memory system includes one NAND flash memory 100. However, in a third embodiment, a memory system includes two NAND flash memories 100. Two kinds of management information MI in two memory cell arrays 110 are stored in a plurality of data latch groups of each of the NAND flash memories 100.

A configuration of the memory system in the third embodiment is the same as the configuration of the memory system in the first embodiment. Therefore, in the memory system in the third embodiment, the same components as the components of the memory system in the first embodiment are denoted by the same reference numerals and signs and explanation of the components is omitted. Only components different from the components of the memory system in the first embodiment are explained.

Figure 60:
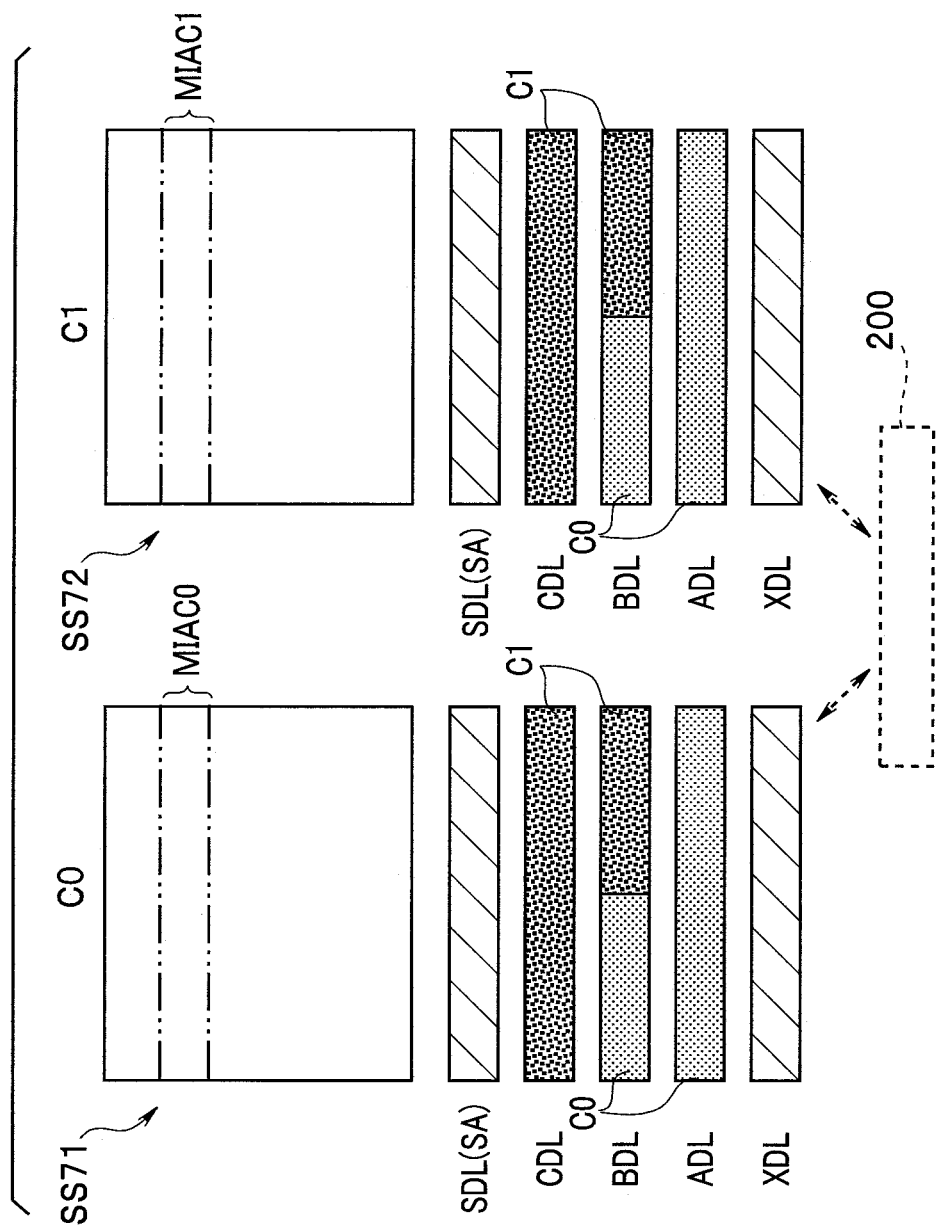
FIG. 60 is a diagram showing stored states of two kinds of management information in two NAND flash memories according to a third embodiment.
Figure 61:
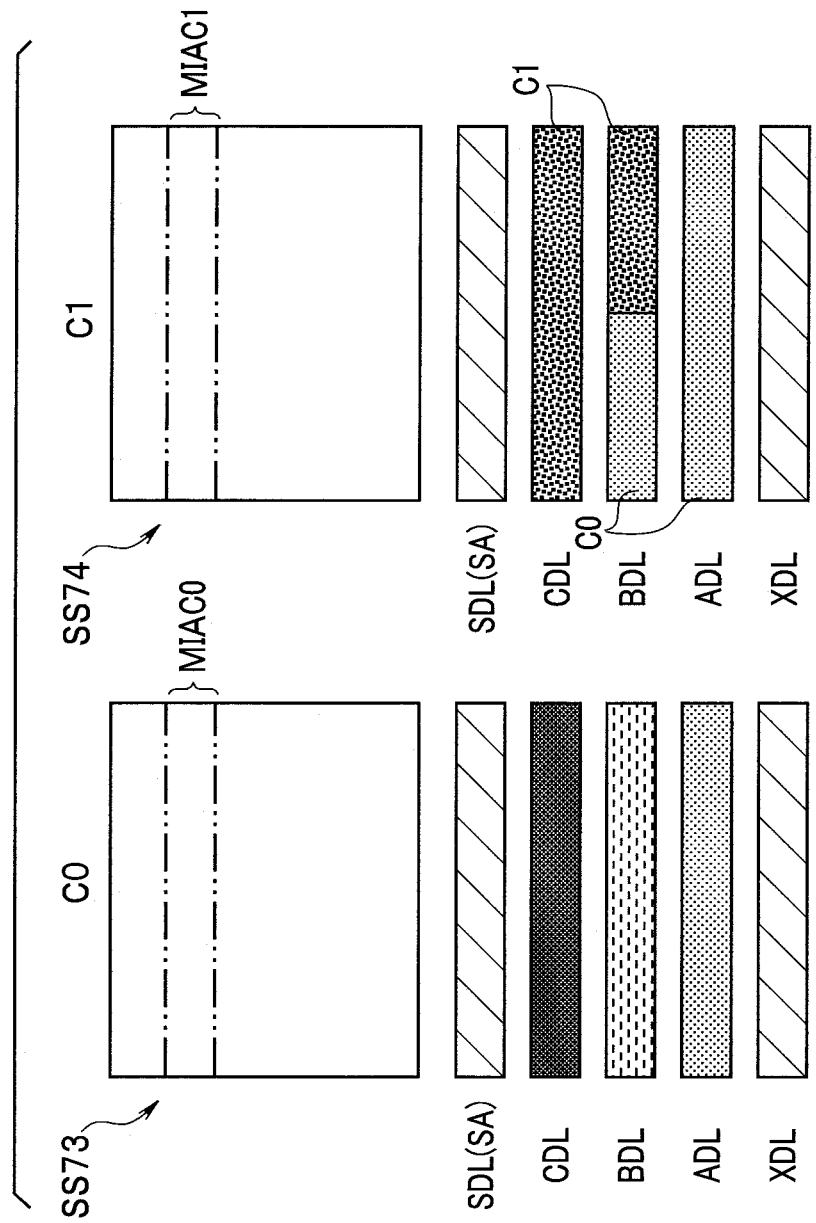
FIG. 61 is a diagram showing stored states of the two kinds of management information in the two NAND flash memories according to the third embodiment.
Figure 62:
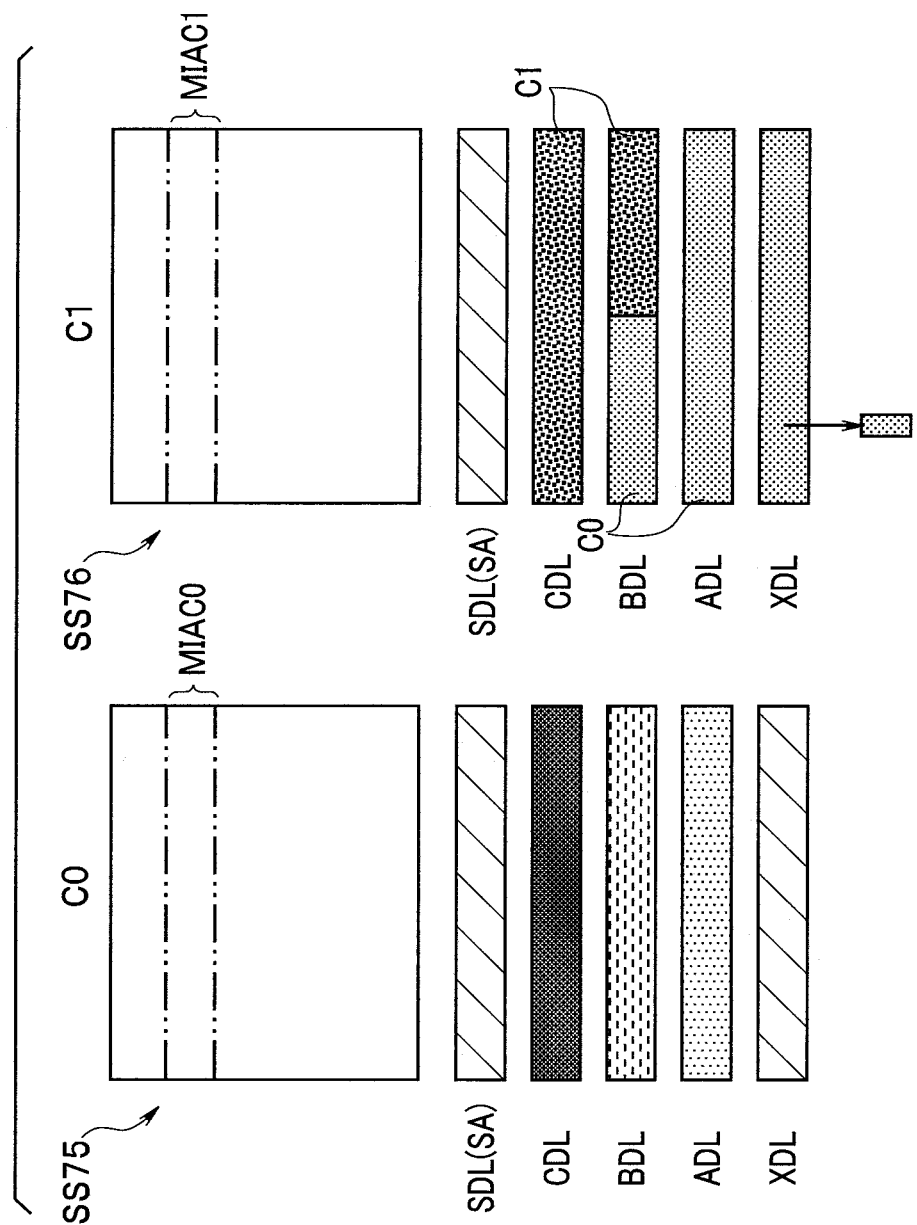
FIG. 62 is a diagram showing stored states of the two kinds of management information in the two NAND flash memories according to the third embodiment.

FIGS. 60 to 62 are diagrams for explaining changes in stored states of two kinds of management information MI in the two NAND flash memories 100. One of the two NAND flash memories 100 is represented as a chip C0 and the other is represented as a chip C1. In other words, each of the chips C0 and C1 includes a memory cell array 110, which functions as a nonvolatile memory, including pluralities of physical blocks, each of the pluralities of physical blocks including a storage area accessible in units of pages. A memory system 1A in the present embodiment includes one controller 200 and two chips C0 and C1. The controller 200 controls read of data from and write of data in the respective memories of the chips C0 and C1 in units of pages. The controller 200 may be formed on a substrate of one of the two chips C0 and C1 or may be formed on another chip.

FIG. 60 is a diagram showing stored states of the two kinds of management information MI in the two NAND flash memories 100. FIG. 61 is a diagram showing stored states of the two kinds of management information MI in the two NAND flash memories 100 at the time when the chip C0 is being programmed. Each of the chips C0 and C1 includes a plurality of data latch groups SDL, ADL, BDL, CDL, and XDL.

The management information MI of both of the chip C0 and the chip C1 is stored in a management information storage area MIAC0 of the memory cell array 110 of the chip C0. Similarly, the management information MI of both of the chip C0 and the chip C1 is stored in a management information storage area MIAC1 of the memory cell array 110 of the chip C1.

As shown in SS71 in FIG. 60, in the chip C0, the management information MI of the chip C0 is stored in the data latch group ADL and a half of the data latch group BDL and the management information MI of the chip C1 is stored in a half of the data latch group BDL and the data latch group CDL.

Similarly, as shown in SS72 in FIG. 60, in the chip C1, the management information MI of the chip C0 is stored in the data latch group ADL and a half of the data latch group BDL and the management information MI of the chip C1 is stored in a half of the data latch group BDL and the data latch group CDL.

In other words, when executing or before executing a data read process from the respective memory cell arrays 110 of the chips C0 and C1, the controller 200 executes a conversion into steady state process for storing the management information MI (for example, the history data HD) used for data read in the data latch groups ADL, BDL, and CDL of both of the chips C0 and C1.

In such a configuration, when data write is being performed, that is, a program is being executed in one chip C0, the controller 200 sometimes receives a data read request from the chip C0.

In such a case, as shown in SS73 in FIG. 61, the data latch groups ADL, BDL, and CDL of the chip C0 are used for the data write. However, as shown in SS74, data in the data latch groups ADL, BDL, and CDL of the chip C1 are not used for the data write. The management information MI of the chip C0 and the chip C1 is still stored in the data latch groups ADL, BDL, and CDL.

Accordingly, when data read from the chip C0 is executed when data write in the chip C0 is being executed, as shown in SS76 in FIG. 62, the management information MI, that is, the shift information stored in the data latch group ADL and a part of the data latch group BDL of the chip C1 can be copied to the data latch group XDL based on a column address corresponding to a read address and can be read from the data latch group XDL. In SS76 in FIG. 62, since the shift information corresponding to the read address is stored in the data latch group ADL, data in the data latch group ADL is copied to the data latch group XDL.

In other words, when executing a data read process from the memory cell array 110 of the chip C0 is executed during execution of a data write process to the memory cell array 110 of the chip C0, the controller 200 reads the management information MI from the data latch groups ADL and BDL of the chip C1 and executes a data read process from the chip C0 using the read management information MI.

Accordingly, the two chips store the management information MI of the two chips in the pluralities of data latch groups each other. Consequently, during the suspend read process shown in FIG. 32, without executing a command sequence for reading the management information MI from the management information storage area MIA in the memory cell array 110, the controller 200 can acquire the management information MI, that is, the shift information from the plurality of data latch groups of the other chip and perform data read using the shift information. In other words, since the management information is distributed and stored between the chips, it is unnecessary to perform read of the management information MI in the SLC mode during suspend of write.

Figure 63:
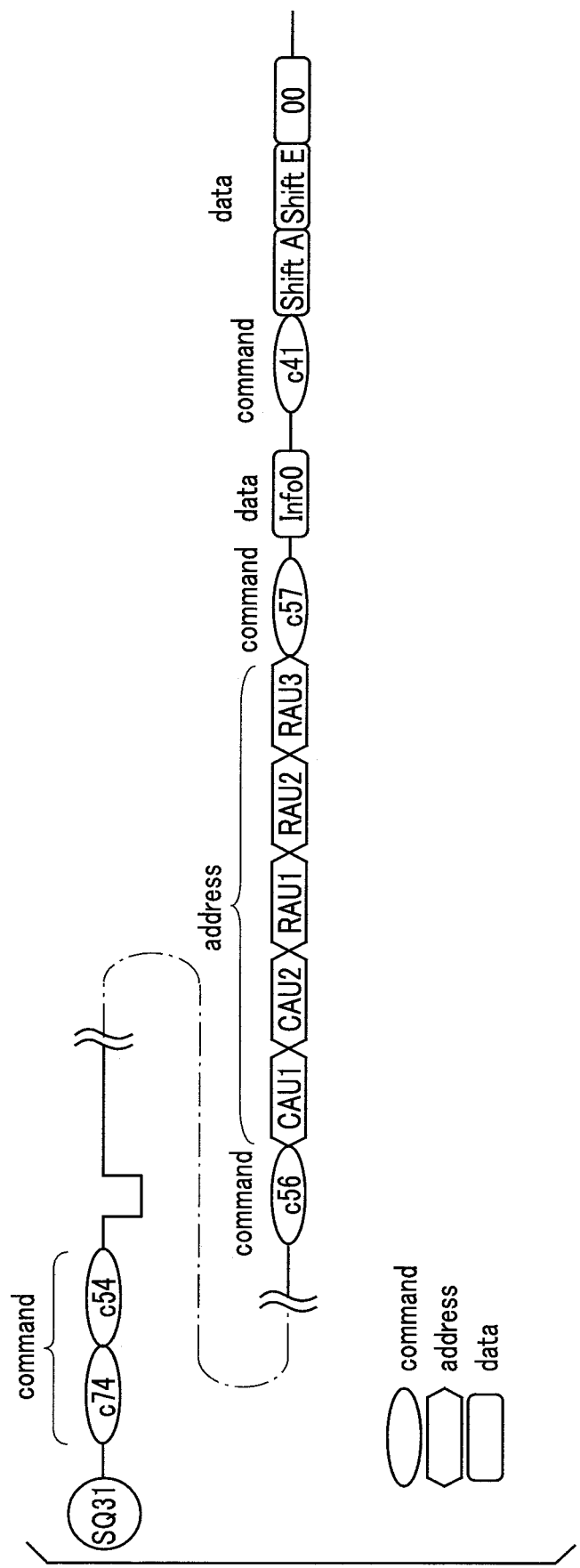
FIG. 63 is a diagram showing a command sequence of a data read procedure according to the third embodiment.

FIG. 63 is a diagram showing a command sequence SQ31 of a data read procedure. When a program operation to the chip C0 is performed and the management information MI is not stored in the data latch groups of the chip C0, the controller 200 outputs a command "c74" for selecting the chip C1 to the input/output signals I/O and selects the chip C1. When shift information for read data is present in the data latch group ADL of the chip C1, the controller 200 outputs the command "c54" to the input/output signals I/O and copies all data in the data latch group ADL to the data latch group XDL.

Thereafter, the controller 200 outputs the command "c56", which is the register read command, to the input/output signals I/O, designates a head of a designated column address in the data latch group XDL of the chip C1, and reads shift information.

After outputting the read shift information to the NAND flash memory 100, the controller 200 outputs a data read command and performs data read.

As explained above, according to the present embodiment, the same effects as the effects in the first embodiment can be obtained. Further, in the case of the present embodiment, during a program operation to a certain chip, when there is a read request to the chip, it is unnecessary to read the management information MI from the management information storage area MIA in the memory cell array 110 of the chip. Therefore, it is possible to reduce latency by a time for reading the management information MI from the management information storage area MIA.

Fourth Embodiment

A fourth embodiment relates to a memory system configured by sticking together a controller chip and a memory chip to stack the chips.

A configuration of the memory system in the fourth embodiment includes the same components as the components of the memory system in the first embodiment. Therefore, in the memory system in the fourth embodiment, the same components as the components of the memory system in the first embodiment are denoted by the same reference numerals and signs and explanation of the components is omitted. Only components different from the components of the memory system in the first embodiment are explained.

When a circuit of the NAND flash memory 100 and a circuit of the controller 200 are formed on one substrate, the circuit of the controller 200 is manufactured based on a manufacturing process of the memory cell array 110. Therefore, a size of an area of the RAM 220 sometimes cannot be increased.

Therefore, in the present embodiment, a chip mounted with the controller 200 and a chip mounted with the memory cell array 110 are formed as chips separate from each other.

Figure 64:
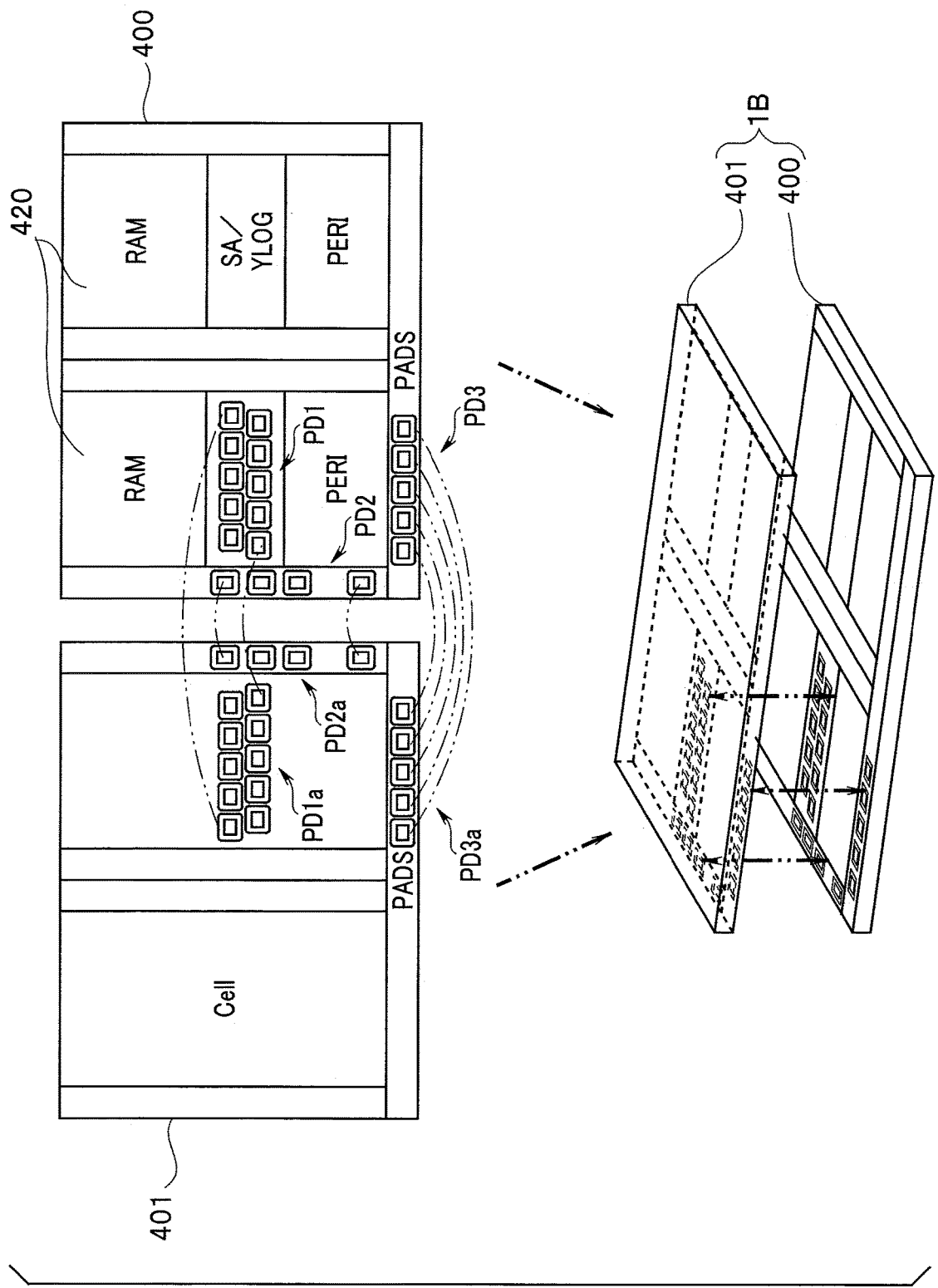
FIG. 64 is an assembly diagram for explaining a configuration of a memory system according to a fourth embodiment.

FIG. 64 is an assembly diagram for explaining a configuration of a memory system 1B according to the present embodiment. Note that the chip mounted with the memory cell array 110 is one chip and is stacked on the chip mounted with the controller 200. However, a plurality of chips mounted with memory cell arrays 110 may be stacked on the chip mounted with the controller 200.

The memory system 1B includes a first chip 400 mounted with a controller and the like and a second chip 401 mounted with the memory cell array 110 and the like. The memory system 1B is configured by sticking together the first chip 400 and the second chip 401.

The first chip 400 is a chip mounted with the controller 200 including a processor 230, a RAM 420, and various interface circuits and the plurality of sense units SAU. These circuits are formed on the first chip 400 as semiconductor integrated circuits manufactured by a CMOS forming process. In other words, the first chip 400 is stuck to the second chip 401 and includes the controller 200 that controls data read from and data write in a plurality of physical blocks in units of pages and the RAM 420. As explained below, the RAM 420 includes a RAM area capable of storing the management information MI (for example, the history data HD) used for data read when or before a data read process from the memory cell array 110 of the second chip 401 is executed.

On the other hand, the second chip 401 is a chip mounted with the memory cell array 110, which is a core portion of the NAND flash memory, and is manufactured by a process for manufacturing the memory cell array 110. In other words, the second chip 401 is a semiconductor chip including a nonvolatile memory cell array 110 including a plurality of physical blocks, each of the plurality of physical blocks including a storage area accessible in units of pages. The second chip 401 including the memory cell array 110 is mounted and stuck on the first chip 400.

As shown in FIG. 64, the first chip 400 includes a peripheral circuit area (PERI) where various circuits such as the controller 200 are formed, an SA/YLOG area where the plurality of sense units SAU and an operation circuit YLOG are formed, and a RAM area where the RAM 220 is formed. Further, a plurality of pads for electric connection to the second chip 401 are formed on the first chip 400. The plurality of pads include pads PD1 for a plurality of bit lines BL, pads PD2 for a plurality of word lines WL, and pads PD3 for a control signal and the like.

The second chip 401 includes a cell array area (Cell) where the memory cell array 110 is formed. Further, a plurality of pads for electric connection to the first chip 400 are formed on the second chip 401 as well. The plurality of pads include pads PD1*a* for a plurality of bit lines BL, pads PD2*a* for a plurality of word lines WL, and pads PD3*a* for a control signal and the like. The plurality of pads of the first chip 400 and the plurality of pads of the second chip 401 are electrically connected by, for example, ball bumps.

The memory system 1A is manufactured by sticking together the two chips such that the plurality of pads of the first chip 400 and the plurality of pads of the second chip 401 are connected via the ball bumps. Further, the two chips stuck together are mounted on separate substrates and wire-bonded and packaged by resin.

Conventionally, the controller 200 is also formed on the same substrate as the substrate on which the NAND flash memory 100 is formed. Therefore, the RAM area for the RAM 220 cannot be secured large. However, with the configuration in the present embodiment, the RAM area for the RAM 220 can be secured large on the first chip 400 separate from the second chip 401. Therefore, even if a data amount of the management information MI increases, the management information MI can be stored in the RAM 220.

The management information MI stored in the RAM 220 is updated by the patrol process or the like. Therefore, a process for storing the management information MI in the management information storage area MIA of the memory cell array 110 is executed at a predetermined period or predetermined timing.

Figure 65:
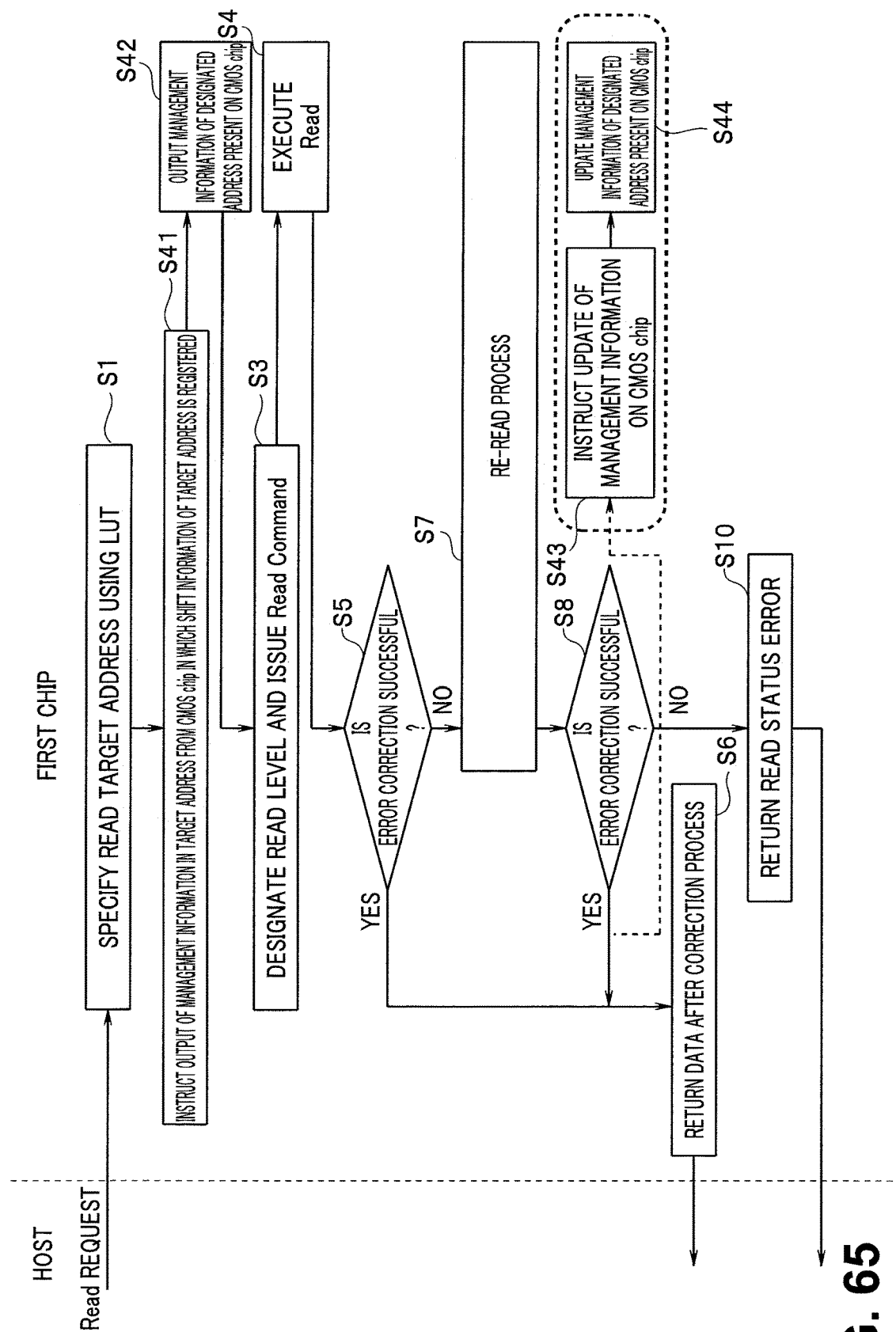
FIG. 65 is a flowchart showing an example of a flow of a read process for data in a second chip by a first chip according to the fourth embodiment.

FIG. 65 is a flowchart showing an example of a flow of a data read process from the second chip 401 by the first chip 400. In FIG. 65, the same processes as the processes in FIGS. 14, 26, and 36 are denoted by the same step numbers and explanation of the processes is simplified.

The controller 200 of the first chip 400 specifies a target address relating to a read request from the host apparatus 300 (S1). Thereafter, the controller 200 outputs an instruction command for outputting the management information MI (for example, the shift information) of the target address from the first chip 400, which is a CMOS chip in which shift information of the target address is registered (S41). In other words, the controller 200 outputs a command for reading shift information data of a read target address from the RAM 220 in which a history value, that is, the shift information of the target address is registered. The RAM 220 outputs management information (the shift information) of the designated address to the controller 200 (S32).

Thereafter, data read is performed. After re-read (S7), when error correction is successful (YES in S8), the controller 200 outputs an update command for the management information MI on the first chip 400 (S43). In the RAM 220 in the first chip 400, management information (shift information) of an address designated by the command is updated (S44).

As explained above, according to the fourth embodiment, the chip mounted with the controller 200 and the chip mounted with the memory cell array 110 are divided. Therefore, since the RAM area can be secured large, it is possible to secure a storage area for a sufficient amount of the management information MI.

While certain embodiments have been described, these embodiments have been presented by way of example only, and are not intended to limit the scope of the inventions. Indeed, the novel systems and devices described herein may be embodied in a variety of other forms; furthermore, various omissions, substitutions and changes in the form of the systems and devices described herein may be made without departing from the spirit of the inventions. The accompanying claims and their equivalents are intended to cover such forms or modifications as would fall within the scope and spirit of the inventions.

What is claimed is:

1. A method of controlling a memory device, the memory device including:
   a first memory including a storage area, the first memory being a nonvolatile memory;
   a first data latch group used for input and output of data to and from the first memory; and
   at least one second data latch group in which stored data is maintained when the data is read from the first memory, and
   the method comprising:
   storing management information in the at least one second data latch group when or before executing a read process for the data from the first memory, the management information being in a second memory and used for reading the data; and
   executing the read process.

2. The method according to claim 1, further comprising: copying the management information from the at least one second data latch group to the first data latch group in advance before the execution of the read process.

3. The method according to claim 1, wherein the at least one second data latch group is used when the data is written in the first memory.

4. The method according to claim 1, further comprising:
   storing the management information in a predetermined storage area of the first memory;
   reading the management information from the predetermined storage area; and
   storing the management information in the at least one second data latch group before the read process responding to a request from an outside is executed.

5. The method according to claim 1, further comprising:
   when the management information is updated, storing the updated management information in the first memory.

6. The method according to claim 1, wherein the at least one second data latch group includes a plurality of second data latch groups.

7. The method according to claim 6, wherein
the first memory further includes a plurality of physical blocks, and
the method further comprises:
   storing the management information of each of the plurality of physical blocks corresponding to each of the plurality of the second data latch groups in each of the plurality of second data latch groups.

8. The method according to claim 7, wherein each of the plurality of physical blocks includes a storage area accessible in units of pages.

9. The method according to claim 1, wherein the management information is shift information for shifting a read level of the data when executing the read process.

10. The method according to claim 9, further comprising:
   storing the shift information updated as a result of a patrol process in the first memory, when executing, on the first memory, the patrol process for verifying a stored state of the data.

11. A method of controlling a memory device,
the memory device including:
   a nonvolatile first memory including a first storage area;
   a nonvolatile second memory including a second storage area;
   a first data latch group used for input and output of data to and from the first memory;
   a second data latch group used for input and output of the data to and from the second memory;
   a third data latch group in which stored data is maintained when the data is read from the first memory; and
   a fourth data latch group in which stored data is maintained when the data is read from the second memory, and
the method comprising:
   storing management information in the third and fourth data latch groups when or before executing a read process for the data from the first and second memories, the management information being in a third memory and used for reading the data; and
   executing the read process.

12. The method according to claim 11, further comprising:
   when executing the read process for the data from the first memory during execution of a write process in the first memory, reading the management information from the fourth data latch group and executing the read process for the data using the management information.

13. A method of manufacturing a memory system, comprising:
   preparing a first semiconductor chip that includes a nonvolatile memory including a storage area;
   preparing a second semiconductor chip that includes a controller configured to control read and write of data and a RAM area capable of storing management information used for reading the data when or before a read process for the data from the nonvolatile memory is executed; and
   sticking the second semiconductor chip to the first semiconductor chip.

14. A method executed by a controller,
the controller including:
   a nonvolatile first memory including a first storage area;
   a nonvolatile second memory including a second storage area;
   a first data latch group used for input and output of data between the controller and the first memory;
   a second data latch group used for input and output of the data between the controller and the second memory;
   a third data latch group in which first stored data is maintained when the data is read from the first memory; and
   a fourth data latch group in which second stored data is maintained when the data is read from the second memory, and
the method comprising:
   storing management information in the third and fourth data latch groups when or before executing a read process for the data from the first and second memories, the management information being in a third memory and used for reading of the data; and
   executing the read process.

15. The method according to claim 14, further comprising:
   when executing the read process for the data from the first memory during execution of a write process in the first memory, reading the management information from the fourth data latch group and executing the read process for the data using the management information.

* * * * *